(12) United States Patent
Shetty et al.

(10) Patent No.: US 9,212,538 B2
(45) Date of Patent: Dec. 15, 2015

(54) MODELING FLUID FLOW INTERACTIONS AMONG REGIONS OF A WELL SYSTEM

(71) Applicant: Halliburton Energy Services, Inc., Houston, TX (US)

(72) Inventors: Dinesh Ananda Shetty, Houston, TX (US); Dylan Matthew Copeland, Katy, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 172 days.

(21) Appl. No.: 14/143,744

(22) Filed: Dec. 30, 2013

(65) Prior Publication Data

US 2015/0066462 A1   Mar. 5, 2015

Related U.S. Application Data

(60) Provisional application No. 61/870,716, filed on Aug. 27, 2013.

(51) Int. Cl.
*G06G 7/48* (2006.01)
*E21B 41/00* (2006.01)
*G06F 17/50* (2006.01)
*G06F 17/16* (2006.01)
(Continued)

(52) U.S. Cl.
CPC ................. *E21B 41/00* (2013.01); *E21B 43/00* (2013.01); *E21B 43/26* (2013.01); *G01V 99/005* (2013.01); *G06F 17/10* (2013.01); *G06F 17/11* (2013.01); *G06F 17/16* (2013.01); *G06F 17/5009* (2013.01); *G06G 7/32* (2013.01); *G06G 7/57* (2013.01)

(58) Field of Classification Search
CPC .......... E21B 43/22; E21B 33/16; E21B 43/26; E21B 49/00; E21B 43/267; E21B 43/27; E21B 41/00; E21B 43/00; G06F 17/11; G06F 17/16; G06F 17/50; G06F 17/13; G06F 17/5009; G06F 17/10; G06G 7/57; G06G 7/48; G06G 7/32; G01V 99/005
See application file for complete search history.

(56) References Cited

U.S. PATENT DOCUMENTS 6,230,101 B1   5/2001   Wallis
2007/0255779 A1   11/2007   Watts
(Continued)

OTHER PUBLICATIONS

Hajj, I.N. et al., "A multilevel parallel solver for block tridiagonal and banded linear systems", Parallel Computing 15 (1990) 21-45.
(Continued)

*Primary Examiner* — Kandasamy Thangavelu
(74) *Attorney, Agent, or Firm* — Holly Soehnge; Fish & Richardson P.C.

(57) ABSTRACT

In some aspects, techniques and systems for simulating well system fluid flow are described. Multiple subsystem models each include fluid flow variables and represent well system fluid dynamics associated with a sub-region in a subterranean region. The subsystem models are connected by one or more junction models. The junction models represent interactions among the subsystem models. For each of the subsystem models, an elimination of internal variables of the subsystem model is performed to express the internal variables in terms of junction variables of the junction models. The junction variables are solved based on the junction models. The internal variables of the subsystem model are solved based on the solved junction variables.

20 Claims, 27 Drawing Sheets

(51) Int. Cl.
*G01V 99/00* (2009.01)
*G06G 7/57* (2006.01)
*G06G 7/32* (2006.01)
*G06F 17/10* (2006.01)
*G06F 17/11* (2006.01)
*E21B 43/00* (2006.01)
*E21B 43/26* (2006.01)

(56) References Cited

U.S. PATENT DOCUMENTS

| | | | |
|---|---|---|---|
| 2008/0091396 | A1 | 4/2008 | Kennon et al. |
| 2008/0133186 | A1 | 6/2008 | Li et al. |
| 2009/0119082 | A1 | 5/2009 | Fitzpatrick et al. |
| 2009/0164189 | A1 | 6/2009 | Bourbiaux |
| 2009/0182541 | A1* | 7/2009 | Crick et al. ............ 703/10 |
| 2009/0294122 | A1 | 12/2009 | Hansen et al. |
| 2010/0082142 | A1 | 4/2010 | Usadi et al. |
| 2010/0217563 | A1 | 8/2010 | Montaron et al. |
| 2010/0307755 | A1 | 12/2010 | Xu et al. |
| 2011/0029291 | A1 | 2/2011 | Weng et al. |
| 2011/0082676 | A1 | 4/2011 | Bratvedt et al. |
| 2011/0120705 | A1* | 5/2011 | Walters et al. .......... 166/270 |
| 2011/0120718 | A1 | 5/2011 | Craig |
| 2011/0125471 | A1 | 5/2011 | Craig et al. |
| 2011/0125476 | A1* | 5/2011 | Craig ........................ 703/10 |
| 2011/0209868 | A1 | 9/2011 | Dusterhoft et al. |
| 2011/0213602 | A1* | 9/2011 | Dasari et al. ............. 703/10 |
| 2011/0288842 | A1* | 11/2011 | Gutierrez Ruiz et al. .. 703/10 |
| 2012/0150506 | A1* | 6/2012 | Han et al. ................ 703/2 |
| 2012/0158380 | A1* | 6/2012 | Hajibeygi et al. ........ 703/2 |
| 2012/0179436 | A1 | 7/2012 | Fung |
| 2012/0221303 | A1 | 8/2012 | Wallis et al. |
| 2012/0318511 | A1 | 12/2012 | Dykstra et al. |
| 2013/0204588 | A1* | 8/2013 | Copeland ................ 703/2 |
| 2013/0211800 | A1* | 8/2013 | Fung ........................ 703/2 |
| 2013/0346035 | A1* | 12/2013 | Madasu et al. .......... 703/2 |
| 2015/0204174 | A1* | 7/2015 | Kresse et al. ............ 703/10 |

OTHER PUBLICATIONS

Arbenz, P. et al., "A Survey of Direct Parallel Algorithms for Banded Linear Systems" (Oct. 1994), Department Informatik, ETH Zurich, 29 pages.
Novotny, E.J., "Proppant Transport", SPE 6813, Annual Fall Technical Conference and Exhibition, Denver, Colorado, 1977, 12 pages.
S. J. Sherwin et al., "Computational modelling of 1D blood flow with variable mechanical properties and its application to the simulation of wave propagation in the human arterial system", International Journal for Numerical Methods in Fluids, 43 (2003) 673-700.
L. Grinberg et al., "Modeling blood flow circulation in intracranial arterial networks: A comparative 3D/1D simulation study", Annals of Biomedical Engineering, 39 (Jul. 27, 2010), 13 pages.
Brainman, I., et al., "Nested-dissection orderings for sparse LU with partial pivoting", SIAM J.Matrix Anal, Appl., vol. 23, No. 4., (2002) 998-1012.
E. Cuthill et al., "Reducing the bandwidth of sparse symmetric matrices" In Proc. 24th Nat. Conf. ACM, (1969), pp. 157-172.
Eric Polizzi et al., "A Parallel Hybrid Banded System Solver: The SPIKE Algorithm", Elsevier, Science Direct, Parallel Computing 32, received Dec. 14, 2004, Available online Nov. 29, 2005, pp. 177-194.
Olaf Schenk et al., "Solving Unsymmetric Sparse Systems of Linear Equations with PARDISO", ELsevier Preprint, May 1, 2003, 21 pages.
Patrick R. Amestoy et al., "Hybrid Scheduling for the Parallel Solution of Linear Systems", Laboratoire de L'Informatique du Parallelisme, Dec. 2004, 21 pages.
M.J. Williams et al., "Quantitative Interpretation of Major Planes from Microseismic Event Locations with Application in Production Prediction", SEG Denver 2010 Annual Meeting, Copyright 2010, 5 pages.
LAPACK, "Linear Algebra PACKage", Last updated Sep. 25, 2012, retrieved from internet, http://www.netlib.org/lapack/.
Wikipedia, "Basic Linear Algebra Subprograms", retrieved from internet, http://en.wikipedia.org/wiki/Basic_Linear_Algebra_Subprograms, Aug. 26, 2013, 6 pages.
"LAPACK", Wikipedia, http://en.wikipedia.org/wiki/LAPACK, last modified Jul. 8, 2013, 5 pages.
BLAS FAQ, BLAS Frequently Asked Questions (FAQ), updated Jul. 25, 2005, retrieved from internet, http://www.netlib.org/blas/faq.html#1.2, 4 pages.
O. Kresse et al., "Numerical Modeling of Hydraulic Fracturing in Naturally Fractured Formations", ARMA, Jun. 26-29, 2011, 11 pages.
J. Kamath et al., "Modeling Fluid Flow in Complex Naturally Fractured Reservoirs", SPE International, SPE 39547, Apr. 7-9, 1998, 5 pages.
X. Weng et al., "Modeling of Hydraulic-Fracture-Network Propagation in a Naturally Fractured Formation", Society of Petroleum Engineers, SPE 140253, Nov. 2011, pp. 368-380.
"Finite Difference", Wikipedia, retrieved from internet, http://en.wikipedia.org/wiki/Finite_difference, last modified Jun. 21, 2013, 7 pages.
"Gaussian Elimination", Wikipedia, retrieved from internet, http://en.wikipedia.org/wiki/Gaussian_elimination, Aug. 24, 2013, 8 pages.
G.C. Howard et al., "Hydraulic Fracturing", Monograph vol. 2—Henry L. Doherty Series, Copyright 1970, 213 pages.
Authorized Officer Jin Ho Kim, PCT International Search Report and Written Opinion of the International Searching Authority, PCT/US2014/052985, Dec. 5, 2014, 9 pages.

* cited by examiner

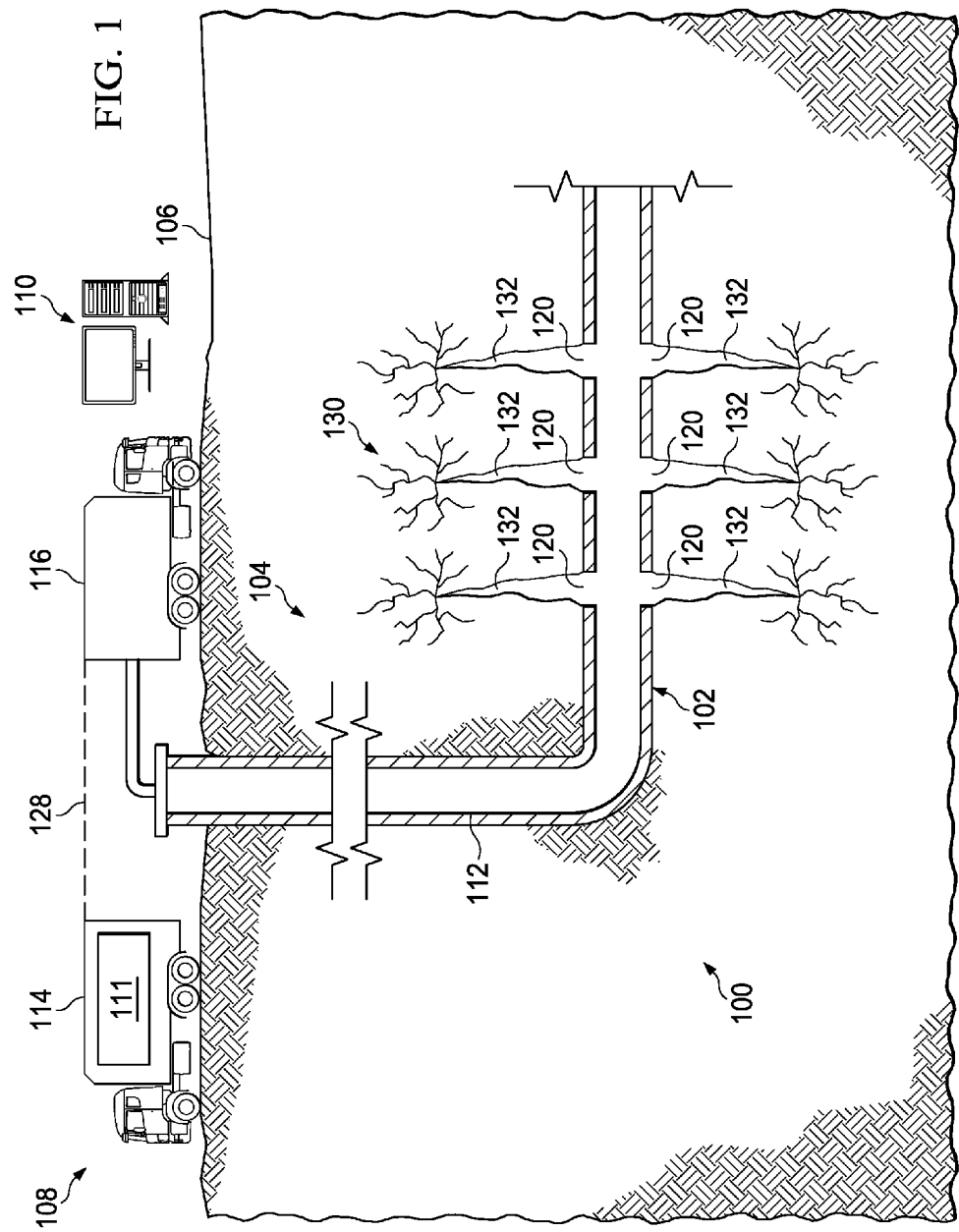

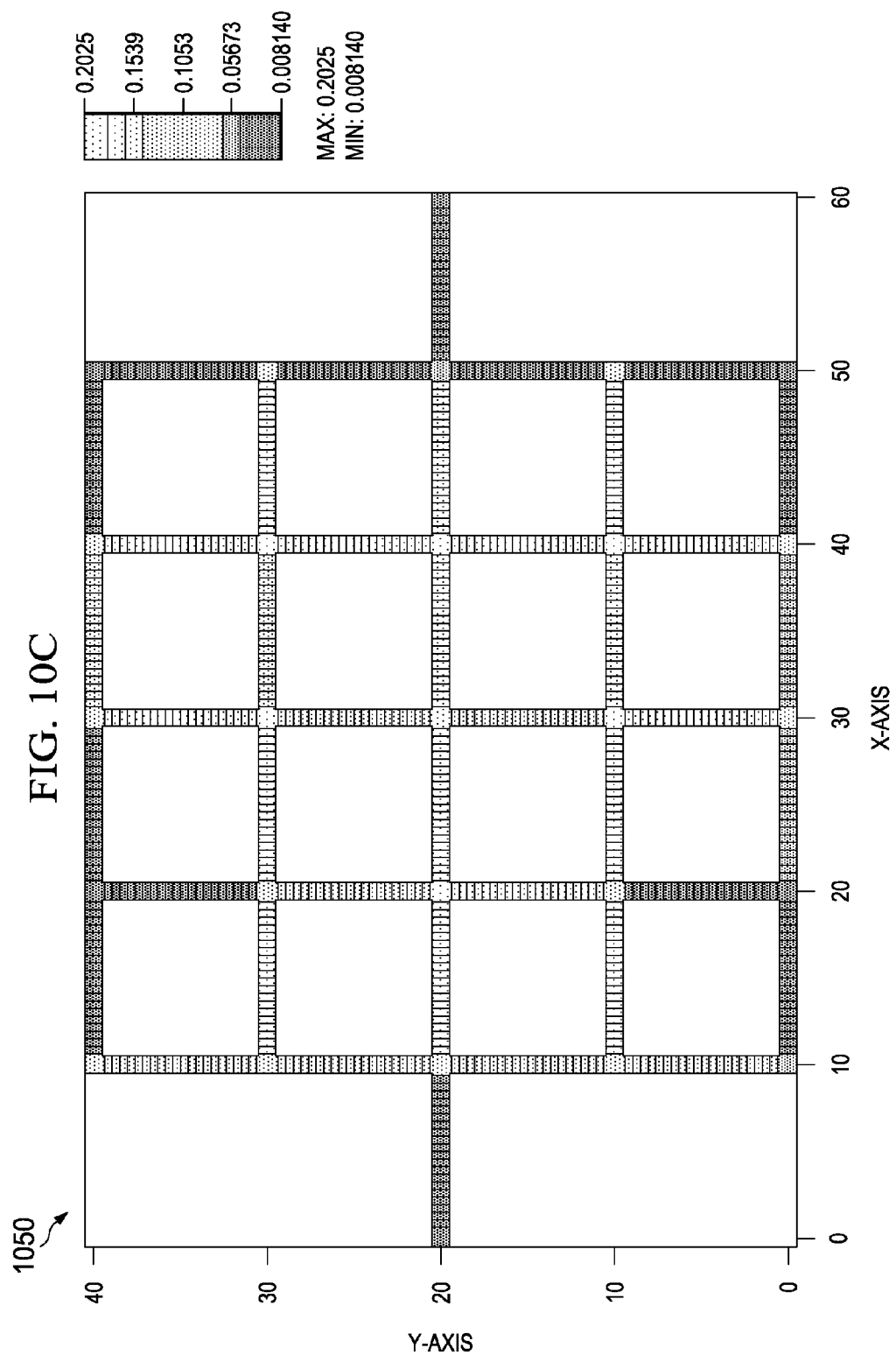

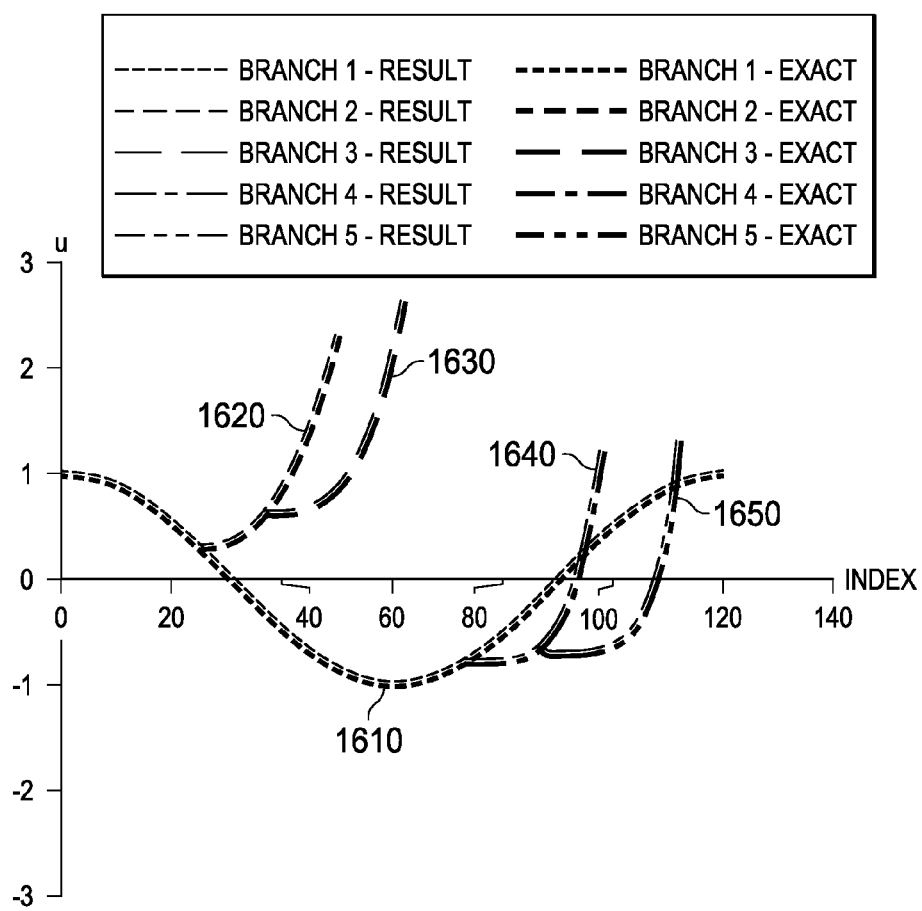

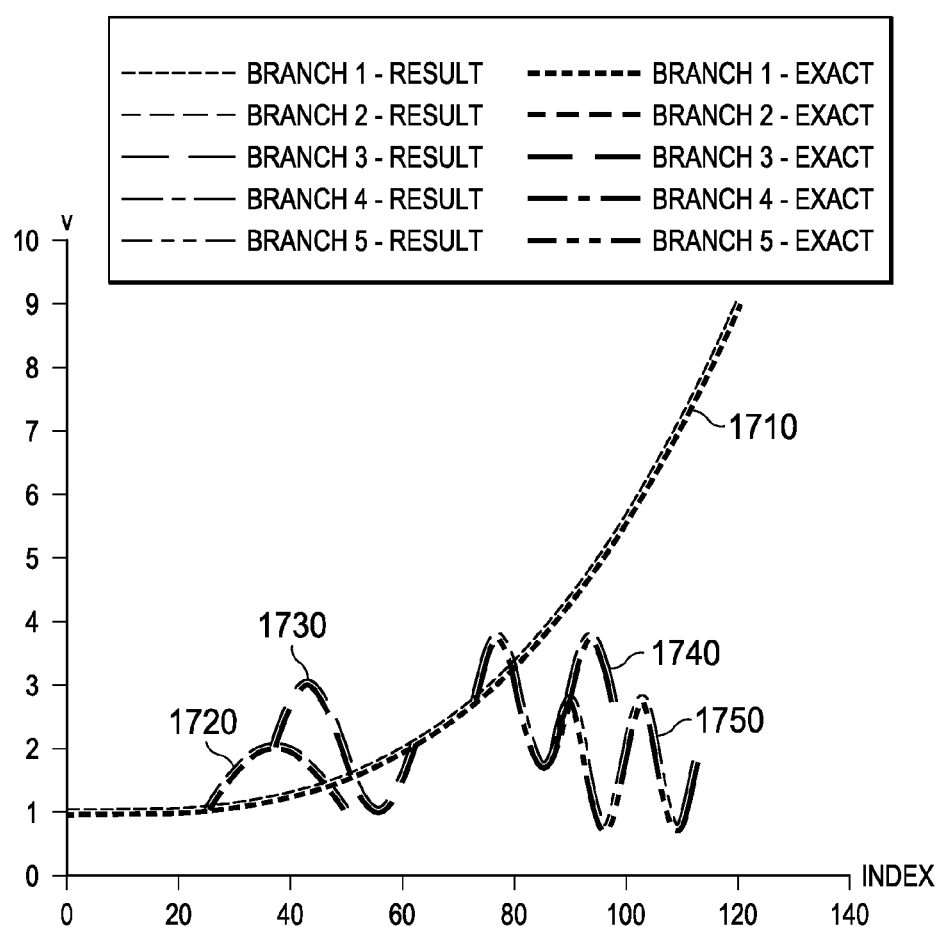

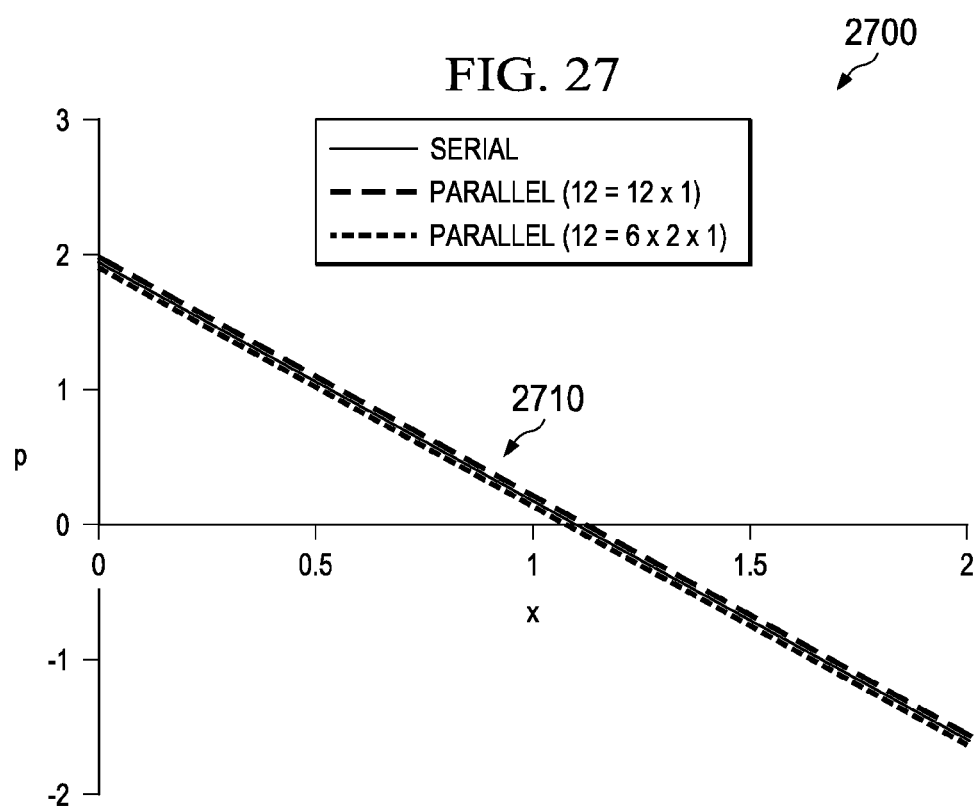

MODELING FLUID FLOW INTERACTIONS AMONG REGIONS OF A WELL SYSTEM

CROSS-REFERENCE TO RELATED APPLICATIONS

This application claims priority to U.S. Provisional Application Ser. No. 61/870,716, entitled "Simulating a Fluid Flow in a Subterranean Region," filed on Aug. 27, 2013. The entire contents of the priority application is hereby incorporated by reference.

BACKGROUND

The following description relates to simulating a fluid flow, for example, in a fracture network in a subterranean region.

Flow models have been used to simulate fluid flow in hydraulic fracture treatments and other environments. During a conventional fracture treatment of a subterranean reservoir, pressurized fluid is communicated from a wellbore into the reservoir at high pressure, and the pressurized fluid propagates fractures within the reservoir rock. Flow models can be used to simulate the flow of fluid, for example, within a fracture network.

DESCRIPTION OF DRAWINGS

FIG. 1 is a schematic diagram of an example well system.

FIGS. 10B and 10C are plots showing example snapshots of the fracture width from example numerical simulations at two different times.

FIGS. 16 and 17 are plots showing data from example numerical simulations based on the example flow path model 1500 shown in FIG. 15.

FIG. 27 is a diagram showing data from example numerical simulations using serial and parallel approaches for solving governing flow equations of a flow model.

Like reference symbols in the various drawings indicate like elements.

DETAILED DESCRIPTION

Figure 2A:
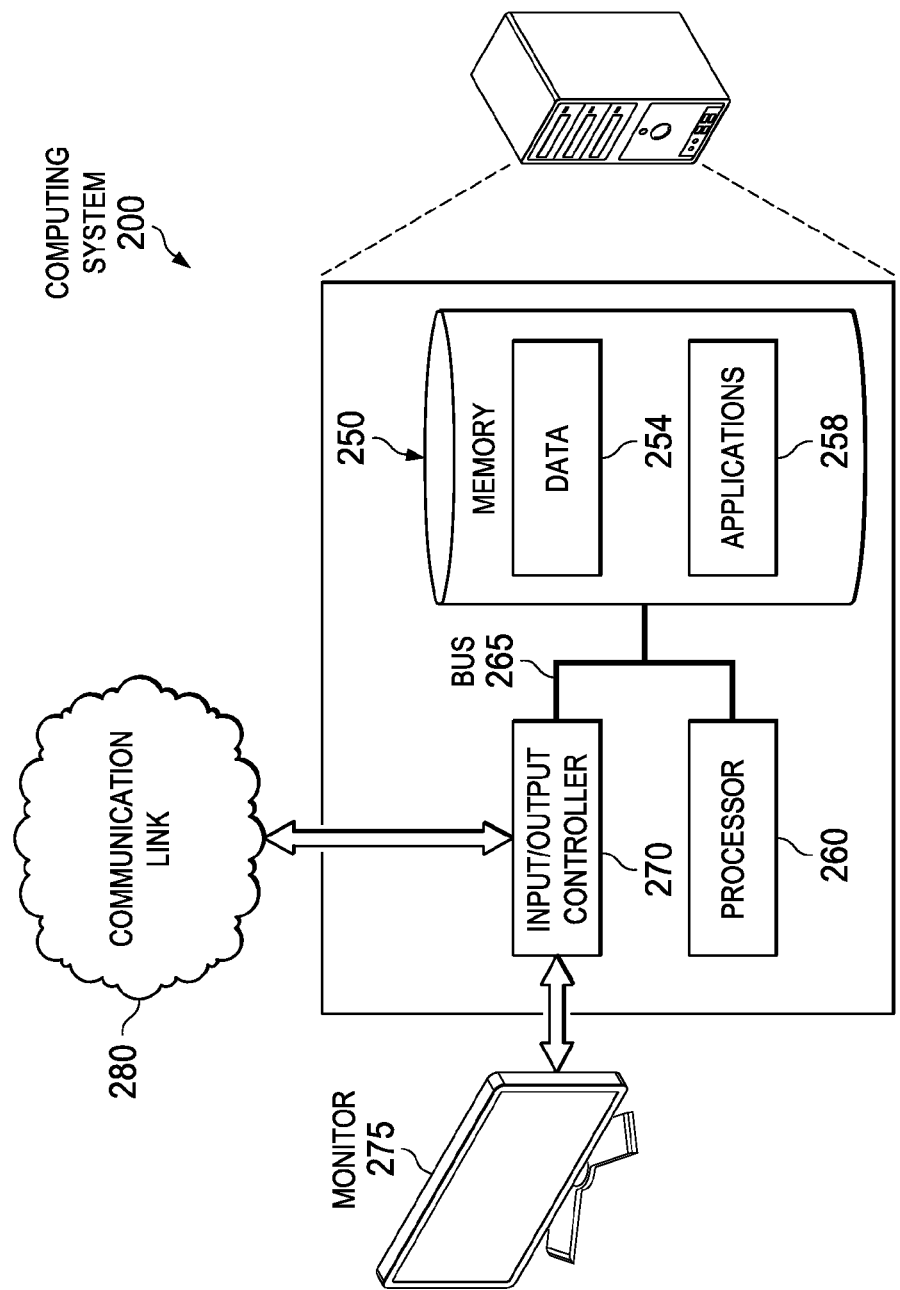
FIG. 2A is a schematic diagram of an example computing system.

Some aspects of what is described here relate to simulating fluid flow, for example, in a well system environment (e.g., in a wellbore, a fracture network, within a reservoir rock matrix, in a well system tool, etc.) or other environments. In some instances, the simulated computational geometry changes during the simulation, for example, in response to the solid-fluid interactions. An optimal or otherwise efficient implementation is desirable to keep the overall computational resources requirement low. Some aspects of what is described here can be used to perform fluid simulations (e.g., simulations of time-dependent, multi-phase flows under solid-fluid interaction, or other types of fluid simulations) in a computationally efficient manner.

In some instances, a simulation system may include multiple subsystem models (e.g., fracture models, wellbore models, reservoir models, rock block models, etc.) that collectively simulate the fluid flow in a fracture network. Subsystem models can be connected by one or more junction models. The junction models can provide connection conditions and boundary conditions of the simulation system. An example technique to efficiently simulate fluid flow can involve solving each of the subsystem models in parallel, for example, via an internal elimination process, to represent internal variables of each subsystem model in terms of junction variables of the junction models. After internal elimination, a junction system associated with the junction variable can be obtained. The junction system, in some instances, can have a relatively small size and may be represented by a sparse matrix. The junction variables can be solved based on the junction system, for example, by a sparse matrix solver, and then can be substituted back to obtain the internal variables of each subsystem model.

In some instances, computational simulation of fluid flow in a subsystem model can be computationally complex. For example, in some environments, the fluid flow is unsteady and multi-dimensional (e.g., three-dimensional (3D) or at least two-dimensional (2D)). Fully 3D or 2D simulations, however, may not be practical due to, for example, the vast computational domain, the underlying complex solid-fluid interaction, the multi-phase flow phenomenon, the need for real time simulators, or other considerations. In some implementations, a one-dimensional (1D) flow model can be used to represent the multi-dimensional fluid flow. For instance, the fluid flow of the fracture segments can be approximated by 1D governing flow equations, for example, by integrating the original three-dimensional temporal governing equations over the fracture cross-section. In some implementations, the 1D governing flow equations can be represented in matrix form. For example, a matrix system can be derived from the discretization of highly nonlinear governing flow equations. The matrix system can include a flow variable coefficient matrix. The flow variable coefficient matrix can be large and sparse, and the coefficient matrix can be a block matrix, a band matrix, or another type of matrix. Generally, any type of matrix may be used, and the elements of a matrix can include scalars, vectors, matrices (i.e., sub-matrices or blocks within a larger matrix), or other types of data structures.

A block matrix is a matrix that includes multiple blocks of matrix elements. For example, each block within a block matrix can be represented as a sub-matrix (i.e., a matrix of smaller size). The blocks within a block matrix can be represented explicitly, implicitly, or both. In some cases, each block within the block matrix is represented explicitly as a distinct element of the block matrix. In some other cases, the blocks are represented implicitly, for example, as groups (e.g., contiguous or non-contiguous groups) of the elements within the block matrix.

A band matrix (also called a banded matrix) includes a diagonal band of matrix elements. In some instances, all non-zero elements of the band matrix reside within a bandwidth about the main diagonal (including the main diagonal); in other words, all elements outside the bandwidth of the band matrix can be zero. For example, a band matrix B having m rows and a bandwidth of $2\beta+1$, can include non-zero elements at matrix positions $B(i\pm b, i)$, for all values of $i=1\ldots m$ and $b=0\ldots\beta$ that correspond to valid matrix positions. In this notation, the matrix positions $B(i, i)$ are on the main diagonal, and the valid matrix positions $B(i\pm b, i)$ for $b=1\ldots\beta$ are within the bandwidth about the main diagonal.

A band matrix can be an entries-symmetric matrix or an entries-asymmetric matrix. For example, a band matrix A can have all non-zero elements residing on the main diagonal, with r additional diagonals to its right, and l diagonals to its left. The bandwidth of the band matrix A can be expressed $l+r+1$. In some instances, $l+r+1 \ll N$, where N is the number of rows of the band matrix A. If $r=l$, then A is an entries-symmetric matrix; otherwise, A is an entries-asymmetric matrix. In a band matrix, the matrix positions in the bandwidth (including the main diagonal and all positions within the bandwidth about the main diagonal) can be referred to as "in-band" positions, and the matrix positions outside the bandwidth can be referred to as "off-band" positions.

A block-band matrix (also called a banded block matrix) is a band matrix that includes multiple blocks of matrix elements. As such, the non-zero elements of a block-band matrix can be represented as blocks (or sub-matrices) residing in and about a main diagonal. In some cases, a block-band matrix is represented as a band matrix, where each element of the band matrix is a distinct sub-matrix. In some other cases, the blocks within a block-band matrix are represented implicitly, for example, as groups (e.g., contiguous or non-contiguous groups) of elements within a band matrix.

In some aspects, simulating fluid flow (e.g., performing internal elimination, solving a junction system, etc.) involves solving a banded linear system. A banded linear system can be represented in matrix form by a band matrix of coefficients derived from linear governing flow equations (which may include linearized governing flow equations). In some cases, the system can be represented by a compact, banded block matrix, in which the bandwidth of the banded block matrix is substantially smaller than the size of the banded block matrix (e.g., as measured by the number of rows or columns). In some instances, each row of the matrix is derived from one of the governing flow equations.

In some examples, a direct band matrix solver can solve a banded block matrix, by performing elimination operations on the matrix. Elimination operations can simplify the mathematical representation of the system, for example, by reducing the number of unknown variables, reducing the number of equations, etc. As an example, Gaussian elimination can include elementary row operations operating on the coefficient matrix to reduce the number of rows.

In some implementations, a direct band matrix solver can select a non-zero element of a banded block matrix to be a pivot element such that eliminations can be performed based on the pivot element. In some examples, the pivot elements are the blocks in the main diagonal of the banded block matrix. The direct band matrix solver can decompose the pivot element (e.g., by performing LU-decomposition, or another type of decomposition) and perform elimination operations using the decomposed pivot element. In some instances, using the decomposition reduces the computational complexity and improves the computational efficiency, for example, by avoiding the need to compute a full inverse of the pivot element.

In some implementations, one or more solvers can be used to perform internal elimination or other operations for fluid flow simulations. In some instances, the order of accuracy of the discretization associated with the numerical simulation can be modified during the simulation. Moreover, various memory management strategies can be used to improve efficiency in solving a banded linear system. Some example memory management strategies may enable effective use of storage resources, efficient computation or manipulation of band matrices, or other advantages.

In some implementations, a banded linear system can be solved in parallel, for example, by using two or more threads. Operations can be performed in parallel, for example, by performing all or part of the operations concurrently; but parallel operations are not performed concurrently in some instances. In some implementations, parallel operations can be implemented, for example, by using two or more threads that can be executed substantially independent of each other. For instance, each thread can be initiated, executed, and completed independently of the other being initiated, executed, and completed.

In one example, an example parallel algorithm can use two threads to solve the banded linear system via Gaussian elimination. The two threads can, for example, start performing forward elimination and backward elimination from the top and the bottom of the coefficient matrix, respectively. The two threads can proceed inwards in parallel until the two meet at an intermediate region of the matrix. One of the two threads can be selected to solve the intermediate region and then perform backward substitution and forward substitution until a solution to the banded linear system is obtained. The example parallel algorithm can be extended to more than two threads. In some instances, the multiple threads can have the same or different processing powers or computational loads. The example parallel algorithm can take into account, for example, the processing powers and computational loads of the multiple threads, the structure of the band matrix (e.g., entries-symmetric, entries-asymmetric, etc.), or other factors to efficiently solve the linear system and achieve computational speed-up and good load-balance.

In another example, a parallel algorithm can use multiple threads to solve a banded linear system in a hierarchical manner. The hierarchical multi-thread algorithm can generate a hierarchy of linear systems and solve the banded linear system in a backward manner. For example, the linear system of each hierarchical level can be represented as a global coefficient matrix. The global coefficient matrix can be divided (or "fragmentized") into a number of sub-matrices. The multiple sub-matrices can be operated in parallel by multiple threads. In some implementations, the example two-thread algorithm described above can be used to solve or otherwise operate an individual sub-matrix. In some implementations, operating the multiple sub-matrices can include performing eliminations to reduce the variables or number of rows of the sub-matrices so that multiple reduced-size sub-matrices can be constructed or otherwise generated. In some instances, the reduced-size coefficient matrix can be constructed such that it preserves the bandwidth and diagonal dominance of the original global coefficient matrix. The multiple reduced-size sub-matrices collectively can form another global coefficient matrix for a next hierarchical level. The above process (e.g., fragmentation, operating sub-matrices, constructing a reduced-size coefficient matrix, etc.) can be repeated, for example, until no further fragmentation can be identified. A solution to the original banded linear system can be obtained, for example, by iteratively backward substituting a solution to a hierarchical level that has a smaller-size global coefficient matrix to obtain a solution to another hierarchical level that has a larger-size global coefficient matrix. In some implementations, after generating the hierarchy of linear systems, solving the banded linear system can begin with the hierarchical level that has the smallest-size global coefficient matrix. In some instances, the hierarchical multi-thread algorithm can efficiently solve large linear systems while retaining good scalability.

In some instances, the direct or parallel algorithm for solving a banded linear system can include additional or different operations, or may be performed in another manner. Various advantages such as, for example, improved efficiency, reduced computational time, better load balance, greater scalability, etc., may be achieved by some implementations of the example techniques described here. Although some of the example techniques are described in the context of simulating the flow of well system fluid, they can be extended to other applications; for example, the techniques described here may be applied to simulations of other types of fluids in other types of environments.

FIG. 1 is a diagram of an example well system 100 and a computing subsystem 110. The example well system 100 includes a wellbore 102 in a subterranean region 104 beneath the ground surface 106. The example wellbore 102 shown in FIG. 1 includes a horizontal wellbore; however, a well system may include any combination of horizontal, vertical, slant, curved, or other wellbore orientations. The well system 100 can include one or more additional treatment wells, observation wells, or other types of wells.

The computing subsystem 110 can include one or more computing devices or systems located at the wellbore 102 or other locations. The computing subsystem 110 or any of its components can be located apart from the other components shown in FIG. 1. For example, the computing subsystem 110 can be located at a data processing center, a computing facility, or another suitable location. The well system 100 can include additional or different features, and the features of the well system can be arranged as shown in FIG. 1 or in another configuration.

The example subterranean region 104 may include a reservoir that contains hydrocarbon resources such as oil, natural gas, or others. For example, the subterranean region 104 may include all or part of a rock formation (e.g., shale, coal, sandstone, granite, or others) that contain natural gas. The subterranean region 104 may include naturally fractured rock or natural rock formations that are not fractured to any significant degree. The subterranean region 104 may include tight gas formations that include low permeability rock (e.g., shale, coal, or others).

The example well system 100 shown in FIG. 1 includes an injection system 108. The injection system 108 can be used to perform an injection treatment whereby fluid is injected into the subterranean region 104 through the wellbore 102. In some instances, the injection treatment fractures part of a rock formation or other materials in the subterranean region 104. In such examples, fracturing the rock may increase the surface area of the formation, which may increase the rate at which the formation conducts fluid resources to the wellbore 102.

The example injection system 108 can inject treatment fluid into the subterranean region 104 from the wellbore 102. For example, a fracture treatment can be applied at a single fluid injection location or at multiple fluid injection locations in a subterranean zone, and the fluid may be injected over a single time period or over multiple different time periods. In some instances, a fracture treatment can use multiple different fluid injection locations in a single wellbore, multiple fluid injection locations in multiple different wellbores, or any suitable combination. Moreover, the fracture treatment can inject fluid through any suitable type of wellbore such as, for example, vertical wellbores, slant wellbores, horizontal wellbores, curved wellbores, or combinations of these and others.

The example injection system 108 includes instrument trucks 114, pump trucks 116, and an injection treatment control subsystem 111. The example injection system 108 may include other features not shown in the figures. The injection system 108 may apply injection treatments that include, for example, a multi-stage fracturing treatment, a single-stage fracture treatment, a test treatment, a final fracture treatment, other types of fracture treatments, or a combination of these.

The pump trucks 116 can include mobile vehicles, immobile installations, skids, hoses, tubes, fluid tanks, fluid reservoirs, pumps, valves, mixers, or other types of structures and equipment. The example pump trucks 116 shown in FIG. 1 can supply treatment fluid or other materials for the injection treatment. The example pump trucks 116 can communicate treatment fluids into the wellbore 102 at or near the level of the ground surface 106. The treatment fluids can be communicated through the wellbore 102 from the ground surface 106 level by a conduit 112 installed in the wellbore 102. The conduit 112 may include casing cemented to the wall of the wellbore 102. In some implementations, all or a portion of the wellbore 102 may be left open, without casing. The conduit 112 may include a working string, coiled tubing, sectioned pipe, or other types of conduit.

The instrument trucks 114 can include mobile vehicles, immobile installations, or other suitable structures. The example instrument trucks 114 shown in FIG. 1 include an injection treatment control subsystem 111 that controls or monitors the injection treatment applied by the injection system 108. The communication links 128 may allow the instrument trucks 114 to communicate with the pump trucks 116, or other equipment at the ground surface 106. Additional communication links may allow the instrument trucks 114 to communicate with sensors or data collection apparatus in the well system 100, remote systems, other well systems, equipment installed in the wellbore 102 or other devices and equipment. In some implementations, communication links allow the instrument trucks 114 to communicate with the computing subsystem 110 that can run simulations and provide simulation data. The well system 100 can include multiple uncoupled communication links or a network of coupled communication links. The communication links can include wired or wireless communications systems, or a combination thereof.

The injection system 108 may also include surface and down-hole sensors to measure pressure, rate, temperature or other parameters of treatment or production. For example, the injection system 108 may include pressure meters or other equipment that measure the pressure of fluids in the wellbore 102 at or near the ground surface 106 or at other locations. The injection system 108 may include pump controls or other types of controls for starting, stopping, increasing, decreasing or otherwise controlling pumping as well as controls for selecting or otherwise controlling fluids pumped during the injection treatment. The injection treatment control subsystem 111 may communicate with such equipment to monitor and control the injection treatment.

The injection system 108 may inject fluid into the formation above, at or below a fracture initiation pressure; above, at or below a fracture closure pressure; or at another fluid pressure. The example injection treatment control subsystem 111 shown in FIG. 1 controls operation of the injection system 108. The injection treatment control subsystem 111 may include data processing equipment, communication equipment, or other systems that control injection treatments applied to the subterranean region 104 through the wellbore 102. The injection treatment control subsystem 111 may be communicably linked to the computing subsystem 110 that can calculate, select, or optimize treatment parameters for initialization, propagation, or opening fractures in the subterranean region 104. The injection treatment control subsystem 111 may receive, generate or modify an injection treatment plan (e.g., a pumping schedule) that specifies properties of an injection treatment to be applied to the subterranean region 104.

In the example shown in FIG. 1, an injection treatment has fractured the subterranean region 104. FIG. 1 shows examples of dominant fractures 132 formed by fluid injection through perforations 120 along the wellbore 102. Generally, the fractures can include fractures of any type, number, length, shape, geometry or aperture. Fractures can extend in any direction or orientation, and they may be formed at multiple stages or intervals, at different times or simultaneously. The example dominant fractures 132 shown in FIG. 1 extend through natural fracture networks 130. Generally, fractures may extend through naturally fractured rock, regions of unfractured rock, or both. The injected fracturing fluid can flow from the dominant fractures 132, into the rock matrix, into the natural fracture networks 130, or in other locations in the subterranean region 104. The injected fracturing fluid can, in some instances, dilate or propagate the natural fractures or other pre-existing fractures in the rock formation.

In some implementations, the computing subsystem 110 can simulate fluid flow in the well system 100. For example, the computing subsystem 110 can include flow models for simulating fluid flow in or between various locations of fluid flow in the well system, such as, for example, the wellbore 102, the perforations 120, the conduit 112 or components thereof, the dominant fractures 132, the natural fracture networks 130, the rock media in the subterranean region 104, or a combination of these and others. The flow models can model the flow of incompressible fluids (e.g., liquids), compressible fluids (e.g., gases), or a combination of multiple fluid phases. In some instances, the flow models can model flow in one, two, or three spatial dimensions. The flow models can include nonlinear systems of differential or partial differential equations. The computing subsystem 110 can use the flow models to predict, describe, or otherwise analyze the dynamic behavior of fluid in the well system 100. In some cases, the computing subsystem 110 can perform operations such as generating or discretizing governing flow equations or processing governing flow equations.

The computing subsystem 110 can perform simulations before, during, or after the injection treatment. In some implementations, the injection treatment control subsystem 111 controls the injection treatment based on simulations performed by the computing subsystem 110. For example, a pumping schedule or other aspects of a fracture treatment plan can be generated in advance based on simulations performed by the computing subsystem 110. As another example, the injection treatment control subsystem 111 can modify, update, or generate a fracture treatment plan based on simulations performed by the computing subsystem 110 in real time during the injection treatment.

In some cases, the simulations are based on data obtained from the well system 100. For example, pressure meters, flow monitors, microseismic equipment, tiltmeters, or other equipment can perform measurements before, during, or after an injection treatment; and the computing subsystem 110 can simulate fluid flow based on the measured data. In some cases, the injection treatment control subsystem 111 can select or modify (e.g., increase or decrease) fluid pressures, fluid densities, fluid compositions, and other control parameters based on data provided by the simulations. In some instances, data provided by the simulations can be displayed in real time during the injection treatment, for example, to an engineer or other operator of the well system 100.

Some of the techniques and operations described herein may be implemented by a one or more computing systems configured to provide the functionality described. In various instances, a computing system may include any of various types of devices, including, but not limited to, personal computer systems, desktop computers, laptops, notebooks, mainframe computer systems, handheld computers, workstations, tablets, application servers, computer clusters, storage devices, or any type of computing or electronic device.

FIG. 2A is a diagram of an example computing system 200. The example computing system 200 can operate as the example computing subsystem 110 shown in FIG. 1, or it may operate in another manner. For example, the computing system 200 can be located at or near one or more wells of a well system or at a remote location apart from a well system. All or part of the computing system 200 may operate independent of a well system or well system components. The example computing system 200 includes a memory 250, a processor 260, and input/output controllers 270 communicably coupled by a bus 265. The memory 250 can include, for example, a random access memory (RAM), a storage device (e.g., a writable read-only memory (ROM) or others), a hard disk, or another type of storage medium. The computing system 200 can be preprogrammed or it can be programmed (and reprogrammed) by loading a program from another source (e.g., from a CD-ROM, from another computer device through a data network, or in another manner). In some examples, the input/output controller 270 is coupled to input/output devices (e.g., a monitor 275, a mouse, a keyboard, or other input/output devices) and to a communication link 280. The input/output devices can receive or transmit data in analog or digital form over communication links such as a serial link, a wireless link (e.g., infrared, radio frequency, or others), a parallel link, or another type of link.

The communication link 280 can include any type of communication channel, connector, data communication network, or other link. For example, the communication link 280 can include a wireless or a wired network, a Local Area Network (LAN), a Wide Area Network (WAN), a private network, a public network (such as the Internet), a WiFi network, a network that includes a satellite link, or another type of data communication network.

The memory 250 can store instructions (e.g., computer code) associated with an operating system, computer applications, and other resources. The memory 250 can also store application data and data objects that can be interpreted by one or more applications or virtual machines running on the computing system 200. As shown in FIG. 2A, the example memory 250 includes data 254 and applications 258. The data 254 can include treatment data, geological data, fracture data, fluid data, or other types of data. The applications 258 can include flow models, fracture treatment simulation software, reservoir simulation software, or other types of applications. In some implementations, a memory of a computing device includes additional or different data, applications, models, or other information.

In some instances, the data 254 can include treatment data relating to injection treatment plans. For example the treatment data can indicate a pumping schedule, parameters of a previous injection treatment, parameters of a future injection treatment, or parameters of a proposed injection treatment. Such parameters may include information on flow rates, flow volumes, slurry concentrations, fluid compositions, injection locations, injection times, or other parameters.

In some instances, the data 254 include geological data relating to geological properties of a subterranean region. For example, the geological data may include information on wellbores, completions, or information on other attributes of the subterranean region. In some cases, the geological data includes information on the lithology, fluid content, stress profile (e.g., stress anisotropy, maximum and minimum horizontal stresses), pressure profile, spatial extent, or other attributes of one or more rock formations in the subterranean zone. The geological data can include information collected from well logs, rock samples, outcroppings, microseismic imaging, or other data sources.

In some instances, the data 254 include fracture data relating to fractures in the subterranean region. The fracture data may identify the locations, sizes, shapes, and other properties of fractures in a model of a subterranean zone. The fracture data can include information on natural fractures, hydraulically-induced fractures, or any other type of discontinuity in the subterranean region. The fracture data can include fracture planes calculated from microseismic data or other information. For each fracture plane, the fracture data can include information (e.g., strike angle, dip angle, etc.) identifying an orientation of the fracture, information identifying a shape (e.g., curvature, aperture, etc.) of the fracture, information identifying boundaries of the fracture, or any other suitable information.

In some instances, the data 254 include fluid data relating to well system fluids. The fluid data may identify types of fluids, fluid properties, thermodynamic conditions, and other information related to well system fluids. The fluid data can include flow models for compressible or incompressible fluid flow. For example, the fluid data can include systems of governing equations (e.g., Navier-Stokes equations, advection-diffusion equations, continuity equations, etc.) that represent fluid flow generally or fluid flow under certain types of conditions. In some cases, the governing flow equations define a nonlinear system of equations. The fluid data can include data related to native fluids that naturally reside in a subterranean region, treatment fluids to be injected into the subterranean region, hydraulic fluids that operate well system tools, or other fluids that may or may not be related to a well system.

The applications 258 can include software applications, scripts, programs, functions, executables, or other modules that are interpreted or executed by the processor 260. For example, the applications 258 can include a fluid flow simulation module, a hydraulic fracture simulation module, a reservoir simulation module, or another other type of simulator. The applications 258 may include machine-readable instructions for performing one or more of the operations related to FIGS. 3-27. The applications 258 may include machine-readable instructions for generating a user interface or a plot, for example, illustrating fluid flow or fluid properties. The applications 258 can receive input data such as treatment data, geological data, fracture data, fluid data, or other types of input data from the memory 250, from another local source, or from one or more remote sources (e.g., via the communication link 280). The applications 258 can generate output data and store the output data in the memory 250, in another local medium, or in one or more remote devices (e.g., by sending the output data via the communication link 280).

In some implementations, the applications 258 may include a process, a program, an application, or another module that includes one or more threads. Here, the term "thread" is used broadly to refer to a computing sequence executed by computing hardware, and does not imply any particular hardware architecture. For instance, a thread can be a sequence of machine-readable instructions that can be independently accessed, executed, or otherwise managed by one or more processing units (e.g., the processor 260). Multiple threads can be executed sequentially or concurrently by one or more processing units. The multiple threads may exchange data before, during, or after execution of the respective threads. Multiple threads can share resources such as memory. As an example, a process of the applications 258 can include two or more threads that share part or all of the memory 250 (e.g., the data 254). The shared memory can be accessed by the multiple threads and thus provide an efficient means for data passing, data synchronization, and communication among the multiple threads. In some instances, the multiple threads can establish a synchronous communication or an asynchronous communication among each other. For example, two communicating threads wait for each other to transfer a message in a synchronous communication scenario, while the sender may send a message to the receiver without waiting for the receiver to be ready in an asynchronous communication case. In some other implementations, the multiple threads can employ distributed memory, distributed shared memory, or another type of memory management mechanism for data passing between the threads.

The processor 260 can execute instructions, for example, to generate output data based on data inputs. For example, the processor 260 can run the applications 258 by executing or interpreting the software, scripts, programs, functions, executables, or other modules contained in the applications 258. The processor 260 may perform one or more of the operations related to FIGS. 3-27. The input data received by the processor 260 or the output data generated by the processor 260 can include any of the treatment data, the geological data, the fracture data, the fluid data, or any other data.

The processor 260 can be a single-core processor or a multi-core processer. The single-core processor and the multi-core processor can both execute one or more threads sequentially or simultaneously. For instance, a single-core processor can run multiple threads in a time-division multiplexing manner or another manner and achieve multi-tasking. As an example, a single process of the applications 258 can include multiple threads. The multiple threads can be scheduled and executed on a single-core processor. On the other hand, a multi-core processor (e.g., a dual-core, quad-core, octa-core processor, etc.) can use some or all of its processing units (cores) to run multiple threads simultaneously. For example, each processing unit may execute a single thread independently and in parallel with each other. In some instances, the multiple processing units may have the same or different processing powers. The multiple threads can be dynamically allocated to the multiple processing units, for example, based on the computational loads of the threads, the processing powers of the processing units, or another factor. The multi-core processor may appropriately allocate the multiple threads to multiple processing units to optimize parallel computing and increase overall speed of a multiple-thread process.

Figure 2B:
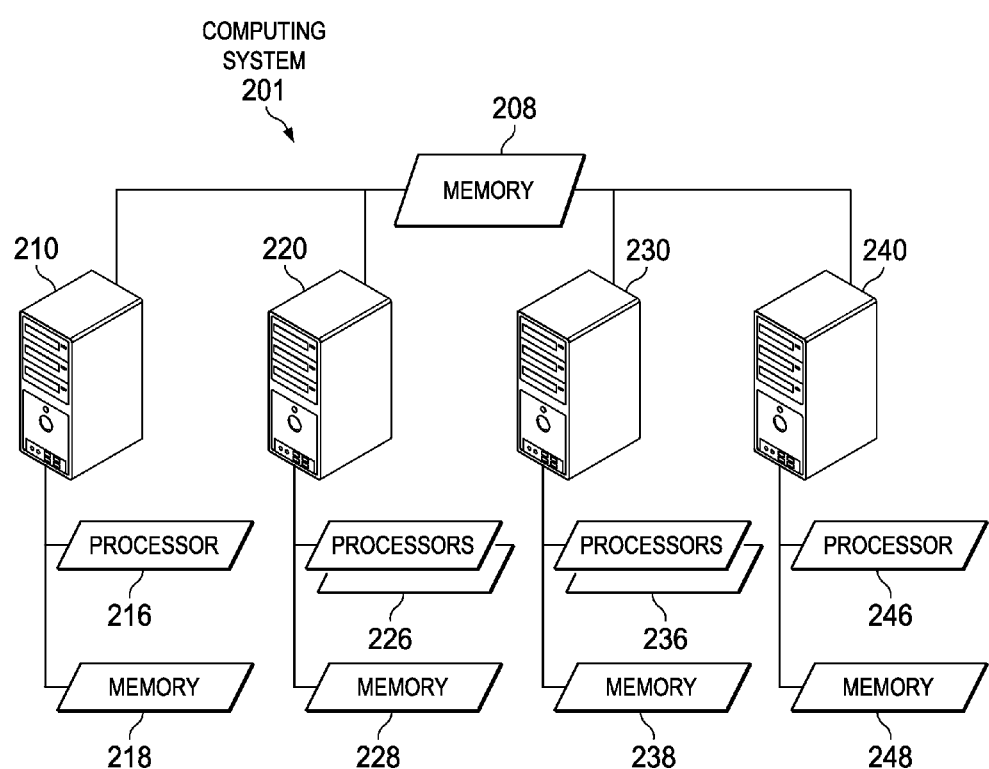
FIG. 2B is a schematic diagram of another example computing system.

FIG. 2B is a diagram of another example computing system 201. The example computing system 201 can operate as the example computing subsystem 110 shown in FIG. 1, or it may operate in another manner. A computing system can include a cluster of computers, servers, or other computing resources. As illustrated, the example computing system 201 includes four computing subsystems 210-240. In some implementations, one or more of the subsystems 210-240 can be located at or near one or more wells of the well system 100, or at a remote location. The subsystems 210-240 can be communicably linked with each other, for example, via a communication network. Each of the computing subsystems 210-240 can be configured in a manner similar to the computing system 200 in FIG. 2A, or in a different manner.

The computing subsystems 210, 220, 230, and 240 can include one or more processors 216, 226, 236, and 246, respectively. The processors 216, 226, 236, and 246 can each be a single-core or a multi-core processor that has a single or multiple processing units. All or part of the processing units of the computing subsystems 210-240 can be viewed as a collective computing resource that can be shared, allocated, or otherwise used by a process, a program, an application, or another module. In some implementations, all or part of the computing subsystems 210-240 may operate substantially independently of one another. For example, one computing subsystem may be selected to execute one process while another computing subsystem can be selected to perform another independent process. In some other implementations, all or part of the computing subsystems 210-240 may collaborate with each other, for example, in performing one or more of the operations related to FIGS. 3-27. As an example, one or more of the computing subsystems 210-240 may perform parallel computing of a single process by executing multiple threads of the process using multiple processing units concurrently. The example computing system 201 can perform operations in another manner.

In some implementations, the example computing system 201 can be configured to include shared memory 208 that can be accessed (e.g., simultaneously or sequentially) by multiple processors, multiple programs, or multiple threads of a single program of the computing subsystems 210, 220, 230, and 240. The shared memory 208 can avoid redundant data copies and can provide an efficient way for data passing among multiple processors, multiple programs, or multiple threads of a single program. In some implementations, the example computing system 201 can be configured to include distributed memory where the computing subsystems 210, 220, 230, and 240 can each have memories 218, 228, 238, and 248, respectively. In some implementations, the memories 218, 228, 238, and 248 are only accessible to the respective local processor or processors. For instance, the memory 228 may be accessible only to the one or more local processors 226; if a program running on the processor 216 needs to access data in the memory 228, the processor 216 may communicate with the one or more processors 226. In some implementations, additional or different memory configuration and management techniques can be used.

Figure 3:
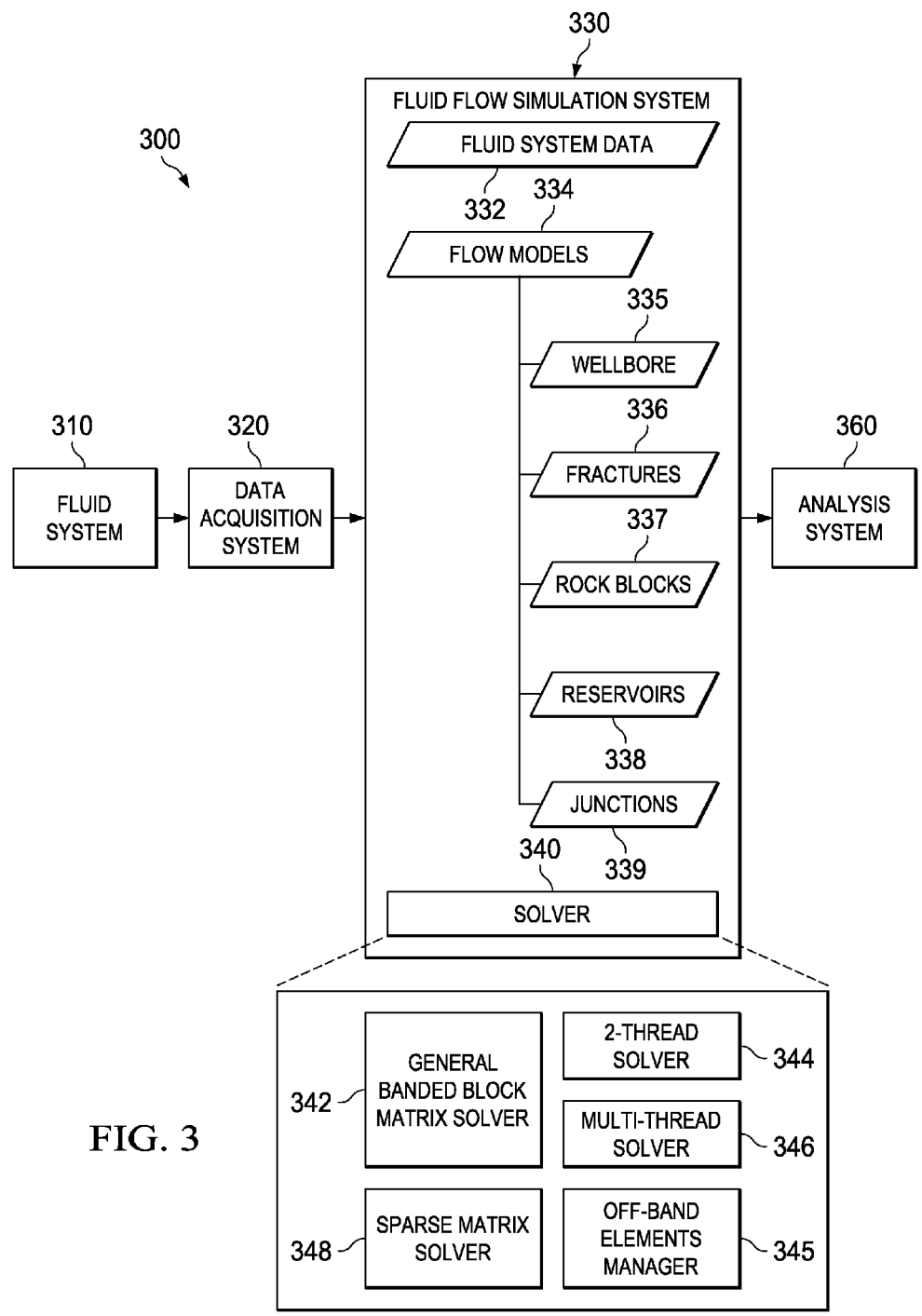
FIG. 3 is a diagram of an example system architecture.

FIG. 3 is a diagram of an example system architecture 300. The example system architecture 300 can be used to model fluid flow in a well system environment. For example, the architecture 300 can be used to simulate fluid flow in an injection treatment of the subterranean region 104 shown in FIG. 1. In some instances, the architecture 300 is used to model fluid flow and other aspects of an injection treatment or other activities (e.g. drilling, production, etc.) in a well system. In some cases, the architecture 300 is used to model fluid flow within or between one or more wellbores, wellbore conduits, wellbore tools, wellbore perforations, reservoir rock media, reservoir fractures (e.g., fractures in a complex fracture network, in a dominant bi-wing fracture extending from a wellbore, in a natural fracture network, in hydraulically-induced fractures, etc.), or combinations of these and other types of flow paths as well as solid-fluid interactions in a well system environment.

The example architecture 300 shown in FIG. 3 includes a fluid system 310, a data acquisition system 320, a fluid flow simulation system 330, and an analysis system 360. The architecture 300 can include additional or different components or subsystems, and the example components shown in FIG. 3 can be combined, integrated, divided, or configured in another manner. For example, the fluid flow simulation system 330 and the analysis system 360 can be subcomponents of an integrated computing system (e.g., the computing systems 200, 201 shown in FIGS. 2A-2B) or multiple computing systems; or the data acquisition system 320 can be integrated with the fluid system 310. As another example, the fluid flow simulation system 330 or the analysis system 360, or both, can be implemented in a computing system that operates independent of the fluid system 310 or the data acquisition system 320.

The example fluid system 310 can be any physical system where fluid flow or other fluid phenomena occur. The fluid system 310 can represent a well system environment (e.g., the well system 100 shown in FIG. 1) or a subset of well system components or subsystems (e.g., the injection system 108 shown in FIG. 1). The fluid system 310 can represent the physical reservoir rock in a subterranean reservoir (e.g., the subterranean region 104 shown in FIG. 1), fractures or a fracture network in the reservoir rock, one or more downhole systems installed in a wellbore, or a combination of them.

The data acquisition system 320 can be any system or hardware that obtains data from the fluid system 310. For example, the data acquisition system 320 can include flow sensors, pressure sensors, temperature sensors, and other types of measurement devices. The data acquisition system 320 can include communication and data storage systems that store, transfer, manipulate, or otherwise manage the information obtained from the fluid system.

The fluid flow simulation system 330 can be one or more computer systems or computer-implemented programs that simulate fluid flow. The fluid flow simulation system 330 can receive information related to the fluid system 310 and simulate fluid flow and other phenomena that occur in the fluid system 310. For example, the fluid flow simulation system 330 can calculate flow velocities, pressures, or other aspects of fluid flow based on data from the data acquisition system 320 or another source. The fluid flow simulation system 300 may also simulate movement of mechanical systems (e.g. rock blocks, reservoir media, wellbore equipment) or other phenomena coupled to the simulated fluid.

The example fluid flow simulation system 330 includes fluid system data 332, flow models 334, and solvers 340. The fluid flow simulation system can include additional or different features, and the features of a fluid flow simulation system 330 can be configured to operate in another manner. The modules of the fluid flow simulation system 330 can include hardware modules, software modules, or other types of modules. In some cases, the modules can be integrated with each other or with other system components. In some example implementations, the fluid flow simulation system 330 can be implemented as software running on a computing system (e.g., the example computing systems 200, 201 in FIGS. 2A-2B), and the modules of the fluid flow simulation system 330 can be implemented as software functions or routines that are executed by the computing system. In some implementations, one or more software functions or routines can include multiple threads that can be executed by computing system in series or in parallel.

The fluid system data 332 can include any information related to the fluid system 310 or another fluid system. For example, the fluid system data 332 can indicate physical properties (e.g., geometry, surface properties, etc.) of one or more flow paths in the fluid system 310, material properties (e.g., density, viscosity, Reynolds number, etc.) of one or more fluids in the fluid system 310, thermodynamic data (e.g., fluid pressures, fluid temperatures, fluid flow rates, etc.) measured at one or more locations in the fluid system 310, and other types of information. The fluid system data 332 can include information received from the data acquisition system 320 and other sources.

The flow models 334 can include any information or modules that can be used to simulate fluid flow. The flow models 334 can include governing equations, spatial and temporal discretization data, or other information. In some examples, the flow models 334 include governing flow equations, such as, for example, Navier-Stokes equations or related approximations of Navier-Stokes equations, continuity equations, or other types of flow equations.

The flow models 334 can include various types of subsystem models for simulating fluid flow in a subterranean region. In some instances, the flow models include multiple subsystem models, and each subsystem model can represent the fluid flow associated with a distinct sub-region in a subterranean region. For example, a flow model can include a wellbore subsystem model 335 for modeling fluid flow in a wellbore (e.g., wellbore 102 in FIG. 1) or a wellbore tool, a fracture subsystem model 336 for modeling fluid flow in fractures, a rock block subsystem model 337 for modeling solid-fluid interactions, a reservoir subsystem model 338 for modeling fluid flow in the reservoir media, a flow-back or leak-off model for modeling fluid flow-back or leak-off processes between reservoir rock and adjacent fractures, or a combination of these and other types of subsystem models. In some instances, the subsystem models can be connected, for example, by one or more junction models 339 that can provide connection conditions, boundary conditions, or both among the subsystem models. The flow models 334 can include or otherwise interact with additional or different subsystems models.

The flow models 334 can include discretization data derived from governing flow equations. For example, the flow models 334 can include spatial discretization data such as discrete nodes that represent locations of fluid flow along flow paths in the fluid system 310, or other types of data. The data can be represented in different forms. In some implementations, discretized governing flow equations can be represented in matrix form. For example, some discretized governing equations can be represented by band matrix data and intersection data. Additional or different types of matrix representations can be used.

In some implementations, the band matrix data can include a band matrix and other related information. The band matrix can represent fluid flow within one or more one-dimensional flow paths, as provided by the flow models 334. For example, the band matrix can include values derived from the discretized governing flow equations, describing fluid flow between nodes that are connected within the same flow path.

The band matrix data can be stored in any suitable form. For example, the band matrix can be stored in full matrix form, including all elements in the bandwidth and all zeros outside the bandwidth, or the band matrix can be stored in a more compact form. In some cases, the band matrix can be stored as one or more vectors that include all matrix elements in the bandwidth, without explicitly storing the zeros outside the bandwidth. For example, a band matrix having a bandwidth of three (i.e., a tri-diagonal matrix) can be stored as three vectors: a first vector for the elements of the main diagonal, a second vector for the elements one position above the main diagonal, and a third vector for the elements one position below the main diagonal. Similarly, a band matrix having a bandwidth of five (i.e., a penta-diagonal matrix) can be stored as five vectors. The band matrix can be store in another manner, for example, using a different number of vectors or a different type of data structure.

The intersection data can include one or more "off-band" elements residing outside the bandwidth of the band matrix and other related information. In some implementations, the intersection data can represent interconnections or other relations among data within the bandwidth of the matrix. For instance, the intersection data can include junction data that represent relations among variables of multiple subsystem models. As an example, the intersection data can include data describing the physical intersection between a wellbore and the fractures (e.g., perforations). In some instances, the intersection data can be used to impose connections and boundary conditions of multiple subsystem models.

In some implementations, the intersection data can supplement the band matrix data. For example, in cases where the band matrix describes the flow dynamics within the individual flow paths, the band matrix by itself may not fully capture the flow dynamics between the flow paths (e.g., fluid communication between the flow paths at a flow path intersection). The intersection data can be used, for example, as a bookkeeping tool when computing a solution from the band matrix. For example, in some cases, the flow models can be operated by solving a matrix equation that involves the band matrix, and the operations on the band matrix can be modified or updated based on the intersection data. The intersection data can be stored in any suitable form, for example, in table form, matrix form, vector form, etc.

In some implementations, the fluid flow simulation system 330 can also include a time marching module to perform calculations in a discretized time domain. For example, the governing flow equations may include derivatives or partial derivatives in the time domain, and the time marching module can calculate such quantities based on a time marching algorithm. Example time marching schemes include the backward Euler scheme, the Crank-Nicolson scheme, and others.

The solvers 340 can include any information or modules that can be used to solve a system of equations. For example, the solvers 340 can include one or more of a direct solver, an iterative solver, or another type of solver. In some implementations, the solvers 340 can include one or more solvers specialized for different applications. For example, the solvers 340 can include a general block-matrix solver 342, a two-thread solver 344, a multi-thread solver 346, a sparse matrix solver 348 and an off-band elements manager 345. The solvers 340 can include additional or different types of solvers for solving a system of equations. The solver 340 can implement one or more example techniques described in this disclosure. In some implementations, a combination of these and other techniques for solving a system of equations can be implemented in the solver 340.

In some cases, the solver 340 can be expressed as solving a matrix equation Ak=b, where k represents the variables of interest that are computed by the solver 340, and elements of A and b are provided, for example, based on information from the flow models 334, the fluid system data 332, and other sources. As an example, the solver 340 may solve the matrix equations in Equations (1)-(3) below, other linear equations, non-linear equations, or a combination thereof.

In some instances, the solvers 340 can solve one or more fluid flow models 334 to simulate a fluid flow in a fracture network in a subterranean region. For example, the solvers 340 can receive inputs from the other components of the fluid flow simulation system 330 and generate a numerical solution for a variable of interest based on the inputs. The solution can be generated for some or all of the nodes in a discretized spatial domain. For example, the solvers 340 may calculate values of fluid velocity, fluid pressure, or another variable over a spatial domain; the values can be calculated for an individual time step or multiple time steps.

In some implementations, the solvers 340 can solve a global system of equations encompassing multiple diverse aspects (e.g., wellbores, fractures, rock blocks, reservoirs, etc.) of the fracture network in the subterranean region. In some other implementations, the solvers 340 may first operate on one or more subsystem models independently, for example, by performing internal elimination to obtain a relationship between the internal variables of each subsystem model in terms of the junction variables of the junction models, and then solve the junction variables based on the junction models.

In some implementations, the general banded block-matrix solver 342 can be used to perform internal eliminations. The general banded block-matrix solver 342 can deal with a generalized linear system with a right-hand matrix that can include a varying number of columns. Such a property can be used for the internal elimination where the right-hand matrix can include multiple junction variables. The general banded block-matrix solver 342 can be a direct serial banded block-matrix solver. In some cases, the general banded block-matrix solver 342 uses an inverted LU-decomposition, rather than direct inversion of a matrix so that the computational efficiency can be improved. The general banded block-matrix solver 342 can be used to simulate a connected fracture network. In a connected fracture network, a coefficient matrix can include banded portions and off-band portions. The general banded block-matrix solver 342 can be used to solve the banded portion while using, for example, the off-band element manager 345 to manage the off-band portions. The off-band element manager can implement, for example, a bookkeeping algorithm to manage sparse entries in a matrix. Example techniques and features of the general banded block-matrix solver 342 are described with respect to FIGS. 11-14.

In some implementations, different types of solvers can be chosen for different subsystem models depending on the governing equations associated with each subsystem model. For example, since discretization of the governing equations associated with the wellbore subsystem models 335, fracture subsystem models 336, and reservoir subsystem models 338 can result in band matrices, band matrix solvers can be selected for these subsystem models. The band matrix solvers can include serial solvers, (e.g., the serial general banded block-matrix solver 342), parallel solvers (e.g., the two-thread matrix solver 344 and the multi-thread matrix solver 346), or other solvers. For instance, the two-thread matrix solver 344 can be operable to implement an example two-thread parallel algorithm described with respect to FIGS. 19-20 that involves solving a band matrix from two directions in parallel. The multi-thread matrix solver 346 can be operable to implement example multi-thread techniques described with respect to FIGS. 22-26 that involve a band matrix in a hierarchical manner. Additional or different algorithms that use two or more threads can be used in the two-thread matrix solver 344 and the multi-thread matrix solver 346.

In some implementations, the sparse matrix solver 348 can be used, for example, to solve junction models derived from internal eliminations of other subsystem models, or any other sparse matrices during the simulation of the fluid flow in a subterranean region.

The analysis system 360 can include any systems, components, or modules that analyze, process, use, or access the simulation data generated by the fluid flow simulation system 330. For example, the analysis system 360 can include a real-time analysis system that displays or otherwise presents fluid data (e.g., to a field engineer, etc.) during an injection treatment. For instance, the analysis system 360 may display simulated fluid flow data in a manner similar to FIGS. 10A-D, or in another manner. In some cases, the analysis system 360 includes other simulators or a simulation manager that uses the fluid simulation data to simulate other aspects of a well system. For example, the analysis system 360 can be a fracture simulation suite that simulates fracture propagation based on the simulated fluid flow data generated by the fluid flow simulation system 330. As another example, the analysis system 360 can be a reservoir simulation suite that simulates fluid migration in a reservoir based on the simulated fluid flow data generated by the fluid flow simulation system 330.

The example architecture 300 can perform a simulation of time-dependent, multi-phase flows under solid-fluid interaction. In some instances, computational geometry involved in flow simulations changes during the simulation, for example, in response to the solid-fluid interactions. The architecture 300 can provide an efficient computational approach to simulate the fluid flow, for example, by strategically dividing simulation of an entire fracture network into multiple subsystem models while maintaining their interactions via joint models and by efficiently solving each subsystem model (e.g., solving a band matrix through multiple threads). The architecture 300 can keep a low overall computational resources requirement. The technique can be applied to other types of flow in other environments.

Figure 4:
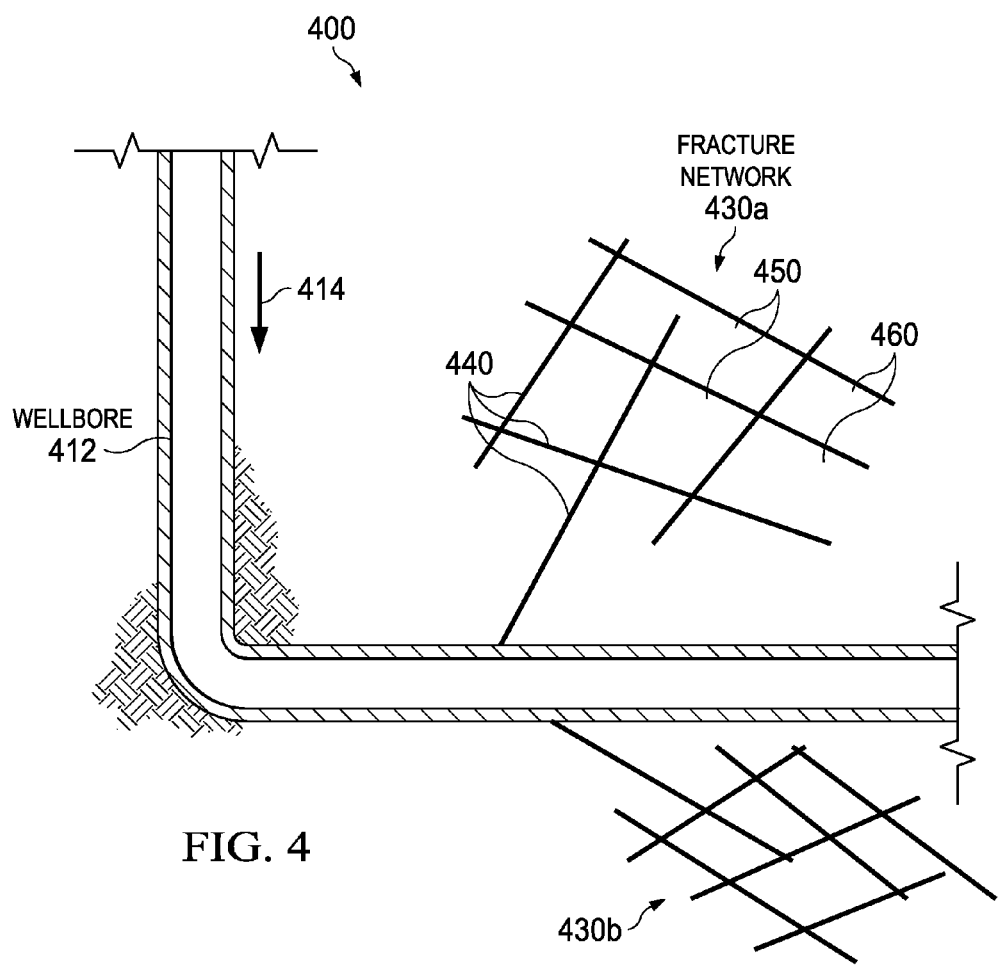
FIG. 4 is a diagram showing aspects of an example subterranean region.

FIG. 4 is a diagram showing aspects of an example subterranean region 400. The example subterranean region 400 includes a wellbore 412 and two example fracture networks 430a and 430b. During an injection treatment, treatment fluids can flow within the wellbore 412, for example, along the direction of the arrow 414. The high pressure pumping fluids can induce hydraulic fractures (e.g., fractures 440) among rock blocks (e.g., rock blocks 450) and create the fracture networks 430a, 430b in reservoirs 460. The pumping fluids can further extend into the fractures 440 and may be subject to solid-fluid interactions between rock blocks 450.

Sometimes the injected fluids are laden with solid particles known as proppant. For example, proppant may be used to keep fractures open during a flow-back phase following stimulation. In some instances, the fractures can range in size from a few meters to hundreds of meters, while the number of fractures can extend to thousands of fractures in one play. Moreover, the induced fractures can interact with the natural fractures, leading to a complex fracture network structure and a general network graph. The configuration of the fracture network may also change dynamically in time. These physical characteristics of the fracture network can make computational simulation of the fluid flow more complicated, with high computational complexity. In some implementations, to simulate the hydraulic fracturing process, basic computational blocks that make up the simulation problem can be identified. The basic computational blocks can form a computational geometry corresponding to the physical geometry of a subterranean region. In some instances, the computational blocks can be identified based on the distinct physical processes and not necessarily depend on the actual geometrical location. In some instances, a computational block can be referred to as a subsystem model that represents the physical process of the fluid flow associated with a sub-region of the subterranean region.

Figure 5:
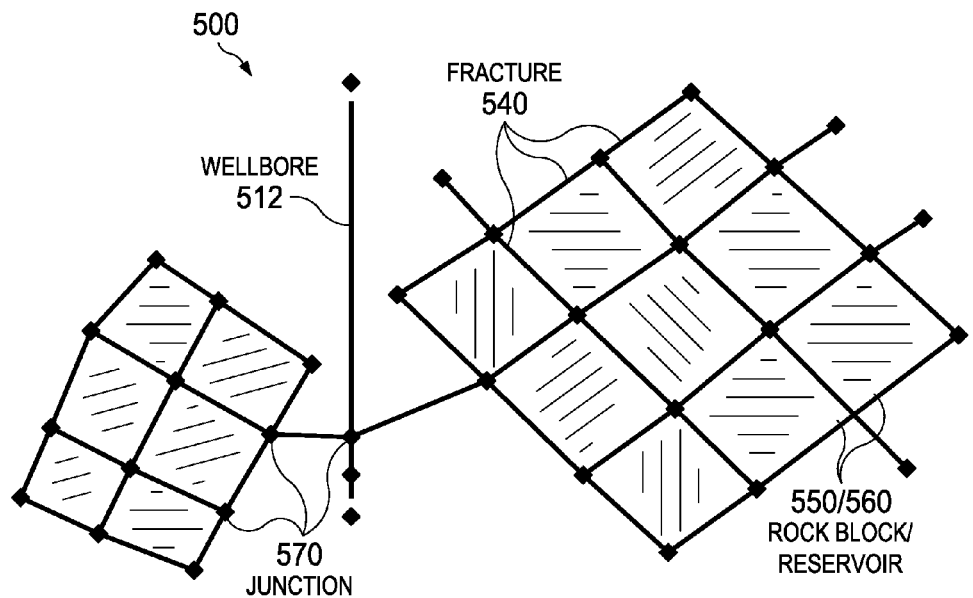
FIG. 5 is a diagram showing aspects of an example computational model of the example subterranean region 400 shown in FIG. 4.

FIG. 5 is a diagram showing aspects of example computational geometry 500 based on the physical geometry of the example subterranean region 400 of FIG. 4. The example computational geometry 500 includes a wellbore subsystem model 512, fracture subsystem models 540, rock block subsystem models 550, reservoir subsystem models 560, and junction models 570. A computational geometry can include additional or different types of subsystem models. The multiple fracture subsystem models 540, rock-block subsystem models 550 and reservoir subsystem models 560 can represent fluid flow within or otherwise associated with the multiple fractures 440, rock blocks 450, and reservoirs 460 in FIG. 4, respectively. The junction models 570 can represent the interactions among the subsystem models. In some instances, the rock-block subsystem models 550 and the reservoir subsystem models 560 physically overlap but can be represented as separate subsystem models to capture their respective associated physics. For instance, such representations can separate the fluid dynamics from solid dynamics, allowing for implementation of different modeling approaches to each regime.

Among the five example types of subsystem models shown, the wellbore subsystem model 512, fracture subsystem models 540 and reservoir subsystem models 560 can represent the fluid domain. In some implementations, the fluid-domain subsystem models can include different governing flow equations and can carry different numbers of fluid variables. For example, in some cases, proppant concentration equations and variables representing proppant concentration do not appear in the reservoir subsystem model 560, but are incorporated in the other fluid domains (e.g., in the wellbore subsystem model 512 and fracture subsystem model 540). Among the three example types of fluid-domain subsystem models shown in this example, in some instances, only the fracture subsystem model 540 is involved in the solid-fluid interactions. To incorporate such interaction, the fracture subsystem model 540 may involve extra computations compared with the wellbore subsystem model 512 and reservoir subsystem model 560. In some cases, the fracture subsystem model 540 can be the only subsystem model that has direct coupling with all the other subsystem models (e.g., with the wellbore subsystem model 512, rock-block subsystem model 550, and reservoir subsystem model 560).

In some instances, the rock-block subsystem models 550 may carry only the governing equations pertaining to the solid dynamics and take part in the solid-fluid interaction with the fracture subsystem models 540. For example, the rock-block subsystem models 550 can compute displacements resulting from the action of fluid pressure from the fracture and the rock-rock interactions. The displacements can affect the net cross-section area for the flow in the fracture subsystem models 540.

The junction models 570 do not necessarily represent physical junctions or physical subsystems in the subterranean region. In some cases, the junction models 570 would not necessarily appear in a fully coupled two-dimensional or three-dimensional simulation, but it comes into existence, for example, when low spatial dimensions are selected to perform the simulation in a fracture subsystem model 540. The junction model 570 can be included to capture the physics that are not represented by the subsystem model. The junction models 570 can be utilized to enforce conditions, for example, boundary conditions at the domain extremities. One purpose of the junction models 570 is to provide continuity between disconnected entities through connection conditions. Therefore, the junction model 570 can in some instances ensure that the global system resulting from combination of the discretization of the governing equations associated with all the subsystem models is a "closed" system.

The connection conditions that a junction model 570 imposes can be based on the fluid domains it connects. For example, when connecting the wellbore to the fracture, the junction model 570 can enforce connection conditions that mimic the characteristics of a perforation point. As another example, when the junction connects thin cross-section fractures, the connection condition may imitate Darcy flow. Thus, the existence of junction model 570 can provide flexibility in terms of the choices of the governing equations in the fluid domains, or another domain. For example, it is possible (and may be desirable) in the wellbore subsystem models 512 and fracture subsystem models 540 to use the Navier-Stoke equation for the wellbore and fractures with a large cross-sectional area (for example, typically around the perforation points), and Darcy or Reynolds type of simplified non-linear governing equations for fractures with thin cross-sectional area. Additional or different types of governing equations can be chosen by the subsystem models.

In some instances, a one-dimensional representation of the computational geometry can be generated and stored in a compact form as a graph. For example, the fractures and the wellbore subsystem models can form the links, and the junction models can form the vertices in the graph. The degree (number of links) of a vertex can determine the role of the junction model. If the degree associated with a junction model is one, then the junction model may enforce the boundary conditions; otherwise, the junction model can enforce the connection conditions. In some instances, the links and the vertices together can determine rock-block subsystem models and reservoir subsystem models. In this manner, the subsystem models can be identified and represented efficiently.

As an example, a rock block or reservoir subsystem model may be determined to be formed by a "closed loop" that cannot be further divided into smaller loops. For instance, a rock-block subsystem model 550 or a reservoir subsystem model 560 in FIG. 5 can represent the entity bounded by four links formed by the fracture subsystem models 540. The rock-block subsystem models and reservoir subsystem models can be defined in another manner. In some instances, all or some of the subsystem models can be represented in an additional or different manner, for example, in a tree, table, or another structure.

In some instances, the decomposition and representation of the subsystem models can help object-oriented programming. For example, a solver with parallelization can be used to compute the multiple subsystem models in parallel and to exploit shared-memory and distributed-memory architecture hardware. Additional or different advantages and benefits can be achieved.

The governing equations are, in general, non-linear in nature. Hence, an appropriate linearization approach, e.g., the Newton-Raphson method or quasi-linearization of the non-linear terms, can be taken to obtain a linear system at each iteration. In some cases, due to the large size and sparsity of the global coefficient matrix, or due to the complexity of highly irregular fracture networks and the strong solid-fluid interactions that are typically associated with the hydraulic fracturing process, a large global coefficient matrix representing all subsystems cannot be solved efficiently.

The junction models can help simplify the computational process. The individual components (e.g., subsystem models) can perform internal elimination for the governing equations associated with them, and obtain relations for the respective internal variables in terms of the junction variables. In addition to the simplification of the solution procedure, there are many advantages of the internal elimination step of the example technique. First, for the fluid domains subsystem models (e.g., the wellbore, fracture, and reservoir subsystem models), the discretization of the governing equations can result in a low-bandwidth matrix that can be solved efficiently, for example, through an appropriate block Gaussian elimination that exploits the structure of the matrix. For instance, block tri-diagonal solvers can be used to solve tri-diagonal matrices that arise (e.g., in first-order finite difference discretizations of differential equations in one spatial dimension). The Cholesky decomposition, for example, is another option to solve symmetric positive definite matrices. Additional or different techniques can be used to perform internal elimination of the subsystem models. The choice of the solver or technique for internal elimination can be made according to the subsystem models involved. Also, since these internal elimination operations are independent of each other, they can be performed efficiently in parallel, resulting in significant improvement in the cost of computation (e.g., both in terms of the memory and the computational time). Additional or different advantages may be achieved.

Once the internal elimination operations are performed, the relations for the internal variables of a subsystem model can be represented or otherwise expressed in terms of the junction variables of the junction models. For example, the junction equations that arise due to the connection conditions and the solid-fluid interactions can then be solved. In some instances, the junction equations of the junction models can be a reduced system that is relatively small in size and can be efficiently solved, for example, using sparse solvers. In some instances, the reduced system is represented by a sparse matrix, such as in the case of the Reynolds approximation, when matrix entries are non-zero only if the variables corresponding to the row and column are associated with the same junction or with two junctions sharing a common fracture or rock block. When the reduced junction matrix is sparse, the bandwidth of the matrix and its inverse can be reduced, for example, effectively by approaches such as nested-dissection ordering or the Cuthill-McKee algorithm. In some cases, the junction models can be represented and solved in another manner.

Figure 6:
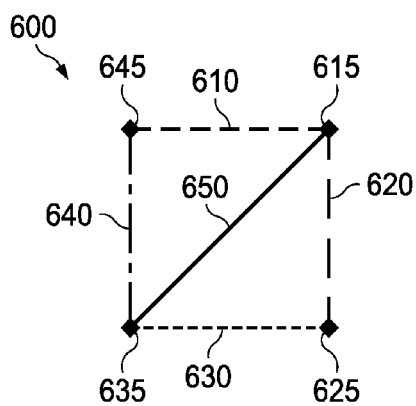
FIG. 6 is a diagram showing an example fracture network.

FIG. 6 is a diagram showing example computational geometry of a subterranean network 600. For the purpose of the illustration, solid-blocks (e.g., rock blocks) are ignored and only fluid dynamics are considered in this example. The example computational geometry includes five links 610, 620, 630, 640, and 650 and four vertices 615, 625, 635, and 645. The links 610-650 can represent one or more of a fracture subsystem or a wellbore subsystem. The vertices 615, 625, 635, and 645 can represent junction models of the connected links. A subterranean network can include additional or different links, vertices, or other components.

Figure 7:
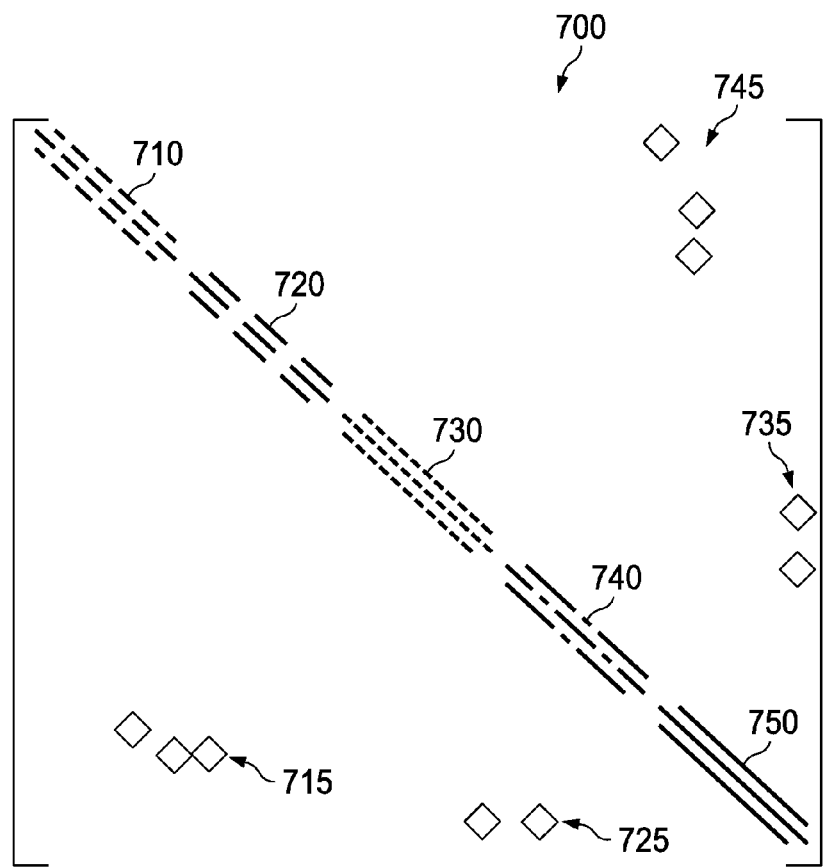
FIG. 7 is a diagram showing an example global coefficient matrix for the fracture network 600 shown in FIG. 6.

FIG. 7 is a diagram showing an example global coefficient matrix 700 based on the example subterranean network of FIG. 6. The example global coefficient matrix 700 can be a large sparse matrix. As illustrated, the example global coefficient matrix 700 includes five banded blocks 710, 720, 730, 740, and 750 along the diagonal and multiple off-band blocks 715, 725, 735, and 745. The five banded blocks 710-750 can correspond to the five links 610-650 that represent one or more wellbore and fracture subsystem models in FIG. 6, respectively. The off-band blocks 715-745 can be associated with the vertices 615-645 that represent the junction models in FIG. 6. In some instances, each of the banded blocks 710-750 can be of a large dimension. In some implementations, the global coefficient matrix 700 can include additional or different elements. The memory requirement to hold the global system can be large, for example, when the global coefficient matrix 700 has to be explicitly constructed.

Figure 8:
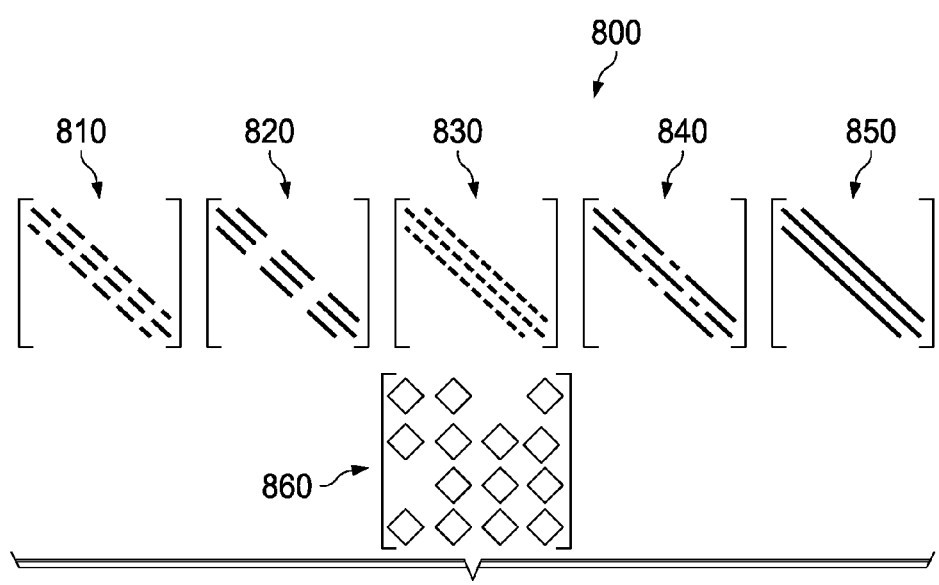
FIG. 8 is a diagram illustrating aspects of an example approach for simulating the fracture network 600 in FIG. 6.

FIG. 8 is a diagram 800 illustrating aspects of an example technique for simulating fluid flow in the example subterranean network in FIG. 6. The example technique can be based on the example computational geometry shown in FIG. 6. For example, in a first step, an internal elimination operation can be performed for each of the subsystem models 810-850 corresponding to the links 610-650 in the example subterranean network geometry 600, respectively. In some instances, since these operations are independent of each other, they can be done in parallel. Also, once the elimination operation is performed for a subsystem model (e.g., a fracture or wellbore subsystem model), the memory can be released so that it can be utilized for the internal elimination of other subsystem models. As such, the implementation can be efficient in terms of computational resources. Once internal eliminations of the multiple subsystem models are performed, a junction system 860 can be solved. The junction system 860 can, for example, include multiple junction models 615, 625, 635, and 645 in FIG. 6. In some implementations, the junction system can be expressed in a small sparse matrix as shown in FIG. 8, and solved by a sparse solver. The junction system 860 can include additional or different elements or may be represented and solved in another manner.

In some implementations, the internal elimination process can also be utilized to represent the interactions among subsystems in the subterranean region. For example, the internal elimination can be performed for simulating fluid leak-off, flow-back, or both between the reservoir subsystem models and the fracture subsystem models. In some implementations, the internal eliminations can be performed on the reservoir subsystem models first and then on the fracture subsystem models. For example, the internal variables of the reservoir subsystem model can be expressed in terms of the internal variables of the fracture subsystem models; and the latter can then be expressed in terms of the junction variables of the junction models. In some instances, the size and structure of the junction sparse matrix of the junction system (e.g., the junction system 860) can still remain the same even under this hierarchical elimination process (e.g., by performing the internal elimination of the reservoir subsystem models first and then the fracture subsystem models). In some implementations, part or all of the internal elimination operations at 810-850 (e.g., those occurring in the wellbore, fracture and the reservoir subsystem models) can be performed in parallel, independently of each other. In some implementations, part or all of the internal elimination operations at 810-850 can be performed sequentially, for example, depending on available computing resources or other factors.

Figure 9:
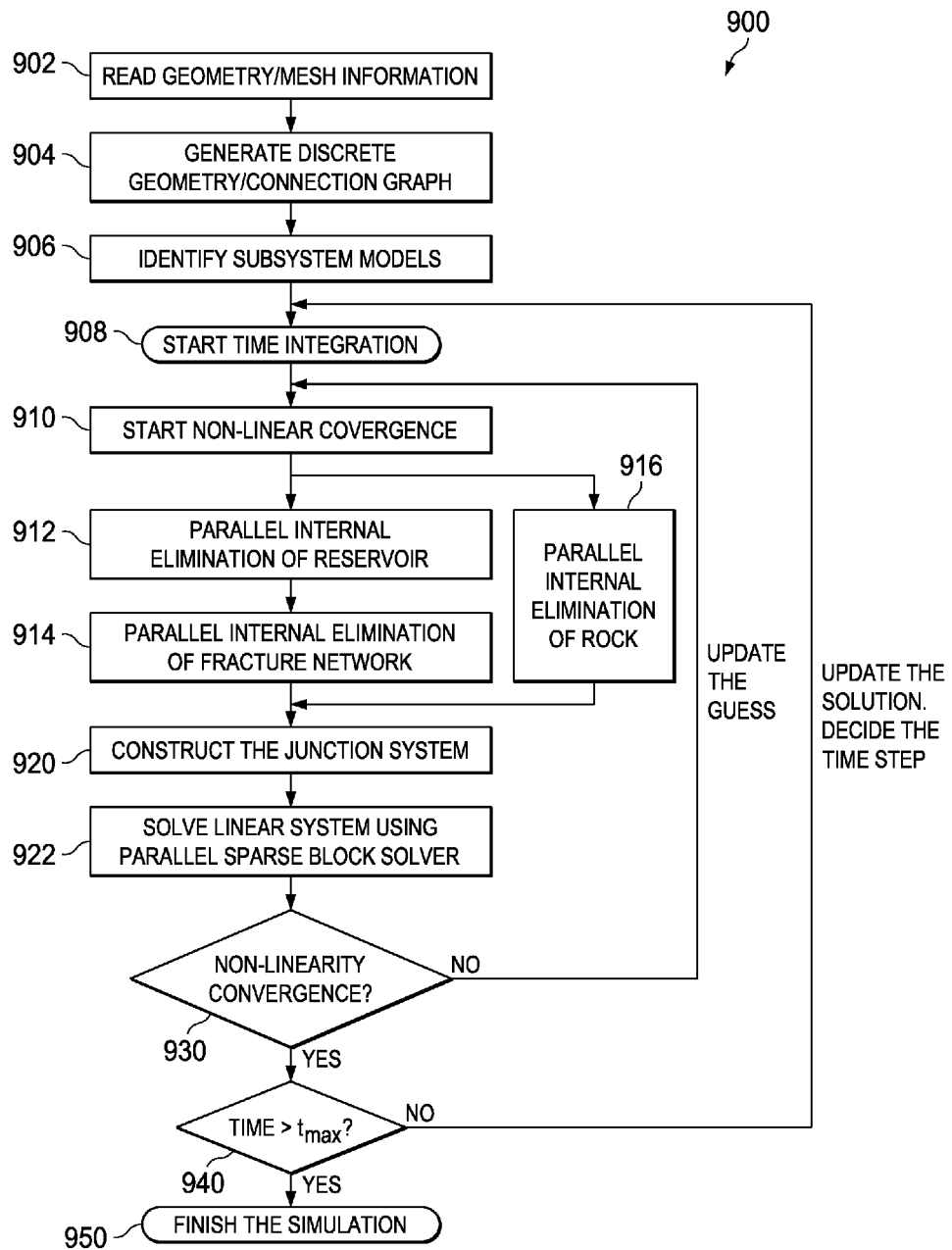
FIG. 9 is a flow chart showing an example technique for modeling fluid flow in a subterranean region.

FIG. 9 is a flow chart showing an example process 900 for modeling fluid flow in a subterranean region. For example, the example process 900 can be used to simulate fluid flow in the example subterranean network in FIG. 6. All or part of the example process 900 may be computer-implemented, for example, using the features and attributes of the example computing system 200, 201 shown in FIGS. 2A, 2B or other computing systems. The process 900, individual operations of the process 900, or groups of operations may be iterated or performed in parallel, in series, or in another manner. In some cases, the process 900 may include the same, additional, fewer, or different operations performed in the same or a different order.

The example process 900 can be used to simulate fluid flow in a variety of physical systems. In some implementations, the process 900 is used to simulate flow in a fluid injection or production system (e.g., in a wellbore, in a flow control device or flow conduit installed in a wellbore, etc.), within a subterranean formation (e.g., from a wellbore into reservoir media, through a rock matrix in the reservoir media, through fractures or discontinuities in the reservoir media, etc.), or combinations thereof. For example, the process 900 can be used to simulate the example fracture networks shown in FIGS. 5 and 6, or another type of flow model. The process 900 may also be used to simulate flow in other environments, for example, outside the context of a well system. In some cases, some or all of the operations in the example process 900 can be implemented by a direct solver in a fluid flow simulation system.

The example process 900 can be used to simulate the flow of various fluids. In some cases, the process 900 is used to simulate one or more well system fluids. Here, the term "well system fluid" is used broadly to encompass a wide variety of fluids that may be found in or near, or may be used in connection with, a well system. Well system fluids can include one or more native fluids that reside in a subterranean region (e.g., brine, oil, natural gas, etc.), one or more fluids that have been or will be injected into a subterranean region (e.g., fracturing fluids, treatment fluids, etc.), one or more fluids that have been or will be communicated within a wellbore or within one or more tools installed in the well bore (e.g., drilling fluids, hydraulic fluids, etc.), and other types of fluids.

In some implementations, some or all of the operations in the process 900 are executed in real time during a treatment or another type of well system activity. An operation can be performed in real time, for example, by performing the operation in response to receiving data (e.g., from a sensor or monitoring system) without substantial delay. Also, an operation can be performed in real time by performing the operation while monitoring for additional data (e.g., from a treatment or other activities). Some real time operations can receive an input and produce an output during a treatment; in some instances, the output is made available to a user within a time frame that allows the user to respond to the output, for example, by modifying the treatment.

At 902, geometry or mesh information of a subterranean region (e.g., the subterranean region 104 in FIG. 1) can be read or otherwise obtained. The geometry or mesh information can be the physical geometry information of the subterranean region. The physical geometry information can include, for example, location, orientation, size, shape, or any other information related to one or more wellbores, fractures, rock blocks, reservoirs, or other components in the subterranean region. For example, the geometry or mesh information can be represented in a graph such as the example physical geometry 400 in FIG. 4, in a table, as separated data items, or in another form. The physical geometry information can be stored in the memory of a computing system (e.g., the computing system 201, 202 in FIGS. 2A, 2B), accessed by one or more processors (e.g., the processor or processors 260, 216-246 in FIGS. 2A, 2B) of a computing system, or obtained in another manner.

At 904, a discrete geometry or connection graph can be generated or otherwise identified based on the geometry information obtained at 902. The discrete geometry or connection graph can include computation geometry based on the physical geometry of the subterranean region. For example, the discrete geometry or connection graph can be the example computational geometry 500, 600 in FIGS. 5 and 6, respectively, or another computational geometry of a subterranean region. In some implementations, the discrete geometry or connection graph can be generated or otherwise identified according to the example techniques described with respect to FIGS. 4 and 5 or in another manner. The discrete geometry or connection graph can include multiple subsystem models that form the computation blocks of an overall simulation system. In some instances, the discrete geometry or connection graph can include subsystem models that correspond to one or more components of the physical geometry of the subterranean region. In some instances, the discrete geometry or connection graph can include additional or different subsystem models such as those that do not physically exist in the physical geometry.

At 906, subsystem models can be identified. In some instances, the subsystem models can be identified based on the discrete geometry or connection graph, or in another manner. In some implementations, the subsystem models can represent distinct subsystems within a subterranean region. Each subsystem model may include fluid flow variables and represent well system fluid flow dynamics associated with a sub-region in the subterranean region. For example, the subsystem model can include one or more wellbore subsystem models, fracture subsystem models, rock-block subsystem models, reservoir subsystem models, or additional or different models. As an example, a fracture subsystem model can be used to represent a fracture segment in a fracture network in the subterranean region, and then the overall simulation system may include multiple fracture subsystem models. In some instances, different subsystem models can be used to represent different physical processes associated with a same sub-region. For example, a reservoir subsystem model can be used to represent fluid dynamics while a rock-block subsystem model can be used to present solid dynamics associated with the fluid flow in a common sub-region of the subterranean region. Additional or different subsystem models can be used to capture the physics associated with well fluid flow in the subterranean region. For instance, the overall simulation system can also include junction models that represent the connections or other interactions among the subsystem models. The junction models can provide boundary conditions, connection conditions or other conditions of the overall simulation system. In some implementations, each of the subsystem models can include one or more governing equations. For example, the fluid-domain subsystem models (e.g., the fracture, wellbore, and reservoir subsystem models) can have a set of governing flow equations and one or more fluid flow variables. The rock-block subsystem model can include governing equations that capture the solid-fluid interactions. In some implementations, identifying the subsystem models includes identifying the governing equations (e.g., including the associated variables and coefficients) of each of the subsystem models.

At 908, time integration is started. The example process 900 can simulate fluid flow in a temporal domain and simulate a time-dependent fluid flow. The example process 900 can simulate the fluid flow for an individual time step or multiple time steps. As an example, the process 900 can start with a time step $t_{min}$ and march until another time step $t_{max}$. The starting and ending time steps $t_{min}$ and $t_{max}$ can be predetermined or otherwise specified as appropriate. At 908, a specific time step can be identified. For each time step, the overall simulation system including multiple subsystem models can be constructed based on dynamics of the fluid flow related to the considered time step. A solution to the overall simulation system can be partially or fully obtained or updated at the considered time step, for example, using the example techniques described with respect to operations 910-930, or in another manner. In some instances, the simulation of the time-dependent fluid flow can be performed in real time. For example, the fluid flow can be analyzed, displayed, or otherwise represented (e.g., to a field engineer, etc.) in real time during an injection treatment.

At 910, non-linear convergence can be started. In some implementations, starting the non-linear convergence can include choosing an initial guess as the starting point to solve the multiple subsystem models. In some instances, one or more governing equations of the subsystem models can be non-linear. For instance, some subsystem models can include non-linear systems of differential or partial differential equations. Linearization can be performed to linearize the non-linear governing equations. Example linearization methods include Newton-Raphson method, quasi-linearization, etc. Additional or different linearization methods can be used. In some implementations, the linearization can be performed individually and result in a system of linear equations for each subsystem model.

The multiple subsystem models can be solved in a sequential, parallel, or hybrid manner. As an example, solving the subsystem models can involve performing internal eliminations on the subsystem models. In some instances, an internal elimination can be performed on each subsystem model to obtain the relations of the internal variables of the subsystem model in terms of junction variables of one or more junction models, or internal variables of another subsystem model. In some implementations, an internal elimination of one subsystem model can be performed substantially independently of another subsystem model. In this case, the internal eliminations can be performed in parallel between the subsystem models. In some other implementations, an internal elimination of one subsystem model can be performed based on another subsystem model. In this case, the internal eliminations may be performed sequentially. An example technique to solve the multiple subsystem models is described below with respect to operations 913-922. The multiple subsystem models can be solved in a different manner.

At 912, internal eliminations of one or more reservoir subsystem models can be performed. In some instances, multiple reservoir subsystem models can represent distinct fluid dynamics of the fluid flow in the reservoirs. In some implementations, the internal eliminations can be performed in parallel among the multiple reservoir subsystem models. In some instances, the internal eliminations can be performed in parallel with operations performed on other subsystem models (e.g., rock-block subsystem models, wellbore subsystem models, etc.). In the illustrated example, the reservoir subsystem models are coupled to the fracture subsystem models, for example, in the cases of the fluid leak-off and flow-back. The internal eliminations can be performed to express the internal variables of the reservoir subsystem model in terms of internal variables of one or more fracture subsystem models. In some implementations, the internal eliminations can be performed to express the internal variables of the reservoir subsystem models in terms of one or more junction variables of the junction models.

At 914, internal elimination of one or more fracture subsystem models can be performed. In some instances, since multiple fracture subsystem models can represent distinct fluid flow dynamics within multiple fracture segments, the internal eliminations can be performed in parallel among the multiple fracture subsystem models. In some implementations, the internal eliminations can be performed in parallel with operations performed on other subsystem models (e.g., rock-block subsystem models, wellbore subsystem models, etc.). The internal elimination can be performed to express internal variables of the fracture subsystem model in terms of junction variables of one or more junction models. In the illustrated example, the internal eliminations of the fracture subsystem model are performed after the internal eliminations of the reservoir subsystem models at 912. In some implementations, the junction models are coupled to the fracture subsystem models, which are further coupled to the reservoir subsystem models. The hierarchical implementations of the internal eliminations of the reservoir and fracture subsystem models can help capture the connectivity or other interactions among these subsystem models. In some other implementations, the internal eliminations of the fracture and reservoir subsystem models can be performed in parallel.

Although not shown in FIG. 9, internal eliminations of wellbore subsystem models can be performed in a manner substantially similar to the fracture subsystem models, or in another manner. For example, the relation for internal variables of the wellbore subsystems can be obtained via the internal eliminations. The internal eliminations of the wellbore subsystem models can be performed in parallel with the fracture, reservoir, and rock-block subsystem models, or can be performed before or after any of these.

At 916, internal elimination of one or more rock-block subsystem models can be performed. Similarly, the internal eliminations can be performed in parallel among the multiple rock-block subsystem models, or in parallel with operations performed on other subsystem models (e.g., reservoir subsystem models, fracture subsystem models, wellbore subsystem models, etc.). The internal elimination can be performed to express internal variables of the rock-block subsystem model in terms of junction variables of one or more junction models.

In some aspects, the internal eliminations of the multiple subsystem models can be implemented, for example, as a multi-thread program. The internal elimination operations can be strategically allocated or otherwise assigned to the multiple threads. For example, the multiple threads may be allocated statically or dynamically during processing depending on the computing resources and computational loads of the threads. In some aspects, the internal eliminations can be implemented, at least in part, as parallel computing; for example, using multiple processing units (e.g., in a multi-core processor or multiple processors as shown in FIGS. 2A and 2B). In some aspects, the multiple internal elimination operations can employ shared memory (e.g., memory 208), distributed memory (e.g., memory 218-248), or another memory management scheme.

In some implementations, a respective solver can be selected for each subsystem model to perform the internal elimination, for example, based on the structure or property of the subsystem, or another factor. As an example, a band matrix solver (e.g., a tri-diagonal solver, penta-diagonal solver, etc.) can be selected to perform internal elimination of a subsystem model (e.g., a wellbore, fracture, or reservoir subsystem model) that involves a tri-diagonal or penta-diagonal coefficient matrix. As another example, a general banded block-matrix solver (e.g., the example solver described with respect to FIGS. 11-14), a two-thread solver (e.g., the example solver described with respect to FIGS. 19-20) or a multi-thread solver (e.g., the example solver described with respect to FIGS. 22-26) can be selected to perform internal eliminations based on a banded block matrix with an arbitrary bandwidth. Additional or different solvers or techniques can be used for each of the subsystem models.

At 920, a junction system can be generated. The junction system 860 in FIG. 8 is an example junction system. The junction system can be generated in a similar manner as described in FIG. 8, or in another manner. In some instances, the junction system can include the one or more junction models. In some implementations, the junction system can be represented in a matrix format that includes a junction matrix. The size of the junction matrix can be much smaller, for example, than the global coefficient matrix 700 in FIG. 7. In some instances, the junction matrix can be a sparse matrix that includes multiple block matrices representing multiple joint models. The junction matrix can be a banded matrix, or another type of matrix.

At 922, the junction system can be solved. The junction system can include a system of linear equations. The junction system can be solved, for example, based on the property of the junction matrix. For instance, the junction system can be solved by a sparse block-matrix solver given a sparse junction matrix, or by a two-thread or multi-thread solver (e.g., the solvers described with respect to FIGS. 11-14 and 22-26, respectively), or another technique. In some implementations, the junction variables solved based on the junction system can be substituted back into the multiple subsystem models (e.g., the wellbore, fracture, reservoir, and rock-block subsystem models) and obtain the respective internal variables of each subsystem model. A solution to the overall simulation system can be obtained based on the solved internal variables and the junction variables.

At 930, it can be determined whether non-linearity convergence is achieved. If the non-linearity convergence is not obtained, the example process 900 can go back to 910 to start the non-linear convergence process again, for example, with an updated guess of the starting point. The starting point can be updated based on the current solution or other factors. If the non-linearity convergence is achieved, the example process 900 can proceed to 940.

At 940, it can be determined whether a maximum time step $t_{max}$ is reached. The current considered time step can be compared with $t_{max}$. If the considered time step does not exceed $t_{max}$, the example process 900 can update the solution to the overall simulation system based on the solution obtained at the currently considered time step, determine a next time step, and go back to 908 to begin a new iteration for the next time step. On the other hand, if the considered time step exceeds $t_{max}$, the example process 900 for simulating the fluid flow can be concluded at 950. In some instances, the simulation can be performed in real time during an injection treatment. The obtained solution to the overall simulation (e.g., in terms of fluid pressures, fluid densities, fluid compositions, or other variables or parameters) at each time step can be displayed, or otherwise provided (e.g., to an engineer or other operator of the well system) in real time during the injection treatment to modify, update, or otherwise manage the injection treatment based on the simulation results.

FIGS. 10A-D are plots illustrating example simulation results computed for an example subterranean region 1000. The example subterranean region 1000 includes sixteen closed rock blocks 1010, forty-two open fractures 1020, and associated junctions 1030. For simplicity, the wellbore subsystem models are not included in the illustrated example. The leftmost point 1040 is an endpoint of a fracture, which can be considered as an inlet for fluid in the fracture network. Similarly, the rightmost point 1050 is considered as an outlet. The boundary conditions for this system can be defined by specifying the pressure as a function of time at the inlet and outlet points 1040 and 1050. In some cases, the inlet pressure is proportional to time, and the outlet pressure is fixed at zero, so that fluid flows from left to right through the network. For simplicity, the solid formation outside the fracture network is considered to be fixed while the sixteen rock blocks 1010 are allowed to deform according to a linear elasticity model. In this case, the width of the fractures 1020 can be a function of time and space.

In the simulations, fluid is allowed to leak off from the fractures 1020 to the formation 1000, or flow back in the reverse direction, for example, according to a one-dimensional Darcy flow model or another model normal to the fractures 1020. The connection conditions at the junctions 1030 can include, for example, fluid pressure continuity and fluid mass continuity. Inside the fractures 1020, a Reynolds equation or another model can be used.

In the initial state of the subterranean region 1000, fluid pressure and velocity is zero everywhere (including the fractures and formation), and a positive fracture width of five centimeters is prescribed. Throughout the simulation, fluid pressure in the fractures 1020, junctions 1030, and rock blocks 1010, and fluid volume flow rate in the fractures, fracture widths, and cumulative leak-off volume at each node of the fractures are computed. In the example simulation, the internal elimination is performed using a solver that is operable to execute the example techniques described with respect to FIGS. 8, 9, and 11-26. The leak-off process is simulated based on the example techniques described for modeling fracture leak-off and flow-back in International Application No. PCT/US2013/059409 (entitled "Simulating Fluid Leak-Off and Flow-Back in a Fractured Subterranean Region" filed on Sep. 12, 2013). Additional or different techniques can be used for the internal elimination and the simulation of the leak-off process.

Figure 10A:
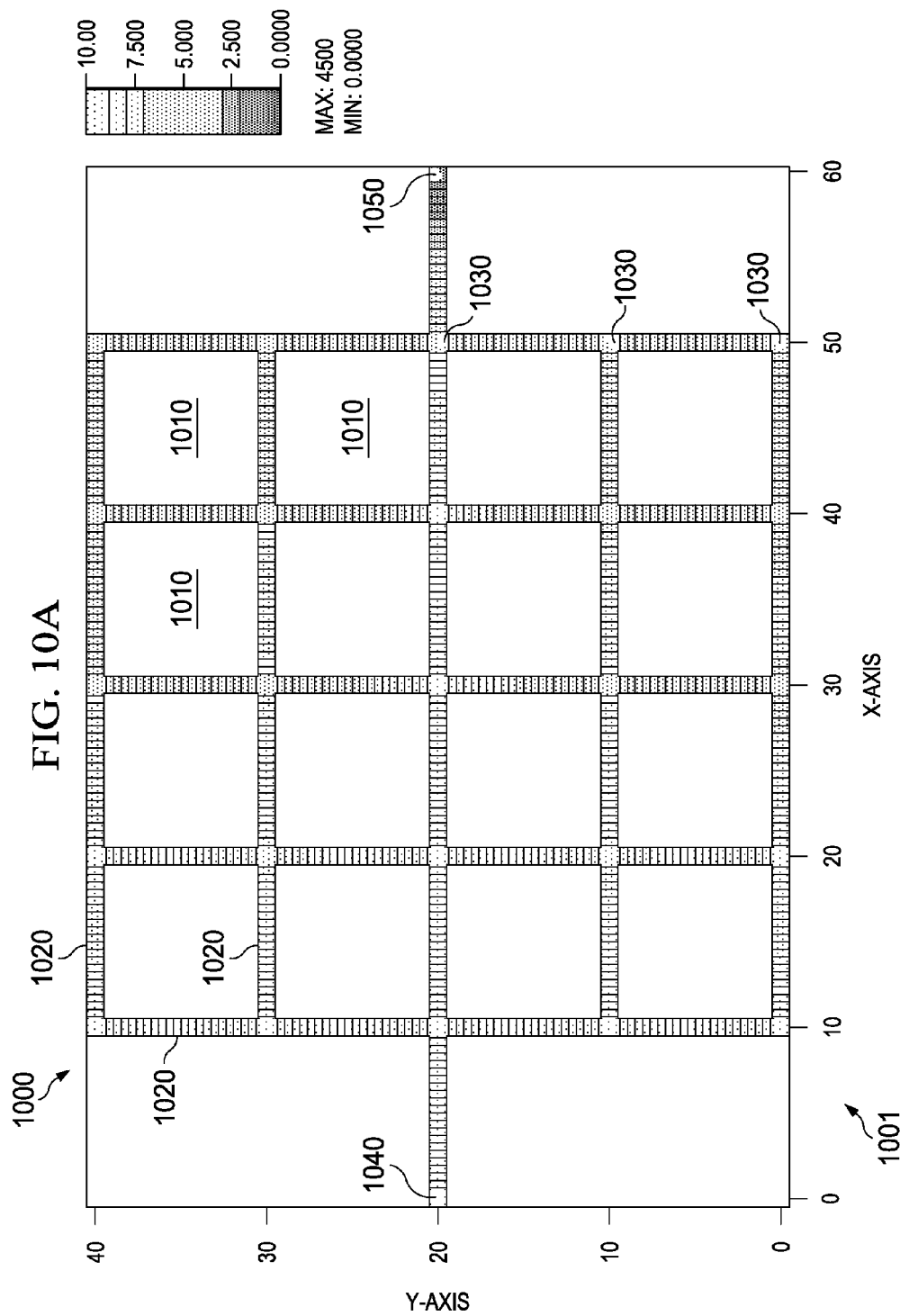
FIG. 10A is a plot showing an example snapshot of the fluid pressure in a subterranean region from example numerical simulations.
Figure 10B:
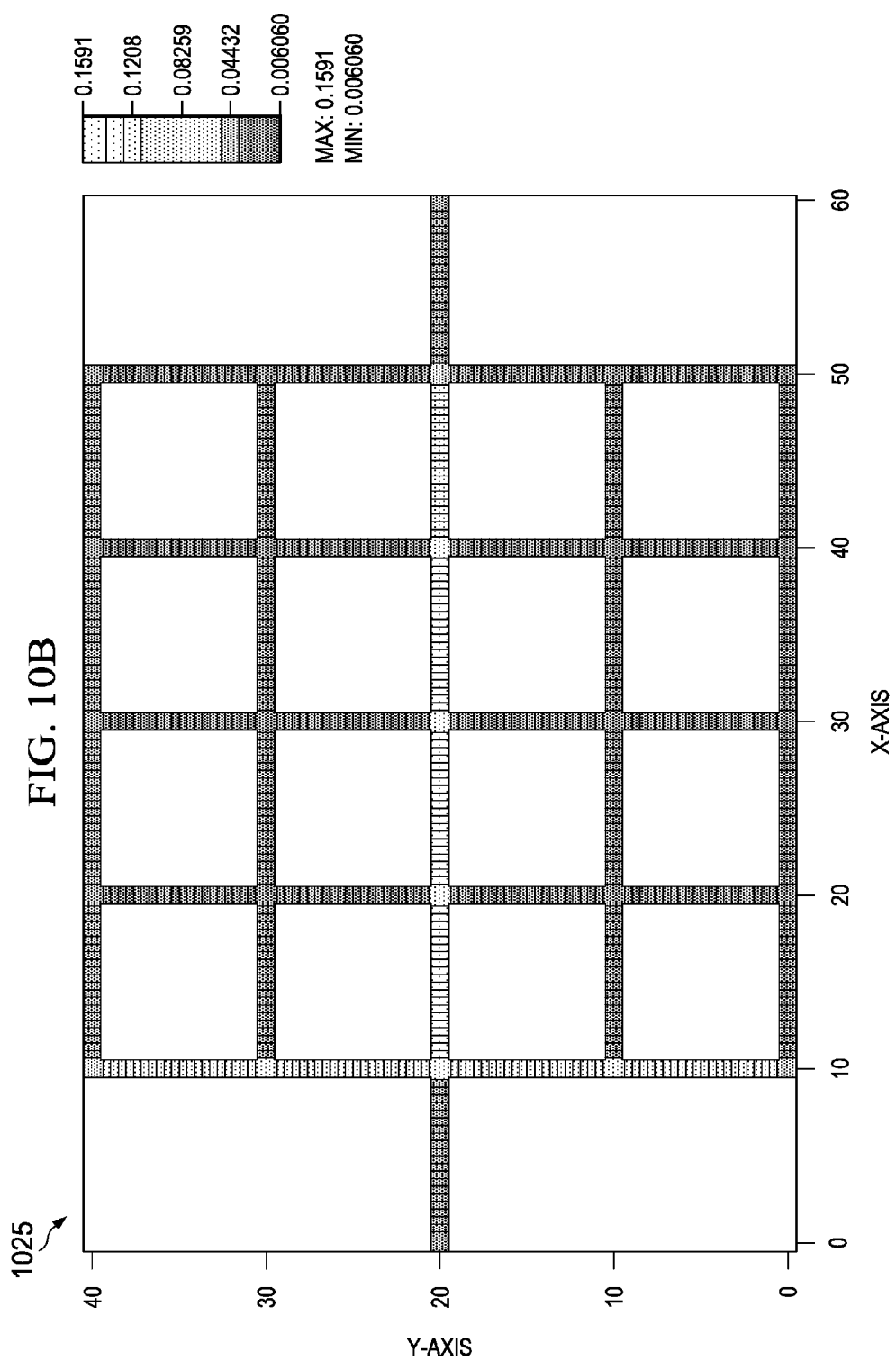
Figure 10D:
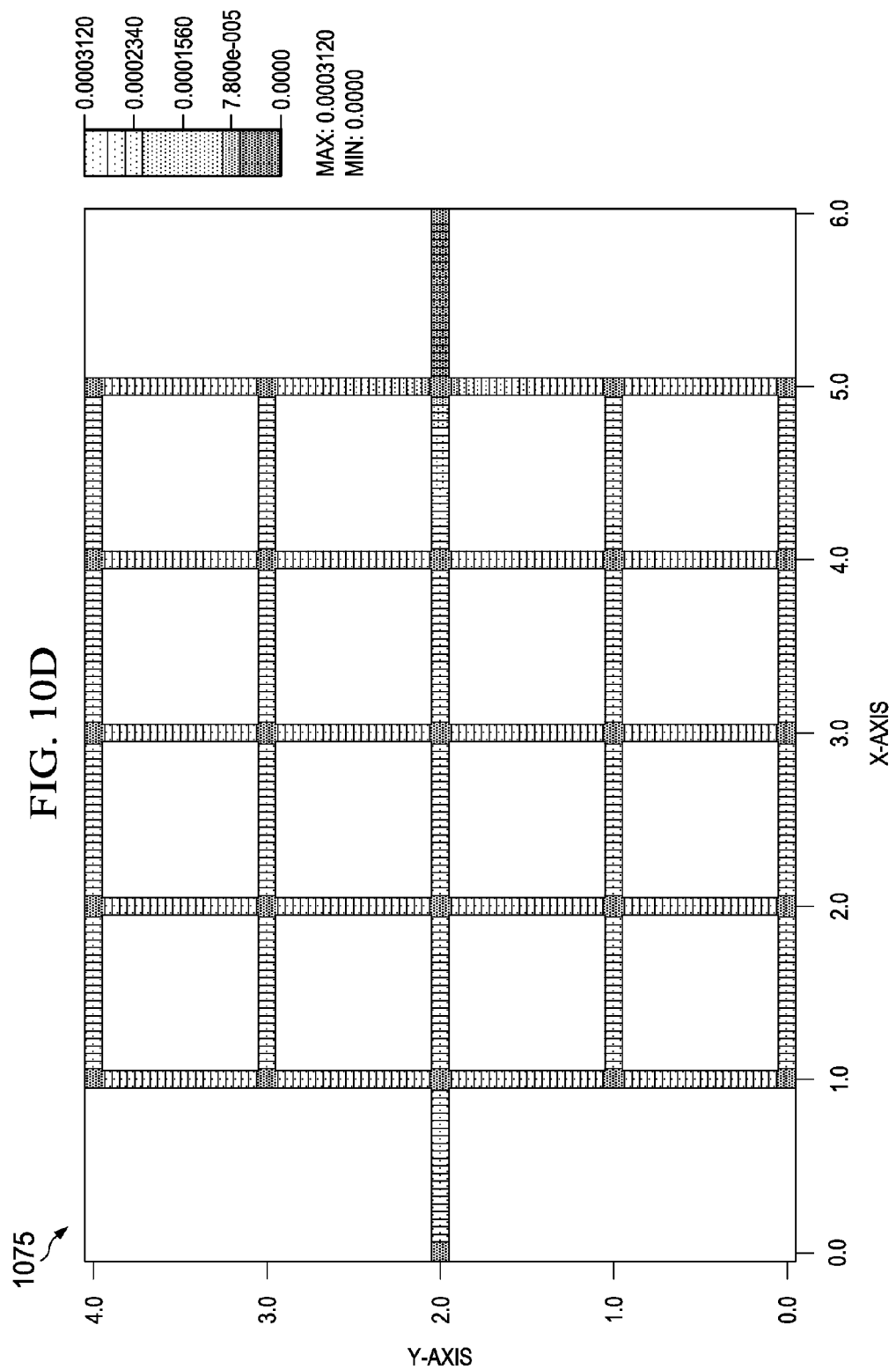
FIG. 10D is a plot showing an example snapshot of a cumulative leak-off volume from example numerical simulations.

FIG. 10A is a plot showing an example snapshot 1001 of the fluid pressure in the subterranean region 1000. The maximum value is 4500 (at the inlet 1040), but the plot shows a maximum of 10 so that more variation in the pressure can be seen across the network. FIGS. 10B and 10C are plots showing example snapshots 1025 and 1050 of the fracture width at two different times. FIG. 10D is a plot showing an example snapshot 1075 of a cumulative leak-off volume.

In some instances, numerical simulation of fluid flow in a fracture network (e.g., the fluid flow associated with a hydraulic fracturing process), can be computationally challenging due to the complex interaction of multiple coupled non-linear equations governing the flow. In some aspects, a general approach to solve the system of non-linear equations can include, for example, linearizing the system of equations using an appropriate technique (e.g., Newton's method, the quasi-linearization of the non-linear terms, etc.), constructing a global matrix solver for the resulting linear system of equations, and iteratively solving the linear system until the method converges. Constructing the discrete linear system and efficiently solving the discrete linear system play a central role in the overall success of the simulation. In some instances, in order to minimize or otherwise reduce the overall computational time, the simulation can be performed on a one-dimensional representation of the fracture network. In these cases, the discretization of the system of governing equations can form a band matrix for a single equation.

In some instances, discretization of the governing equations (e.g., using techniques such as finite difference, finite volume, etc.) can result in a wide-band sparse matrix due to the presence of multiple variables at given discrete spatial locations and the way they are numbered (for example, lexicographic ordering). To retain the compact banded structure provided by the discretization method in presence of the system of equation, in some implementations, the unknown variables at a given spatial location can be represented in a vector form. While this technique preserves the compact nature of the global coefficient matrix, it can convert the global coefficient matrix into a block matrix. The number of sub-blocks in a row can be fixed in the interior of the global matrix (e.g., can be referred to as the bandwidth) and can decrease at the ends. Since the global matrix still retains its compact banded structure, it can be solved, for example, using Gaussian elimination designed for block matrices.

Usually, a band matrix solver relies on prior knowledge of the bandwidth of the band matrix. The example techniques described herein can serve as a general banded block-matrix solver that can be applied to a banded block matrix with any bandwidth and for any size of the right-hand side matrix. A general solver can have multiple advantages. For example, a general solver can handle governing equations that have been discretized by any of the multiple different discretization algorithms or parameters that may be available for a given system. In some cases, there is no limitation on the order of accuracy that can be attained or the type of discretization that can be selected. Also, a general solver may allow dynamic adaptation of the order of accuracy during the run, e.g., in real time during the simulation. As an example, if the selected order of accuracy is deemed insufficient based on the truncation error estimate, the order can be changed on the fly without having to stop the simulation. Conversely, if the accuracy is found to be more than necessary, then the bandwidth can be reduced (e.g., to make the simulation faster). In some implementations, the general banded block-matrix solver can be used to perform the internal elimination operation of a computational fluid dynamics process, for example, for the fluid flow simulation. The general banded block-matrix solver can have additional or different applications and advantages.

Figure 11:
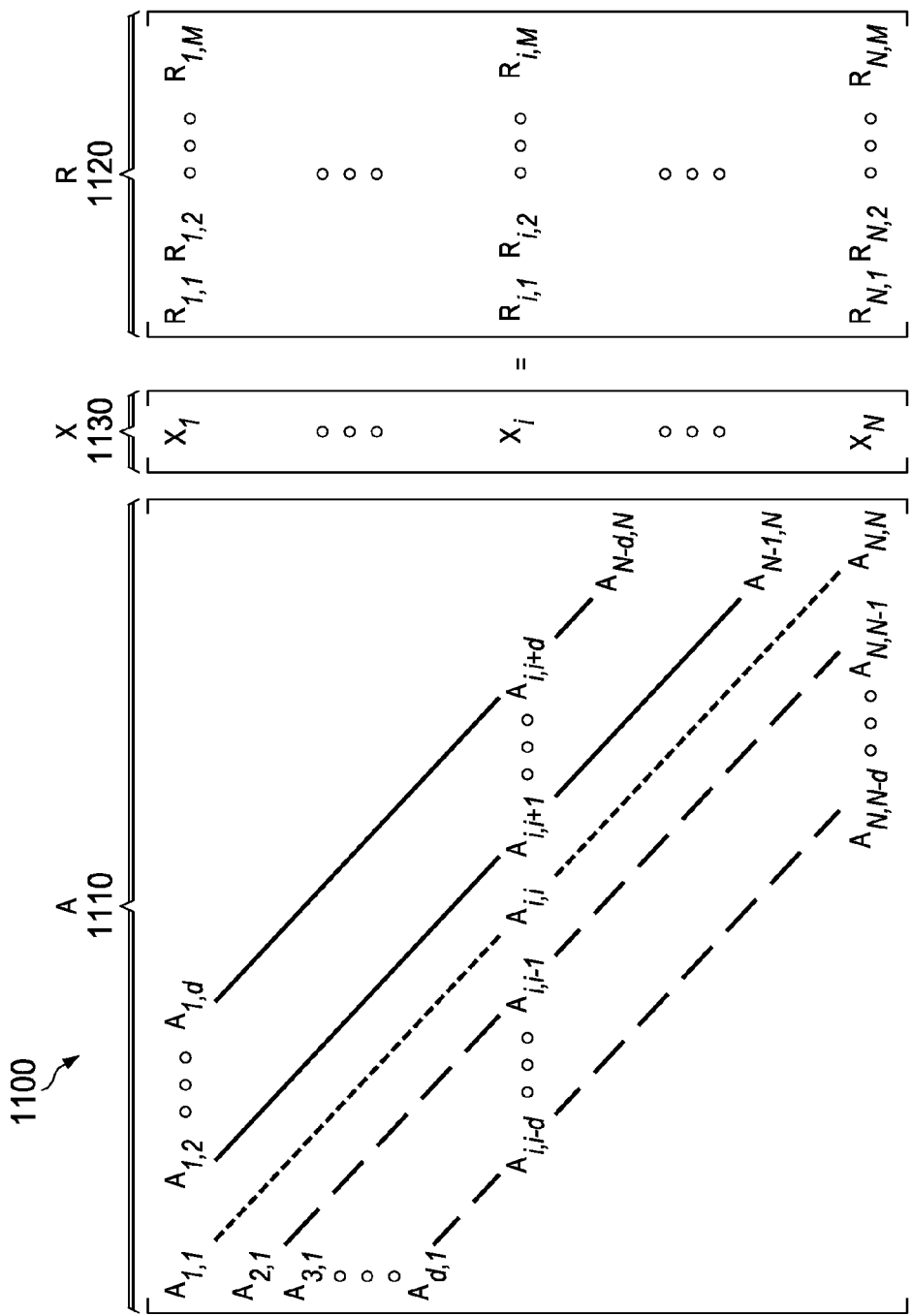
FIG. 11 is a diagram showing an example banded linear system.

FIG. 11 is a diagram representing an example general banded linear system 1100 with an example system of equations given by:

$$A x = R \qquad (1).$$

The example general banded block-matrix solver can be used to solve the example general banded linear system 1100. In some instances, the general banded block-matrix solver can also be referred to as a general banded linear system solver. In Equation (1), the global coefficient matrix A 1110 represents a banded block matrix with a bandwidth of 2d+1, where d represents the number of diagonals containing non-zero elements above and below the main diagonal. The matrix A 1110 represents an N×N block matrix with each block (i.e., each element $A_{i,j}$) being a sub-matrix of size n×n. As an example, the matrix A 1110 can include flow variable coefficients based on a set of governing flow equations of a subterranean region model that represents well system fluid flow in a subterranean region. For instance, the matrix A 1110 may be computed from the example techniques described above that involve discretization of the governing flow equations. In some instances, the matrix A 1110 can represent other types of linear systems and can be obtained from another source or based on other techniques. The variables $x = [X_1, \ldots, X_i, \ldots, X_N]^T$ can include, for example, fluid flow variables corresponding to the flow variable coefficients of the matrix A 1110. The right-hand side matrix R 1120 represents an N×M matrix with each row of elements of size n×M. The size of the elements within a row of matrix R 1120 need not be the same. For instance, the number of columns for $R_{1,1}$ can be different from that of $R_{1,2}$, etc. in FIG. 11. In some implementations, the general solver can perform Gaussian elimination to obtain the solution to the Equation (1).

Figure 12:
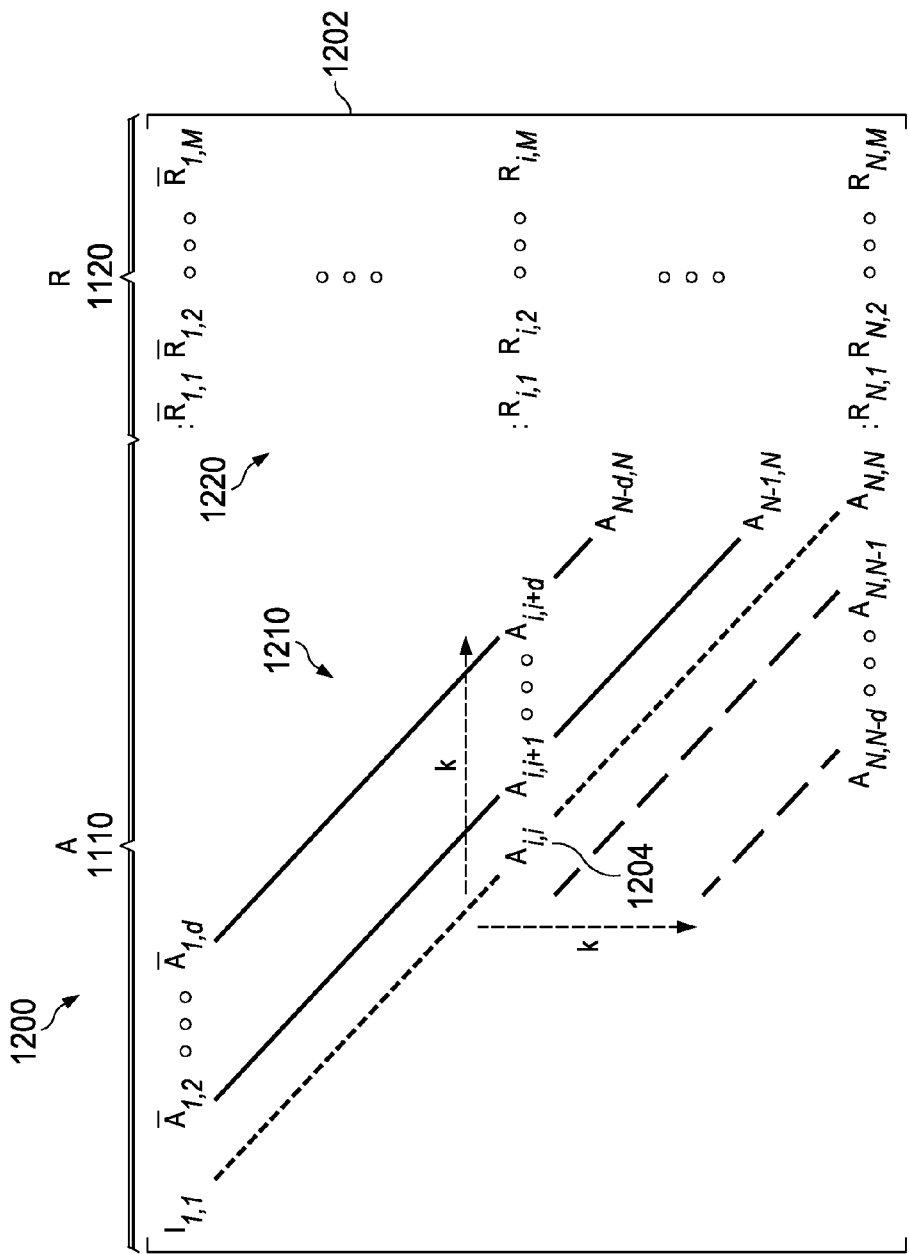
FIG. 12 is a diagram showing an example Gaussian elimination operation for the banded linear system 1100 shown in FIG. 11.

FIG. 12 is a diagram showing example Gaussian elimination operations for the general banded linear system 1100 in FIG. 11. FIG. 12 includes an augmented block matrix 1202 that can represent the general banded linear system 1100. An augmented matrix of a linear system can be obtained by appending columns of the coefficient matrix and the right-hand side matrix of the linear system. In the example shown in FIG. 12, the augmented block matrix 1202 includes a banded portion 1210 that corresponds to the global coefficient matrix A 1110, and an augmented portion 1220 that corresponds to the right-hand side matrix R 1120 of FIG. 11. Based on the augmented block matrix 1202, the general solver can include a forward elimination operation, for example, to efficiently convert the augmented block matrix 1202 into an upper triangular matrix. In some implementations, the example forward elimination technique can include N stages, wherein each stage corresponds to operations associated with a row of the block matrix 1202. For example, at the $i^{th}$ stage ($1 \le i \le N$), the diagonal element $A_{i,i}$ 1204 of the $i^{th}$ row can act as a pivot element. One approach is to invert the matrix $A_{i,i}$ 1204 and multiply the $i^{th}$ row of the augmented matrix 1202 with the inverse $A_{i,i}^{-1}$. Another approach is to compute the LU-decomposition for the matrix $A_{i,i}$ 1204, and the multiplication of the $i^{th}$ row can be replaced by solving the smaller system along the $i^{th}$ row of the augmented matrix 1202. The latter approach can be more computationally efficient since computing the LU-decomposition is computationally cheaper than obtaining the actual matrix inverse, and the cost associated with solving a linear system using the LU-decomposition along the $i^{th}$ row can be the same as or less than multiplying the $i^{th}$ row with the inverse of the matrix.

Given the LU-decomposition of the matrix $A_{i,i}$ 1204 as $A_{i,i} = L_{i,i} U_{i,i}$, in some instances, solving the smaller linear system along the $i^{th}$ row can include operating on elements along the $i^{th}$ row (e.g., $A_{i,i-d}, \ldots, A_{i,i+d}, R_{i,1}, R_{i,2}, \ldots, R_{i,M}$) based on an inverse of the decomposition of the pivot element $A_{i,i}$ 1204 (e.g., $(L_{i,i} U_{i,i})^{-1} = U_{i,i}^{-1} L_{i,i}^{-1}$). Since $L_{i,i}$ and $U_{i,i}$ are lower and upper triangular matrices respectively, their inversions require less computational complexity than inversion of the matrix $A_{i,i}$ 1204. In some implementations, the LU-decomposition $L_{i,i}$ and $U_{i,i}$, their respective inverses $L_{i,i}^{-1}$ and $U_{i,i}^{-1}$, or a combination of these and other matrices can be stored, for example, for operations on other elements in the $i^{th}$ row or for other later use. In some instances, operating on the elements along the $i^{th}$ row can include multiplying the elements along the $i^{th}$ row with the inverse of the LU-decomposition (e.g., $U_{i,i}^{-1}L_{i,i}^{-1}$) of the pivot element $A_{i,i}$ 1204. In some implementations, to further reduce the computation, the operations can be performed on other elements along the row except the pivot element $A_{i,i}$ 1204 (e.g., elements $A_{i,i-d}$, ..., $A_{i,i-1}$, $A_{i,i+1}$, ..., $A_{i,i+d}$, $R_{i,1}$, $R_{i,2}$, ..., $R_{i,M}$) because it is known that the multiplication of the pivot element $A_{i,i}$ 1204 and the inverse of its LU-decomposition (e.g., $U_{i,i}^{-1}L_{i,i}^{-1}$) results in an identity matrix I. In some instances, solving the smaller linear system along the $i^{th}$ row can include additional or different operations.

After the pivot element $A_{i,i}$ 1204 has been effectively converted to the identity matrix I, the example forward elimination technique can further eliminate the elements below the pivot element $A_{i,i}$ 1204 in the $i^{th}$ column of the augmented matrix 1202. For example, the entries in the k rows below the pivot entry 1204 can be made zero through elementary row operations. The value of k can be determined, for example, as the minimum of the bandwidth of the matrix and the difference between the current row and last row of the matrix. In some implementations, similar operations can be included during the backward substitution technique of the general solver. The example operation described here can enable efficient implementation of the Gaussian elimination for a general banded linear system with an arbitrary bandwidth and a right-hand matrix with one or more columns.

In some instances, to enhance the performance of the general banded block-matrix solver, it is desirable to have an efficient way to store the non-zero entries of the general banded linear system that can minimize or otherwise reduce cache-thrashing phenomenon. Some bandwidth-specific solvers, for example, tri-diagonal or penta-diagonal solvers, tend to store each diagonal of the matrix as a separate vector. In some instances, such an approach may not be optimal for a general banded matrix where the bandwidth is not known a priori and could change during the simulation. An example storage technique is to store each row of the array (e.g., for A and R) in row-major format. The row-major format stores the matrix elements using the row number as the first index and the column number as the second index. In this manner, elements in the same row can be stored contiguously in the memory. During the $i^{th}$ stage of the example Gaussian elimination described with respect to FIG. 12, only the values around the neighborhood of the $i^{th}$ row are used. As such, storing the non-zero entries in row-major format can lead to effective use of cache. The matrix elements (e.g., sub-blocks $A_{i,j}$, 1≤i≤N, 1≤j≤N; $R_{i,s}$, 1≤s≤M) can be internally stored in row-major format, column-major format, or another manner. In some instances, the sub-blocks can be stored in column-major format where each column of the sub-blocks can be stored contiguously. Storing the sub-blocks in the column-major format can make the coupling to FORTRAN based external packages, for example, LAPACK and BLAS, efficient.

Figure 13:
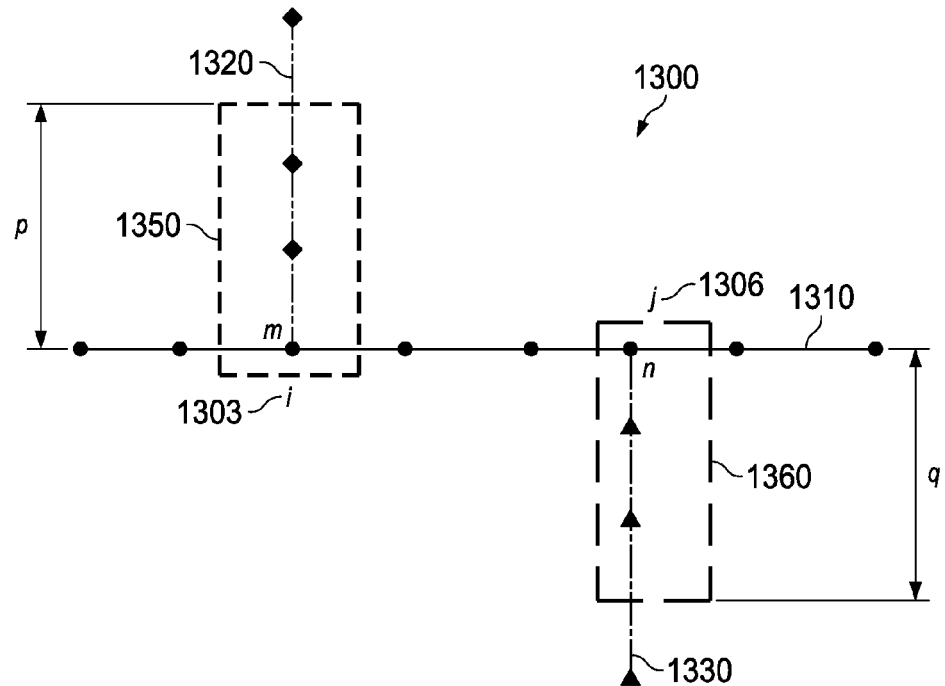
FIG. 13 is a diagram showing an example flow path model for a fracture network.

FIG. 13 is a diagram showing an example flow path model 1300 for a fracture network. As an example application, the example general solver described with respect to FIG. 12 can be extended to solve a banded linear system associated with the example flow path model 1300. As illustrated, the example flow path has connected geometry and includes multiple intersecting lines 1310, 1320 and 1330. Each line can represent a flow path of well system fluid in a subterranean region. Consider that the line 1310 is a main flow path and the other two lines 1320 and 1330 are two branch flow paths extending from the main flow path 1310. A flow path can include one or more nodes. Each node can represent, for example, a respective location of fluid flow along one of the flow paths. The branch flow paths 1320 and 1330 intersect the main flow path 1310 at node i 1303 and node j 1306, respectively. The flow paths can intersect at any angle, and they can extend in any direction. The circled regions 1350 and 1360 can represent coupling between the main flow path 1310 and the branch flow path 1320 occurring at node i 1303, and the coupling between the main flow path 1310 and the branch flow path 1330 occurring at node j 1306, respectively. In the example shown, the coupling 1350 includes p nodes and the coupling 1360 includes q nodes. In some instances, p and q can be referred to as connection depths. Performing discretization (e.g., based on a finite difference technique) on each node of the flow path can produce a set of algebraic equations that can be represented in a matrix form. The connection depths p and q can depend on, for example, the order of accuracy of the discretization, connection conditions, or other factors.

Figure 14:
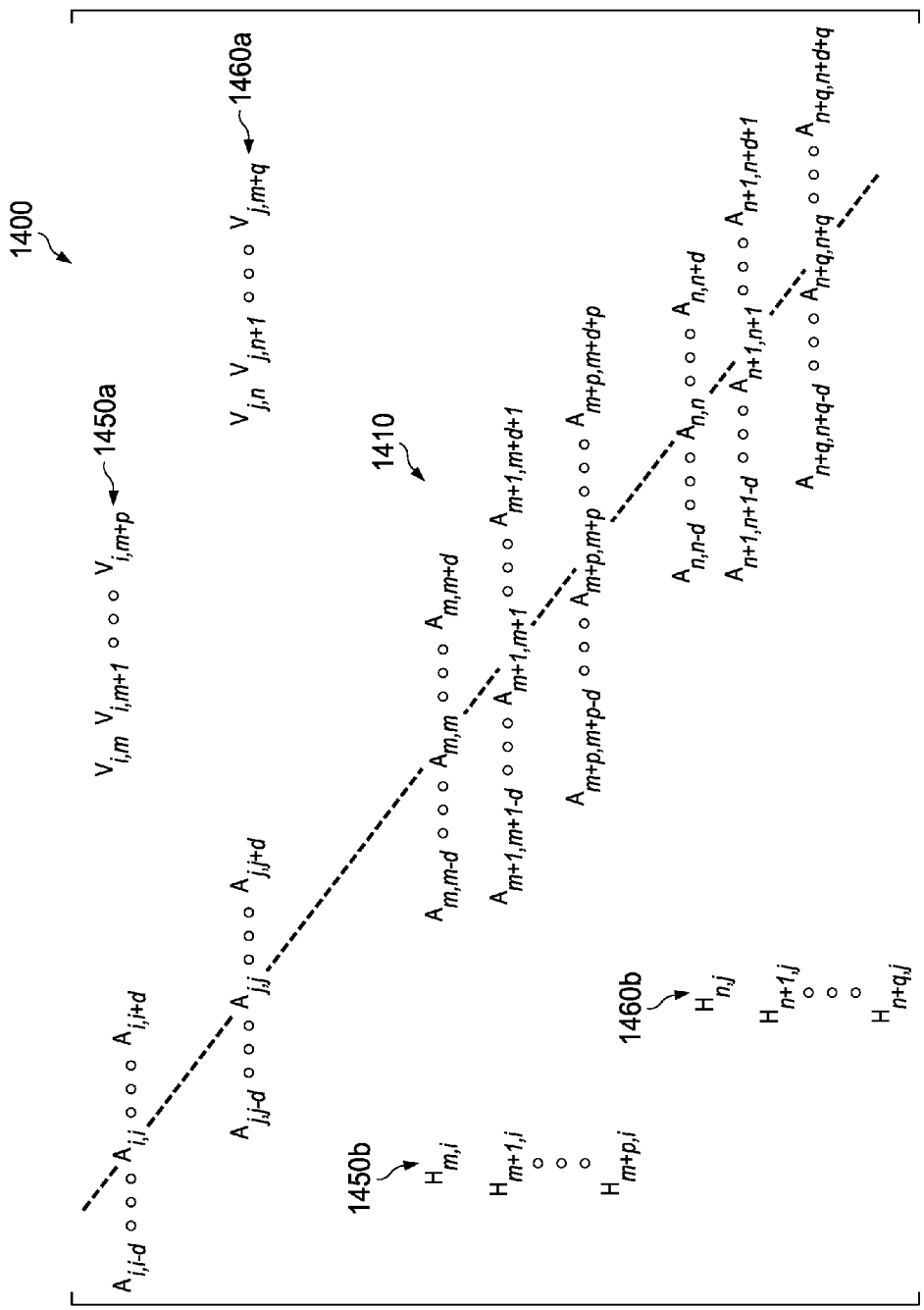
FIG. 14 is a diagram showing an example sparse matrix that represents the example flow path model 1300 shown in FIG. 13.

FIG. 14 is a diagram showing an example matrix 1400 that represents the example flow path model 1300. For example, the matrix 1400 includes a banded portion 1410 and multiple off-band portions 1450a-b and 1460a-b. The banded portion 1410 can result from, for example, discretization of the nodes (e.g., nodes 1301-1308) along the main flow path 1310 in FIG. 13. The banded portion 1410 includes multiple matrices $A_{i,j}$ and has a bandwidth d that may depend on the order of accuracy of the discretization, or other factors. The off-band portions 1450a-b and 1460a-b can result from, for example, discretization of the intersection nodes 1303 and 1306 on the main flow path. In some instances, the off-band portions can represent the couplings between a main flow path and a branching flow path. For instance, the off-band portion 1450a includes multiple entries $\{V_{i,k}\}$, k=0, 1, ..., p above the diagonal while the portion 1450b includes multiple entries $\{H_{k,i}\}$ below the diagonal. The off-band portions 1450a-b can represent the coupling 1350 between the main flow path 1310 and the branch flow path 1320 occurring at node i 1303 in FIG. 13. Similarly, the off-band portion 1460a includes multiple entries $\{H_{j,l}\}$, l=0, 1, ..., q above the diagonal while the portion 1460b includes multiple entries $\{H_{l,j}\}$ below the diagonal. The off-band portions 1460a-b can represent the coupling 1360 between the main flow path 1310 and the branch flow path 1330 occurring at node j 1303 in FIG. 13. In some instances, the matrix 1400 can have additional or different off-band portions with any number of off-band entries.

As an example, the matrix 1400 can be efficiently solved using the general solver described with respect to FIG. 12, along with an intersection table or another technique for tracking the off-band entries (e.g., entries 1450a-b and 1460a-b). Example techniques for operating with off-band entries representing flow path intersections are described in U.S. application Ser. No. 13/965,357, entitled "Modeling Intersecting Flow Paths in a Well System Environment" filed on Aug. 13, 2013. Additional or different techniques can be used to operate on the off-band entries. In some implementations, the sparse entries 1450b and 1460b below the diagonal of the matrix 1400 can take part in the forward elimination process, thus memory associated with bookkeeping for these entries can be freed after the process. The sparse entries 1450a and 1460a above the diagonal can take part both in the forward elimination and the backward substitution, but the computational cost and the memory associated with them can be minimized or otherwise reduced by using the fact that they occupy a small region of the matrix 1400.

Sample simulations have been performed to evaluate the example general banded block-matrix solver. First, the computational benefit obtained by using LU-decomposition instead of computing the actual inverse of the diagonal block matrix (e.g., matrix $A_{i,j}$ of the matrix 1110), is tested. Simulations are performed for a banded block matrix with l=r=2, i.e., a bandwidth d=5. The block matrix sizes n=3 and n=4 are selected to assess the influence of block matrix size on the computational load. The execution time for different global matrix sizes is reported in Table 1.

TABLE 1

Performance evaluation

| (a) Wall time (sec) with n = 3 | | | | (b) Wall time (sec) with n = 4 | | | |
| --- | --- | --- | --- | --- | --- | --- | --- |
| N | $A^{-1}$ | LU(A) | Ratio | N | $A^{-1}$ | LU(A) | Ratio |
| 500 | 2.82E−03 | 1.43E−03 | 1.97 | 500 | 4.01E−03 | 1.65E−03 | 2.43 |
| 750 | 4.11E−03 | 1.78E−03 | 2.31 | 750 | 5.24E−03 | 2.54E−03 | 2.06 |
| 1000 | 5.45E−03 | 2.48E−03 | 2.20 | 1000 | 7.21E−03 | 3.22E−03 | 2.24 |

In the examples shown, for the general banded matrix solver (labeled as "LU(A)" in Table 1), the cost of the computation scales linearly with N for the different sub-block matrix sizes (as shown in Table 1(a) and (b), respectively), indicating efficiency of the generalized solver. Also, compared with the approach that computes the actual inverse (labeled as "$A^{-1}$" in Table 1), the example general solver using LU-decomposition can speed up the computation approximately by a factor of two. Such an improvement in some aspects indicates the benefit of storing the LU-decomposition. The benefits and advantages may vary for other decompositions or other implementations of the LU-decomposition.

In another example simulation, a problem that includes solving the Darcy flow on a fracture using N=2000 for 1000 time steps is tested. The general banded block-matrix solver is assessed against a fixed bandwidth block-matrix solver and a tri-diagonal block-matrix solver. The general solver uses the example memory management technique described above (e.g., storing each row of the matrix in a row-major format and storing each sub-block in column-major format). The tri-diagonal block-matrix solver stores the global coefficient matrix in a three-vector format. The respective wall times of the general solver and the tri-diagonal solver are reported in Table 2.

TABLE 2

Comparison with the tri-diagonal solver

| Solver | Wall time (sec) |
| --- | --- |
| Block Tri-diagonal | 19.9 |
| Block General Solver | 20.2 |

In the example shown in Table 2, the computation times cost by fine-tuned block tri-diagonal solver and the general banded block-matrix solver are almost the same. The simulation results show the efficacy of the example memory management scheme for the general solver that includes the row-major memory layout with the column-major representation for the sub-blocks.

Figure 15:
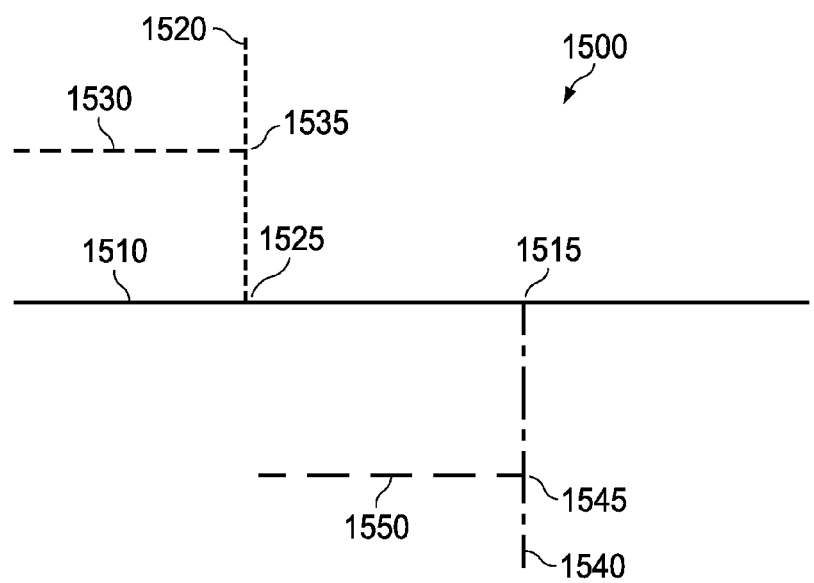
FIG. 15 is a diagram showing an example flow path model with nested connections.

In yet another example simulation, the general banded block-matrix solver is used to simulate an example flow path model 1500 as shown in FIG. 15. The example flow path model 1500 may represent a computational geometry that can be used to simulate fluid flow of a subterranean region. The example flow path model 1500 includes five lines 1510-1550. Each line may represent a flow path in the subterranean region. For example, line 1510 can be a main fluid flow path (e.g., in a wellbore, a primary fracture, etc.) while the other lines 1520-1550 can represent branch flow paths (e.g., in fractures, fissures, etc.). The multiple lines intersect with one another at points 1515-1555. In some implementations, the following coupled non-linear system of equations 2(a)-2(c) can be used to model the connected geometry 1500.

$$u_t + vu_x + \omega v_x - \mu u_{xx} + K_1 u = R_1 \quad (2a)$$

$$v_t + \omega v_x + u\omega_x - \mu v_{xx} + K_2 v = R_2 \quad (2b)$$

$$\omega_t + \omega u_x + v\omega_x - \mu \omega_{xx} + K_3 \omega = R_3 \quad (3c)$$

In Equations 2(a)-2(c), t represents time, x represents position, and u, v, and ω represent solution vectors (e.g., each can represent quantities such as velocity components), respectively. $K_1$, $K_2$, $K_3$ and μ represent known coefficients (e.g., based on governing flow equations) and $R_1$, $R_2$, and $R_3$ represent right-hand side functions (e.g., also known as forcing functions). The subscripts in Equations (2a)-(2c) indicate a partial derivative with respect to the variable in the subscript. Equations (2a)-(2c) can be linearized and discretized, for example, using second order methods. In some instances, the discretization of Equations (2a)-(2c) can result in a coefficient matrix such as the matrix 1400 that includes a banded portion and one or more off-band portions. The matrix can be solved, for example, based on the example techniques described with respect to FIG. 14, using the general banded block-matrix solver.

FIGS. 16 and 17 are plots showing example numerical simulation results of the example flow path model 1500 shown in FIG. 15. The results for u and v components of Equations (2a)-(2c) are shown in FIGS. 16 and 17 with respect to the node index. Each curve in FIGS. 16 and 17 represents a separate flow path. For example, in FIG. 16, curves 1610-1650 represent the u component associated with the flow paths 1510-1550 in FIG. 15, respectively. Similarly, curves 1710-1750 represent the v component associated with the flow paths 1510-1550, respectively. The example results for the five flow paths are superimposed on a common axis. The superimposed results show the intersections between the flow paths and demonstrate connections at the junctions. As shown in both FIGS. 16 and 17, for all of the paths, the simulation results strongly overlap the exact solution (the simulation results are shifted for visibility in the plot). Thus, the simulated results agree well with a known solution that is obtained with source terms. The simulation results show the ability of the general solver to solve the connected geometries.

In some implementations, the general banded block-matrix solver can solve a block linear system with a right-hand side matrix (e.g., matrix R in Equation (1)) that has varying numbers of columns in a given row. In some instances, this feature can allow additional applications of the general solver. For example, the general solver can be used to perform internal elimination where the unknowns in the interior of the simulation domain can be written as a linear combination of the boundary values (e.g., junction variables). In some instances, it helps simplify a complex system (e.g., a global system that simulates fluid flow in a subterranean network) as described with respect to FIGS. 8 and 9. In some cases, complete elimination of an underlying phenomenon, such as the leak-off/flow-back process, can be performed using the general solver. As a second example, the general solver can have parallelization abilities to allow parallel computation and improved computational efficiency. The general banded block-matrix solver may have additional or different advantages and applications.

In some implementations, linearized governing flow equations can be represented in matrix form as in Equation (3):

$$Ax=b \quad (3).$$

Here, x can represent a vector or one-dimensional array of N flow variables to be solved; A can represent a flow variable coefficient matrix with dimension N×N; and b can represent a known vector or one-dimensional array of the length of N. The entries of A and b may be real or complex, and each entry can be represented in any number of bits, for example, 32 bits, 64 bits, 128 bits, or another number. Similarly, there may be a round-off accuracy of the entries of the unknown vector or one-dimensional array x.

Figure 18:
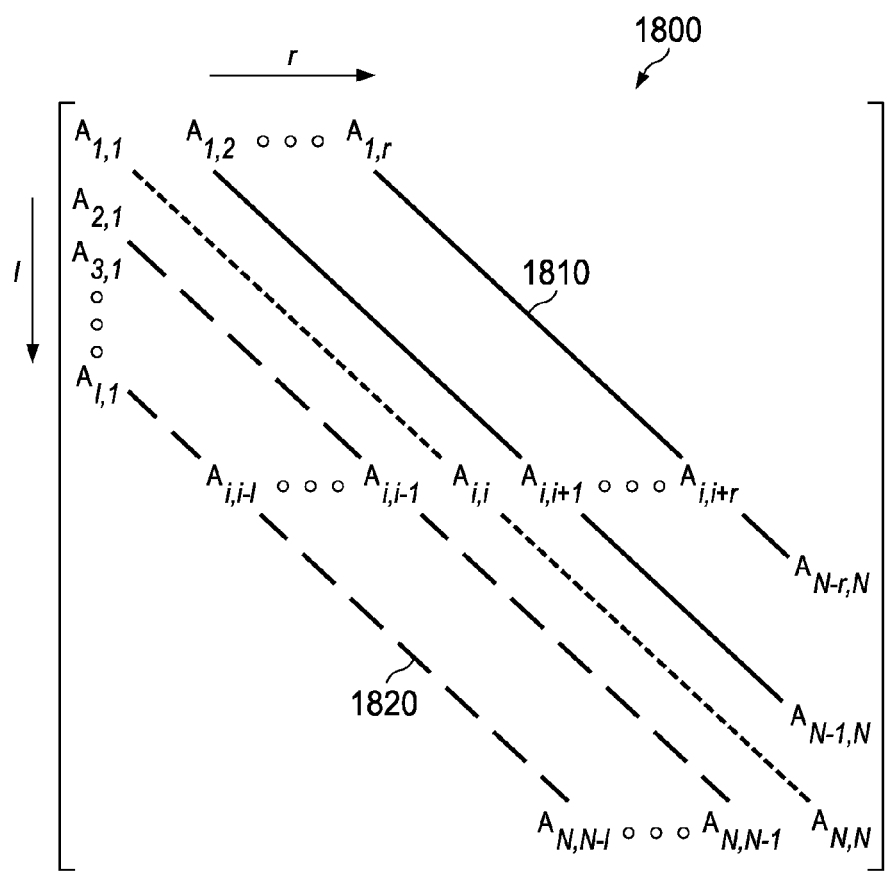
FIG. 18 is a diagram showing an example band matrix.

FIG. 18 is a diagram illustrating an example coefficient matrix A 1800. In some instances, the coefficient matrix A 1800 is banded (that is to say, A can be a band matrix). The band matrix A can be obtained, for example, based on discretization of non-linear governing equations. As shown in FIG. 18, all diagonals of A 1800 are zero except the main diagonal. The band matrix A 1800 also includes r upper diagonals 1810 and l lower diagonals 1820. In some instances, $l \geq 0$, $r > 0$, $l+r+1 \ll N$. If $r=l$, then A is referred to as an entries-symmetric matrix; otherwise, A is an entries-asymmetric matrix. As a specific example, in the computer-assisted numerical simulations of the flow systems in a fracture network, the discretization of governing equations (for example, after appropriate linearization) on 1-D geometries can lead to an entries-symmetric global coefficient matrix A with 2d+1 diagonals. Thus, solving of a linear system of equations (e.g., Equation (3)), can become a core component of computational fluid dynamics (CFD) approaches. The entries $A_{i,j}$ ($1 \leq i \leq N$, $1 \leq j \leq N$) of the matrix A 1800 can be a real-value or complex-value scalar, or the entries $A_{i,j}$ can be matrices. The linear system in Equation (3) can be solved, for example, by direct algorithmic methods using a parallel or distributed computational environment, or in another manner.

Gaussian elimination, with partial pivoting if necessary, is an example direct method to solve Equation (3). A conventional serial algorithm for solving the linear system in Equation (3) can be implemented on a serial computer (e.g., a computer with serial main storage devices) via two steps: the forward elimination step and the backward substitution step. In the forward elimination step, the non-zero entries below the main diagonal (e.g., l diagonals 1820 of the matrix 1800) are eliminated via appropriate row operations. This process can cause the upper diagonal entries (e.g., r diagonals 1810 of the matrix 1800) to be updated, and results in an upper triangular matrix. The solution to the Equation (3) can then be computed through a backward substitution step.

In some implementations, parallel algorithms can be used to solve the linear system in Equation (3). A parallel algorithm may use two or more threads to achieve parallel computing. The two or more threads can be implemented in a shared-memory structure, a distributed structure, or another architecture. As an example, the two or more threads can be implemented in the example computing systems 200, 201 in FIGS. 2A-2B. The two or more threads can be executed by a single processor, or they can be executed by two or more processors. The example parallel algorithms described here can solve the linear system faster and remove the inherent directional dependency of the conventional serial algorithm. In some instances, the example parallel algorithms can achieve fast, accurate performance for both entries-symmetric matrices and entries-asymmetric matrices. In some implementations, the parallel approaches can be generalized to any number of parallel, heterogeneous resources. The parallel computational environment is heterogeneous, for example, when its various computers or computational cores have different computing powers, when their efficiency is not the same, or when their memory hierarchy may have different characteristics.

Figure 19:
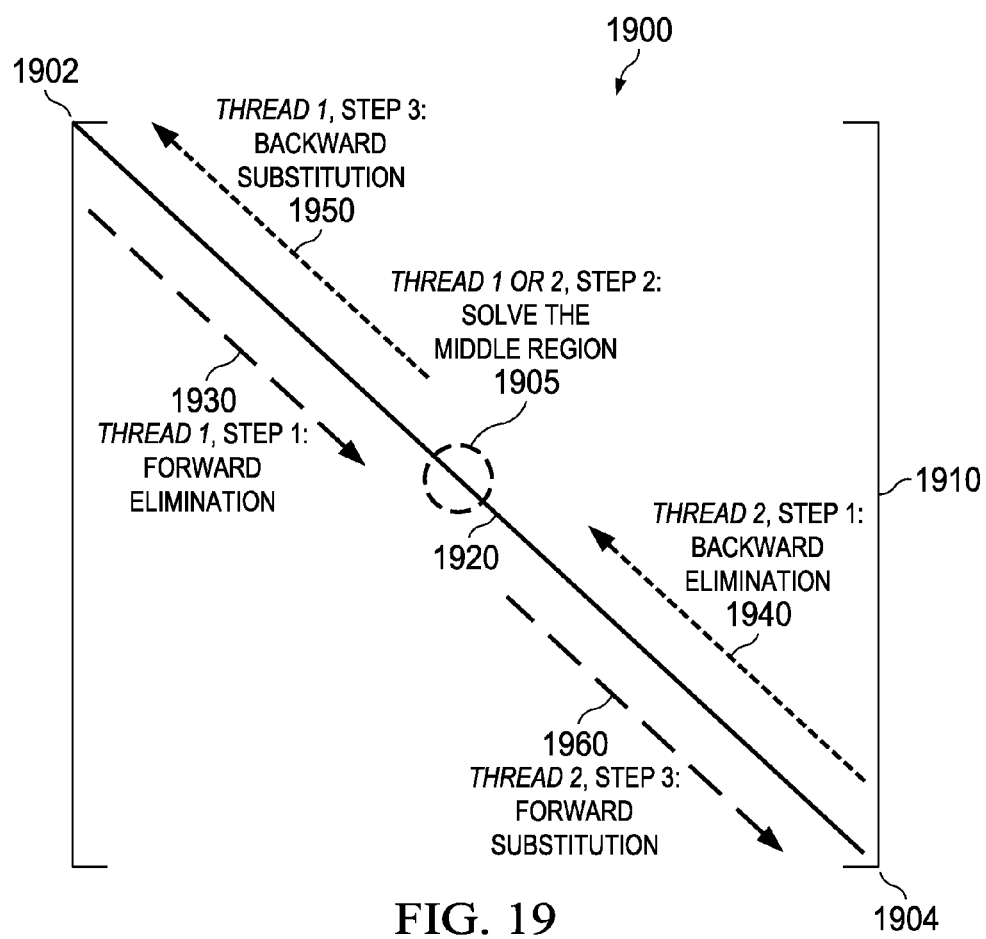
FIG. 19 is a diagram illustrating an example two-thread parallel algorithm.

FIG. 19 is a diagram 1900 illustrating an example two-thread parallel algorithm. The two-thread algorithm can be a basic parallel level of a multi-thread parallel algorithm. The example two-thread algorithm can be used to solve Equation (3) with the band matrix 1910. The matrix 1910 includes a banded portion 1920 about the diagonal. The banded portion 1920 can include a main diagonal, r upper diagonals, and l lower diagonals. The example two-thread algorithm can use two threads (e.g., Thread 1 and Thread 2) and start performing the elimination process from the two matrix ends 1902 and 1904, and proceed inwards. For example, Thread 1 can perform forward elimination by starting from the top end 1902 of the matrix 1900 and working downwards, as indicated by the arrow 1930. The forward elimination 1930 can be performed, for example, to eliminate the lower diagonal elements and convert the upper part of the matrix 1900 into an upper triangular matrix. In the meantime, Thread 2 can perform backward elimination by starting from the bottom end 1904 of the matrix 1900 and working upwards, as indicated by the arrow 1940. The backward elimination 1940 can be performed, for example, to eliminate the upper diagonal elements and convert the lower part of the matrix 1900 into a lower triangular matrix.

After Threads 1 and 2 meet, one of the threads can perform forward and backward elimination over the meeting region 1905. The size of the meeting region 1905 can depend on, among other computational parameters, the bandwidth of the matrix 1900. The parallel elimination operations 1930 and 1940 can result in two partial triangular matrices, for example, an upper triangular matrix for the top part and a lower triangular for the lower part of the global coefficient matrix 1900. After such a structure is achieved, the threads can start performing forward or backward substitutions to construct the solution vector. For example, Thread 1 can perform backward substitution on the upper triangular matrix as indicated by the arrow 1950, while Thread 2 can perform forward substitution on the lower triangular matrix as indicated by the arrow 1960. Additional or different operations can be performed.

In some instances, the meeting point can be fixed, for example, at the middle point of the matrix dimension or another fixed position. This approach can be referred to as a fixed-meet approach. For example, two threads may have identical or similar powers, efficiencies, computational loads, or other performance attributes. The fixed-meet approach can achieve performance balance between the two threads. In some instances, the meeting region can be a floating rather than a fixed parameter. For example, the two threads involved in the elimination stage (e.g., forward and backward eliminations 1930 and 1940), may have different processing speed, rely on different techniques, or perform in other different manners. In some instances, a floating-meet approach can be used. Using the floating-meet approach, the distance between the top and bottom threads can be monitored, for example, to the point where the distance approaches the bandwidth d of the matrix 1910, and then the serial stage can take over. In some implementations, the parallel algorithm can take the performance attribute of each thread into consideration and adapt the parallel algorithm accordingly (e.g., adjusting the meeting region, etc.), to achieve computational efficiency and load balance for both threads. The floating-meet approach can be achieved, for example, through an asynchronous communication between the threads. After the serial stage, the threads can go in the reverse direction and eventually obtain the solutions of the whole matrix 1910.

In some instances, the global coefficient matrix 1910 associated with flow simulations can be entries-symmetric, and the fixed-meet approach can have good scalability, for example, due to the equal computations associated with both forward and backward stages of the Gaussian elimination. In some other instances, the global coefficient matrix 1910 can be an entries-asymmetric matrix. In some implementations, a fixed-meet approach may not produce good scalability, whereas the floating-meet approach can produce better performance. For example, assume that the Threads 1 and 2, with equal performance levels, are used to perform the computation; $N_1$ and $N_2$ are the number of rows eliminated by each thread. The following relation in Equation (4) can be obtained for the floating-meet algorithm:

$$\frac{N_1}{N_2} = \frac{l+2lr}{r+2lr}. \quad (4)$$

For the fixed-meet approach, the expected number of rows eliminated by each thread is the same, for example:

$$\frac{N_1}{N_2} = 1. \quad (5)$$

For a well-balanced second stage elimination, it is desirable to have $$\frac{N_1}{N_2} = \frac{l}{r}, \quad (6)$$

which may not be fulfilled in some cases. The result of the floating-meet approach (e.g., based on Equation (4)) can be closer to that of Equation (6) than the result of the fixed-meet approach in Equation (5) for entries-asymmetric matrices (e.g., $\neq 1$). The floating-meet approach may produce better performance than the fixed-meet approach in these cases.

Figure 20:
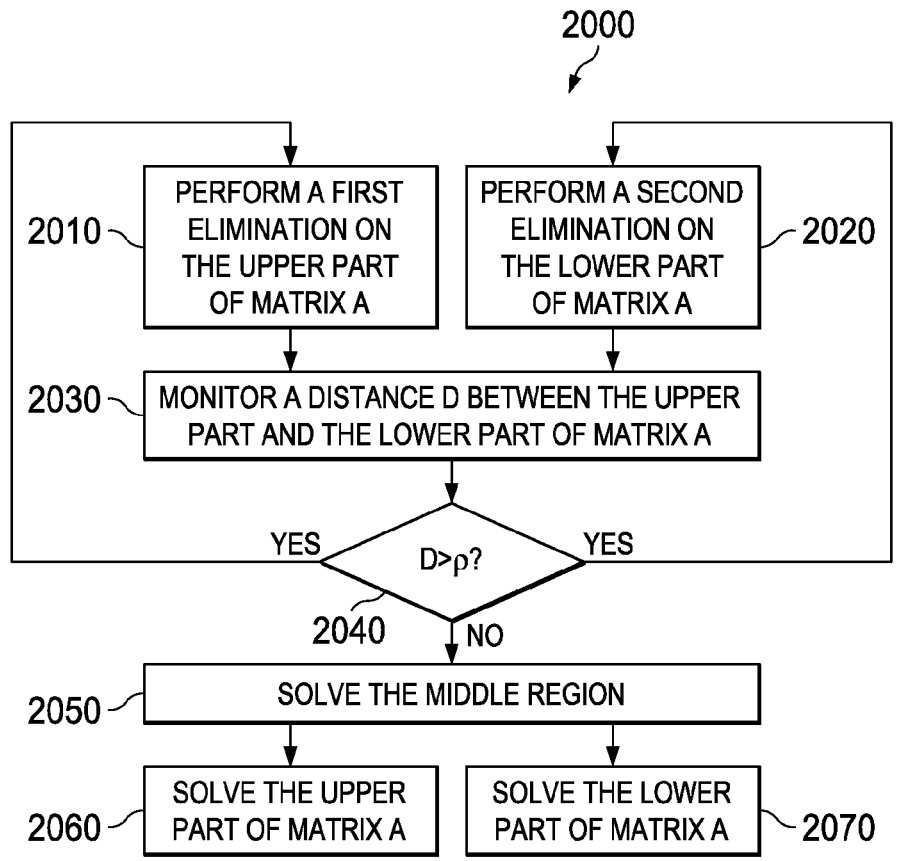
FIG. 20 is a flow chart showing an example process for solving a band matrix using two or more threads.

FIG. 20 is a flow chart showing an example process 2000 for solving a band matrix A using two or more threads. For example, the process 2000 can be used to operate a subterranean region model. The band matrix A can be obtained from discretization of governing flow equations. In some instances, the band matrix A can include flow variable coefficients based on a set of governing flow equations which represent well system fluid flow in a subterranean region. The band matrix A can be an entries-symmetric or entries-asymmetric band matrix. All or part of the example process 2000 may be computer-implemented, for example, using the features and attributes of the example computing system 200, 201 shown in FIGS. 2A, 2B or other computing systems. The process 2000, individual operations of the process 2000, or groups of operations may be iterated or performed in parallel, in series, or in another manner. In some cases, the process 2000 may include the same, additional, fewer, or different operations.

At 2010, a first elimination can be performed on an upper part of the band matrix A. The upper part of the band matrix A includes matrix elements located in upper rows of the band matrix A. In some instances, the upper part of the band matrix A can include a first subset of the flow variable coefficients corresponding to a first subset of flow variables in the governing flow equations. The first elimination can be implemented in a first thread, and can start from the top row of the band matrix A, or it can start with another point in the upper portion of the band matrix A. The first elimination can be performed, for example, in a similar manner to the forward elimination 1930 in FIG. 19, or it can be implemented in another manner. In some instances, performing the first elimination can include converting the upper part of the band matrix A to an upper triangular representation, for example, by forward elimination or another technique. Additional or different operations can be included in the first elimination.

At 2020, a second elimination can be performed on a lower part of the band matrix A. The lower part of the band matrix A includes matrix elements located in lower rows of the band matrix A. In some instances, the lower part of the band matrix A can include a second subset of the flow variable coefficients corresponding to a second subset of flow variables in the governing flow equations. The second elimination can be implemented in a second thread, for example, in parallel with the first elimination 2010. The first elimination can start with the bottom row of the band matrix A, or it can start with another point in the lower portion of the band matrix A. The second elimination can be performed, for example, in a similar manner to the backward elimination 1940 in FIG. 19, or it can be implemented in another manner. In some instances, performing the first elimination can include converting the lower part of the band matrix A to a lower triangular representation, for example, by backward elimination or another technique. Additional or different operations can be included in the second elimination.

At 2030, a distance D between the upper part and the lower part of the band matrix A can be monitored. In some instances, the distance D can be the distance of current processing points between the first and second threads. For example, each thread may check a current position where the thread is operating in terms of a row number, column number, index, indicator, address in the memory, or in another manner. The two threads can use a shared-memory, a distributed memory, or another storage structure. The two threads can use, for example, asynchronous communication to exchange their respective processing locations. In some instances, the two threads can use other communication techniques between each other to avoid cache thrashing or other problems. The distance D can be determined based on the processing locations of the two threads, or it can be determined in another manner.

At 2040, the distance D is compared with a threshold $\rho$. The threshold $\rho$ can be equal to the bandwidth of the band matrix A, or another value. The value of $\rho$ can be specified as a user input or determined automatically based on certain algorithms. For example, the process 2000 may include an algorithm to dynamically estimate the best meeting region for the two threads. The meeting region can be, for example, an intermediate part of the band matrix that includes ρ middle rows of the band matrix A. As an example, the intermediate part can be the remaining portion of the band matrix A, apart from the upper and lower parts processed by the first and second thread, respectively. The meeting region can be estimated, for example, based on the matrix properties (e.g., bandwidth, entries-symmetric or entries-asymmetric, etc.), the processing power of each thread, current computational load of each thread, or additional or different factors (e.g., whether a particular variable needs to be solved first). In some other instances, the meeting region can be fixed as a user input or system requirement. In either case, the threshold ρ can be determined according to the estimated meeting region. If the distance D is larger than the threshold ρ, the example process 2000 can go back to 2010 and 2020 to continue elimination operations. On the other hand, if the distance D is equal to or less than the threshold ρ, the example process 2000 can proceed to 2050 for further processing.

At 2050, the intermediate part of the band matrix A can be solved. The intermediate part can include other flow variable coefficients of the band matrix A. As described above, the matrix position of the intermediate part can depend on the respective processing powers of the first and second threads, the matrix properties, or other factors. The intermediate part can be solved by one of the two threads, or another thread. In some implementations, the intermediate part can be solved by Gaussian eliminations or other techniques. As an example, the intermediate part can be solved by the general banded block-matrix solver as described with respect to FIGS. 8 and 9, or another solver.

At 2060, the upper part of the band matrix A can be solved based on a solution of the intermediate part. In some implementations, the upper part can be solved by the first thread via a first substitution. For example, the upper part can be solved in a manner similar to the backward substitution 1950 in FIG. 19, or in another manner. Additional or different operations can be included in solving the upper part of the band matrix A.

At 2070, the lower part of the band matrix A can be solved based on the solution of the intermediate part. In some implementations, the lower part can be solved by the second thread, in parallel with operation 2060 performed by the first thread. For example, the lower part can be solved in a similar manner to the forward substitution 1960 in FIG. 19, or in another manner. Additional or different operations can be included in solving the lower part of the band matrix A.

In some instances, more than two threads can be used in the example process 2000. The multiple threads can have the same processing power or there may be a certain distribution of the power among multiple threads. The example two-thread parallel algorithm can be extended to the multiple-thread cases by optimizing over the multiple threads to achieve faster computational speed and better load balance among the threads. As a specific example, if three threads are available for computing an entries-asymmetric system that includes one diagonal above and two diagonals below the main diagonal, one thread can be allocated to perform backward elimination to convert the bottom part of the global coefficient matrix into a lower triangular matrix, while two threads can be allocated to perform forward elimination to convert the top part of the global coefficient matrix into an upper triangular matrix. The multiple threads can be allocated in other manners to properly take into account the structure of the global coefficient matrix (e.g., entries-symmetric, entries-asymmetric, etc.), the power and load distributions among the multiple threads, or other factors for overall performance optimization.

Simulations of a fluid flow in a fracture segment are performed to demonstrate the speed-up and load-balancing abilities of the example two-thread parallel algorithm. The simulation is performed using 2000 grid points, and the non-linear system is advanced in time for 2000 steps. The elapsed time is reported in Table 3. It can be observed that the example two-thread parallel algorithms that include both "Fixed-meet" (e.g., meeting region is fixed) and "Floating-meet" (e.g., meeting region is flexible) algorithms scale well. In this example simulation, the fixed-meet and floating-meet algorithms obtain similar performances.

TABLE 3

| Solver | Elapsed time Time (seconds) |
|---|---|
| Serial | 19.98 |
| Fixed-meet | 9.96 |
| Floating-meet | 9.98 |

In another simulation, one of the two threads is slowed down by being loaded with additional computational burden. The simulation results of the fixed-meet and floating-meet algorithms are reported in Table 4. As illustrated, the fixed-meet approach (where the meeting region is fixed to be the mid-point of the matrix), does not provide enhanced performance due to the sluggish thread. On the other hand, the floating-meet approach (where the meeting region is dynamically determined based on the performance of the threads), identifies performance differences in the threads, ignores the slower thread, and approximates a serial run. As such, the floating-meet algorithm can have a performance lower bound, and can be guaranteed to deliver the serial performance even in the presence of thread imbalance.

TABLE 4

| Solver | Elapsed time Time (seconds) |
|---|---|
| Serial | 19.98 |
| Fixed-meet | 329.0 |
| Floating-meet | 19.98 |

As an example application, the parallel algorithm is applied to a fracture network for simulating fluid flow in the fracture network. In some instances, the number of fractures in a network could be large, and solving individual fractures using available threads independently (e.g., according to the example internal elimination techniques described with respect to FIGS. 8 and 9), might be a valid approach. In some cases, however, the fracture length (and hence the number of computational nodes per fracture) may vary by a large magnitude in a given fracture network. Hence, performing the computation using multiple threads per fracture may be advantageous. The example parallel solver described above can be used to address load distribution and achieve load balancing. For example, some fractures can be allocated to two or more threads, while some other fractures may be allocated to a single thread. In some implementations, multiple threads can also be dynamically allocated per fracture during the process of linear system construction.

Figure 21:
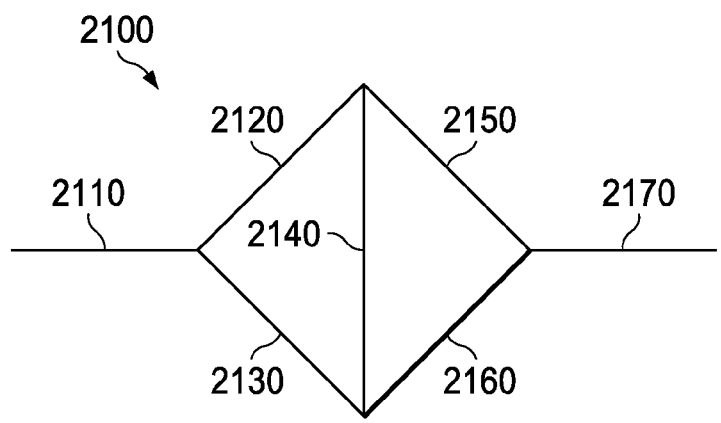
FIG. 21 is a diagram showing an example model of a fracture network.

FIG. 21 is a diagram illustrating a model of example fracture network 2100, which includes seven branches. In a first simulation, all branches 2110-2170 are seeded with equal numbers of computational nodes (500 grids per fracture), and simulations are performed for different numbers of threads (e.g., 1, 3, and 7 threads). The selected geometry restricts the number of active threads in the simulation to seven. The scaling result is given in Table 5. As illustrated, if only one thread is used to perform the computations of seven branches 2110-2170, the wall time is almost three times longer than if three threads are used, and is almost seven times longer than if seven threads are used. As such, balanced scaling is achieved for this balanced computational node distribution where each branch has the same number of nodes.

TABLE 5

| Wall time | |
|---|---|
| Threads | Time (seconds) |
| 1 | 40.28 |
| 3 | 17.92 |
| 7 | 6.52 |

In another simulation, the number of nodes in two of the branches is doubled, while the original node distribution for other branches is retained. By following one thread per fracture, at maximum, seven threads can be used, and it takes 12:23 seconds to complete the overall computations. On the other hand, using the parallel approach, which can use at maximum nine threads (two threads for each of the fractures with 1000 nodes), the wall time is 6:78 seconds, which demonstrates the improved performance of the parallel approach.

In some instances, besides the parallel algorithm described with respect to FIGS. 19 and 20 for solving the linear system (e.g., Equation (3)), additional or alternative multi-thread techniques can be used to solve the linear system. For example, some multi-thread techniques can be implemented on several computers that work collaboratively, and can solve the linear system in a hierarchical manner. The hierarchical multi-thread techniques can include solving a sequence of linear systems of decreasing size. At each hierarchy level, several independent linear systems can be identified and solved in parallel.

Figure 22:
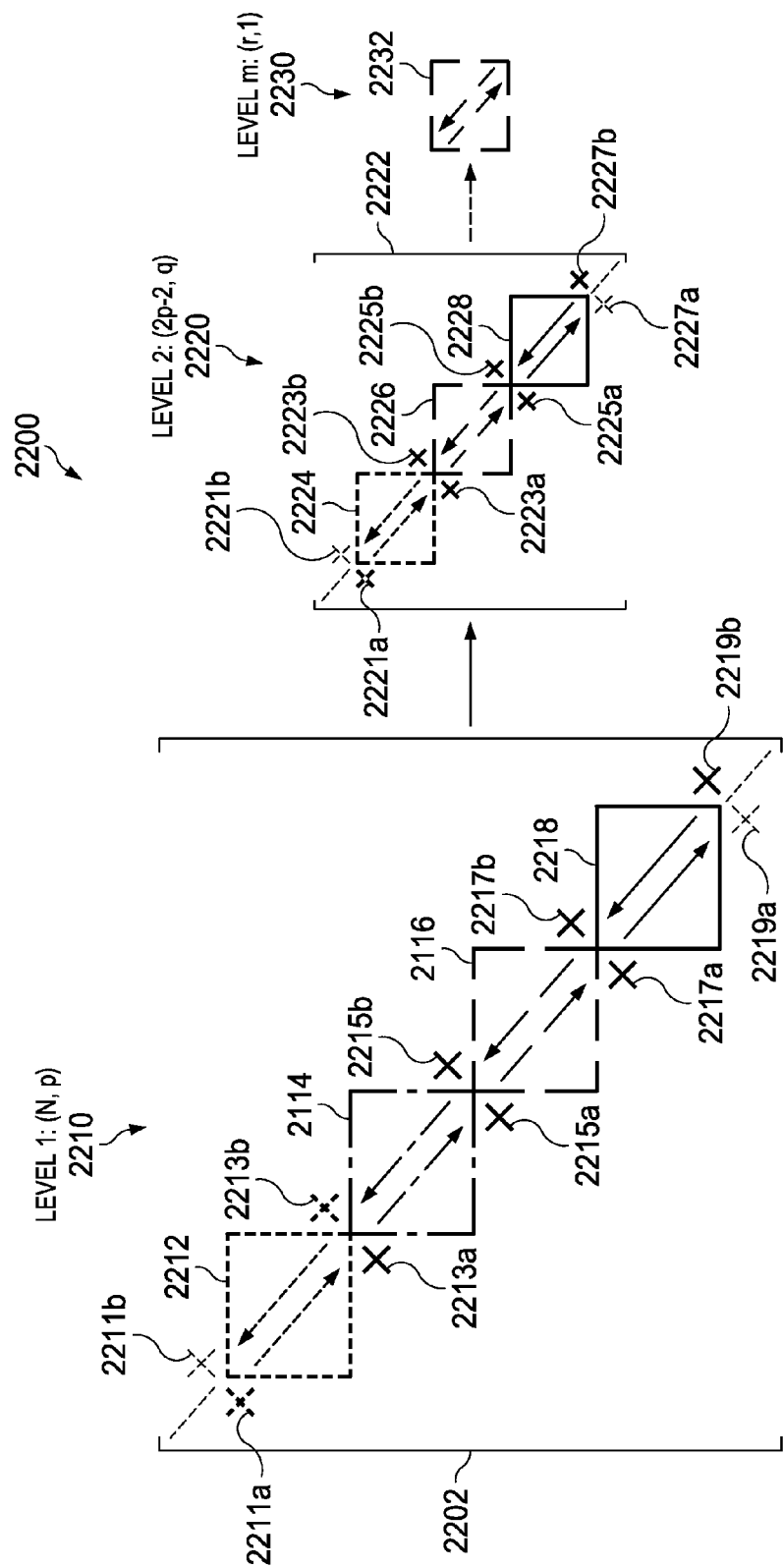
FIG. 22 is a diagram showing example matrix operations for solving governing flow equations of a flow model.

FIG. 22 is a diagram showing an example multi-thread parallel process 2200 for solving governing flow equations. The example parallel process 2200 can be computer-implemented, for example, using the features and attributes of the example computing systems 200, 201 shown in FIGS. 2A, 2B, or other computing systems. The example parallel process 2200 can be applied to any number of processors, computers, or threads that are allocated. Without loss of generality, it is noted that p threads (p>2) are used in the example parallel algorithm. In some instances, the example parallel process 2200 can be used as a direct banded block-matrix solver to solve a linear system using multiple threads in parallel. The process 2200, individual operations of the process 2200, or groups of operations may be iterated or performed in parallel, in series, or in another manner. In some cases, the process 2200 may include the same, additional, fewer, or different operations performed in the same or a different order.

In some implementations, governing flow equations can be linearized and represented in a matrix form. The example linear equation Ax=b in Equation (3) is used here as the example system to solve. The example parallel process 2200 can be applied to other linear or linearized systems. The example multi-thread parallel process 2200 can include generating a hierarchy of linear systems, for example, shown as multiple hierarchical levels 2210, 2220, and 2230 in FIG. 22. The linear system of each hierarchical level can include a global coefficient matrix (e.g., matrices 2202, 2222, 2232 for levels 2210, 2220, and 2230, respectively). In some instances, a higher hierarchical level (e.g., level 2210) can have a larger-size global coefficient matrix (e.g., matrix 2202) than a lower hierarchical level (e.g., level 2210). In some implementations, a solution to the original system of equations (e.g., Ax=b in Equation (3)) can be obtained by solving the hierarchy of linear systems in a sequence beginning with the level (e.g., level 2230) that has the smallest-size global coefficient (e.g., matrix 2232) in the hierarchy. In some other implementations, the original system of equations can be solved in another manner.

At the first hierarchical level 2210, a root level of the hierarchy, the considered linear system Ax=b in Equation (3) can be represented by global coefficient matrix A 2202 as shown in FIG. 22. Based on the coefficient matrix A 2202, sub-matrices and entries outside the sub-matrices can be identified. For example, the global coefficient matrix A 2202 can be decomposed, fragmentized or otherwise divided into a number of sub-matrices, such as example sub-matrices 2212, 2214, 2216, and 2218. The divided coefficient matrix A 2202 can include additional or different sub-matrices. The sizes of the multiple sub-matrices 2212, 2214, 2216, and 2218 can be the same or different. In some implementations, the global matrix A 2202 can be divided in another manner. The division of the global matrix A 2202 can result in some entries residing outside of the sub-matrices, and these entries can be referred to as sparse entries. Some example sparse entries are shown as cross markers 2211a-b, 2213a-b, 2215a-b, 2217a-b and 2219a-b in FIG. 22. In some instances, the size of the sparse entries can depend on the bandwidth d of the matrix A 2202. The sub-matrices and entries identified outside of coefficient matrix A 2202 can include corresponding flow variable coefficients based on a set of governing equations of a subterranean region model representing well system fluid flow in the subterranean region.

In some instances, the sub-matrices can be divided based on the number of threads allocated to the example process 2200. For example, the number of sub-matrices can be at least as many as the number of threads (p). In this case, each thread can handle one or more sub-matrices. In some other instances, the number of sub-matrices can be greater than the number of threads allocated to this task, for example, such that one or more threads can be allocated to a sub-matrix. As an example, a sub-matrix with a large size may be allocated with two threads that perform the example two-thread parallel algorithm described with respect to FIGS. 19-20. The sub-matrices can be divided and the threads can be allocated to improve load-balancing, and improve the overall computational efficiency of the example process 2200.

In some implementations, where and how to divide the global matrix A 2202 can be designed or otherwise determined. In some instances, an advantage of the multi-thread parallel process 2200 is that during the backward substitution stages at each level, part of the final solution can be recovered. Thus, while performing the matrix division, the division boundary (or slice plane) can be designed to be located at certain positions such that some critical variables (for example, junction variables in a fracture network) can be obtained quickly and made available to other operations (for example, to impose connection conditions). As a result, the overall computation time can be minimized or otherwise reduced.

After identifying the multiple sub-matrices and sparse entries outside the sub-matrices, a respective reduced-size matrix can be generated based on each individual sub-matrix and subset of the entries that are associated with the sub-matrix. The subset of entries associated with the sub-matrix can include the entries in the same rows as the sub-matrix but outside the sub-matrix. In some implementations, the respective reduced-size matrix for each sub-matrix can be generated in parallel, using multiple threads such that the computational efficiency can be improved. For example, a local Gaussian elimination can be performed on each individual sub-matrix, along with its associated subset of entries and corresponding portion of the right-hand side vector (b), using the example general banded block-matrix solver described with respect to FIGS. 11-14, or based on another technique. Additionally or alternatively, if there are free threads in the thread bank of the computational environment, the two-threaded parallel algorithm described with respect to FIGS. 19 and 20 or another multi-thread technique can be used for some or all local Gaussian eliminations of the multiple sub-matrices, to further enhance the speed-up.

After the local Gaussian eliminations, each of the sub-matrices 2212, 2214, 2216, and 2218 can result in respective reduced-size matrices 2212', 2214', 2216', and 2218' (not shown). A second global coefficient matrix can be generated based on the reduced-size matrices. For instance, a second global coefficient matrix $A^{(1)}$ 2222 can be constructed based on a collection of all sub-matrices 2222', 2214', 2216', and 2218'. A reduced-size linear system $A^{(1)}x=b^{(1)}$ can be obtained accordingly. Several example techniques associated with generating a second global coefficient matrix based on multiple reduced-size matrices are described with respect to FIGS. 23-26 in the following paragraphs. In the example shown in FIG. 22, the size of the second global coefficient matrix $A^{(1)}$ 2222 is reduced from N×N, the size of the original global coefficient A 2202, to (2p−2)×(2p−2), given the original global coefficient A 2202 is divided into p sub-matrices at the root level 2210. The second global coefficient matrix $A^{(1)}$ 2222 can serve as the considered global coefficient matrix for the next hierarchical level 2220.

At the second hierarchical level 2220, the subterranean region model can be operated based on the second global coefficient matrix $A^{(1)}$ 2222. In some implementations, operating the subterranean region model can include solving the second global coefficient matrix $A^{(1)}$ 2222 in a similar manner to the operations performed on the original global coefficient matrix A 2202 at the first level 2210. For instance, the example process 2200 at the second hierarchical level 2220 can include fragmentizing or otherwise dividing the reduced-size coefficient matrix $A^{(1)}$ into multiple sub-matrices 2224, 2226, and 2228, and entries outside the multiple sub-matrices, such as entries 2221a-b, 2223a-b, 2225a-b, and 2227a-b. A third reduced-size coefficient matrix ($A^{(2)}$), and a third reduced-size linear system ($A^{(2)}x=b^{(2)}$) can be obtained based on the local Gaussian eliminations of the multiple sub-matrices 2224, 2226, and 2228. A next level of recursive processes can begin, for example, based on the third reduced-size coefficient matrix $A^{(2)}$. The recursive notion is used here to show the recursive nature of the algorithm, not just to imply its recursive implementation.

The above recursive algorithm can be repeated, for example, until a last level 2230 is reached. The last level 2230 can include a global coefficient matrix $A^{(n)}$. The last level 2230 can be determined, for example, if no further division of the matrix $A^{(n)}$ can be identified, or it may be determined based on another criterion. At the level 2230, either a serial or a parallel (e.g., two-threaded parallel algorithm described in FIGS. 19-20) approach can be used to solve the linear system of the last level 2230. Once the solution of the last level 2230 is obtained, solutions to the upper level systems (e.g., $A^{(2)}x=b^{(2)}$, $A^{(1)}x=b^{(1)}$) can be obtained by substitution in the backward direction (e.g., from level 2230 to level 2220) until the root level 2210 or the top-most level is reached. Eventually, the solution to the original linear system Ax=b in Equation (3) can be obtained. In some instances, additional or different operations can be included in the example process 2200 to solve the linear system using multiple threads in parallel.

In some implementations, the example process 2200 is influenced by the construction of the global matrix (e.g., $A^{(1)}$, $A^{(2)}$) for the lower level. For example, in some instances, an inappropriate matrix fragmentation can change the bandwidth and destroy the band structure of the global coefficient, resulting in an increased computational load. Example techniques for generating a global matrix for a lower hierarchical level are described in FIGS. 24-26. In some aspects, the example techniques can help provide a successful execution of the example process 2200, improve the computational efficiency, or achieve additional or different advantages.

Figure 23:
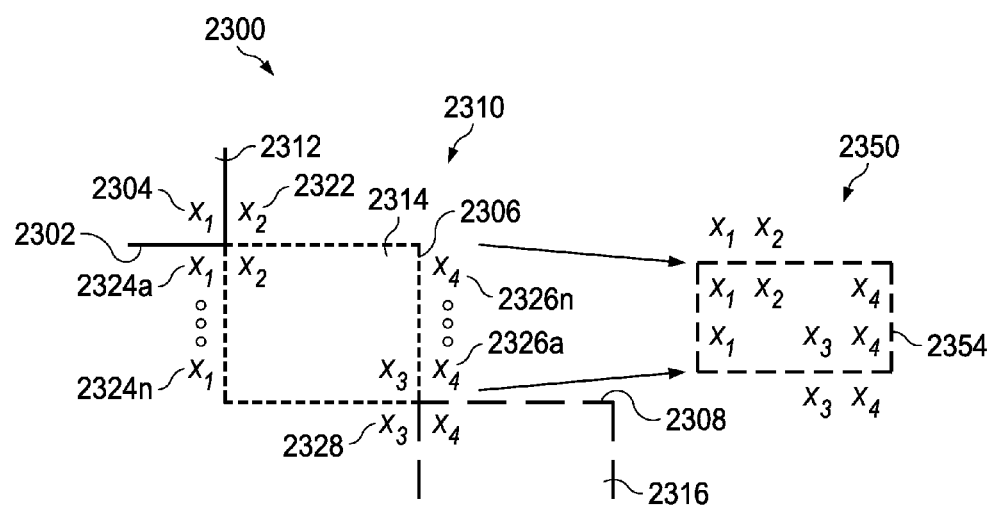
FIG. 23 is a diagram showing an example construction of a global matrix for a lower level.

FIG. 23 is a diagram 2300 showing an example construction of a global matrix for a lower level, based on a global matrix 2310 at a higher level of the hierarchical multi-thread process (e.g., the process 2200). The illustrated global matrix 2310 is divided into at least three sub-matrices 2312, 2314, and 2316, and sparse entries (e.g., entries 2322, 2324a-n, 2326a-n, and 2328 outside the sub-matrices. $X_i$,i=1, 2, 3, and 4 represents coefficients corresponding to variables, e.g., $x_i$ of a variable vector x in an example linear system Ax=b. The values of the coefficients $X_i$ in a column can be the same or different. Although FIG. 23 only shows $X_i$,i=1, 2, 3, and 4, there can be additional coefficients corresponding to additional variables located, for example, inside or outside the sub-matrix 2314. The illustrated global matrix 2310 is a tri-diagonal matrix with a bandwidth of r+l+1=1+1+1=3. As an example operation, local Gaussian elimination of the sub-matrix 2314 can be performed based on the sub-matrix 2314, a subset of sparse entries outside the sub-matrix 2314 (e.g., entries 2324a-n and 2326a-n located in the same rows as the sub-matrix 2314), and the corresponding portion of the right-hand vector b. In some implementations, the Gaussian elimination of the sub-matrix can be performed to eliminate the internal variables of the sub-matrix and obtain a reduced system of equations with interface variables. The interface variables are variables that correspond to the coefficients on or around the matrix division boundaries. For example, variables $x_1$, $x_2$, $x_3$ and $x_4$ corresponding to coefficients $X_1$, $X_2$, $X$ and $X_4$ around the matrix division lines 2302, 2304, 2306, and 2308, are interface variables in the example shown in FIG. 23. The Gaussian elimination of the sub-matrix 2314 can eliminate internal variables corresponding to coefficients (not shown) located between $X_2$ and $X_3$, and generate a reduced-size sub-matrix that is shown as the dashed block 2354. The reduced-size sub-matrix includes coefficients corresponding to the interfaces variables $x_1$, $x_2$, $x_3$ and $x_4$. In some instances, the number of the rows in a reduced-size sub-matrix can depend on the bandwidth of the original global matrix (e.g., matrix 2310). As an example, if the bandwidth of the original global matrix is 2d+1, the reduced-size sub-matrix can have 2d rows of coefficients of interface variables after the local Gaussian elimination. In some instances, the local Gaussian elimination can be performed in another manner and the size of the reduced-size sub-matrix can be different.

Given the local Gaussian elimination results of each sub-matrix, in some instances, constructing the global coefficient matrix for a lower level includes grouping the local Gaussian elimination results of the sub-matrices together, resulting in an example global matrix 2350. However, the example global coefficient matrix 2350 breaks the bandwidth of the original matrix 2310 to 4. Accordingly, the example fragmentation, shown as the matrix division lines 2302, 2304, 2306, and 2308 in FIG. 23, breaks down key computational properties such as the diagonal dominance of the global coefficient matrix 2310 in the higher level. A reordering technique may be used to restore the bandwidth.

Figure 24:
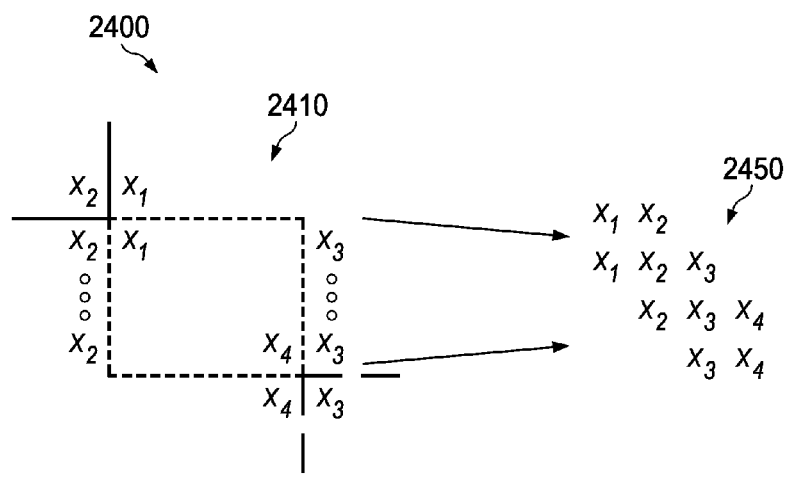
FIG. 24 is a diagram showing an example reordering technique.

FIG. 24 is a diagram 2400 showing an example reordering technique. The reordering technique can swap the orders of coefficients $X_1$ and $X_2$, and swap the orders of $X_3$ and $X_4$, respectively. As a result, the obtained global coefficient matrix 2450 for a lower level sustains the same bandwidth as the original global coefficient 2410. The reordering process can restore the bandwidth of the original global coefficient matrix, or can result in another bandwidth.

Figure 25:
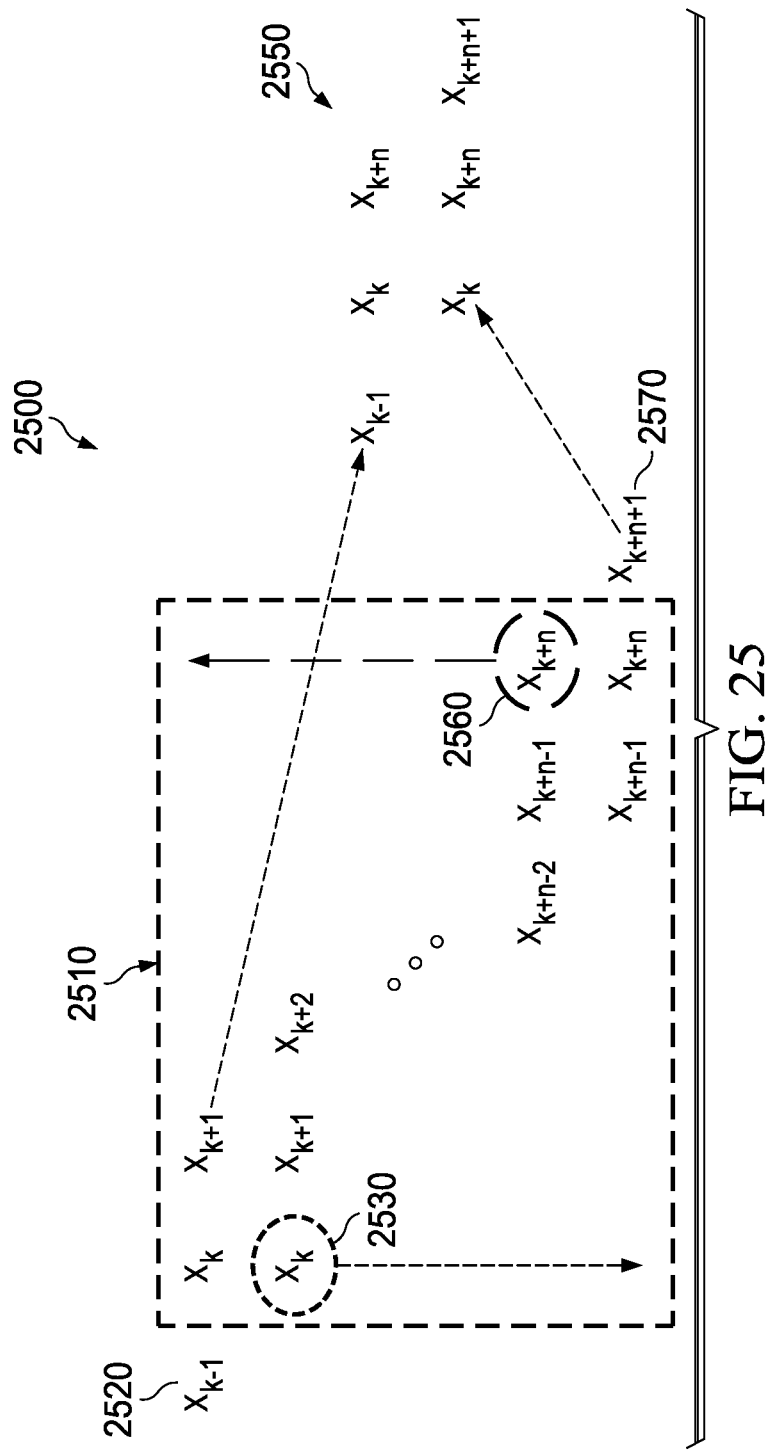
FIG. 25 is a diagram showing an example staggered Gaussian elimination approach.

FIG. 25 is a diagram illustrating an example staggered Gaussian elimination technique 2500. The example staggered Gaussian elimination technique 2500 can be used to divide a global coefficient matrix (e.g., matrix 2510) into sub-matrices for a next level, and preserve the bandwidth of the global coefficient for the next level. FIG. 25 illustrates the case for r=l=1. As shown in FIG. 25, the example staggered Gaussian elimination technique 2500 can start performing the forward elimination from the second row 2530, instead of from the first row 2520. Also, during the backward elimination, instead of starting from the last row 2570, the operation commences at row 2560 the next to the last row 2570. The resulting global coefficient matrix 2550 for the next level sustains the bandwidth of the original global coefficient matrix 2510, without a reordering process. The example staggered Gaussian elimination technique can be applied to any other general bandwidth. In a more general case for a band matrix with bandwidth equal to 2d+1, the starting position for both forward and backward phases can each be staggered by d. Bandwidth preservation and diagonal dominance preservation can be achieved for constructing a lower level matrix. Moreover, the example algorithm can save 2d number of operations compared to other algorithms (e.g., the ones shown in FIGS. 24 and 25), making it more computationally efficient.

Figure 26A:
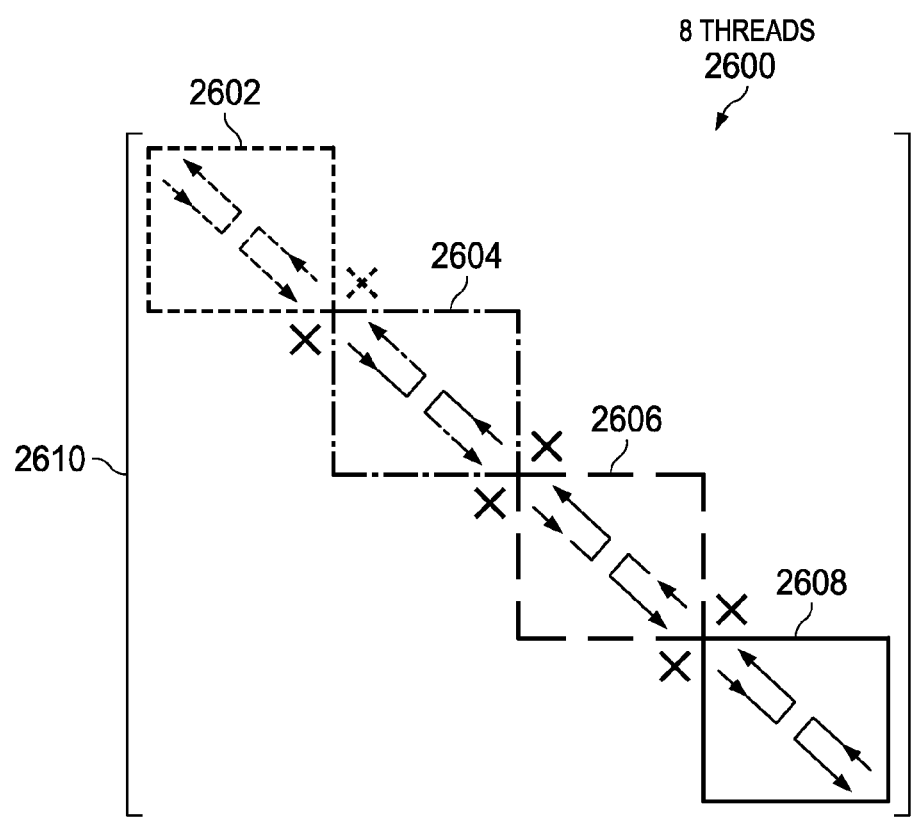
FIGS. 26A and 26B are diagrams illustrating multi-thread parallel approaches for solving governing flow equations using an even and odd number of threads, respectively.
Figure 26B:
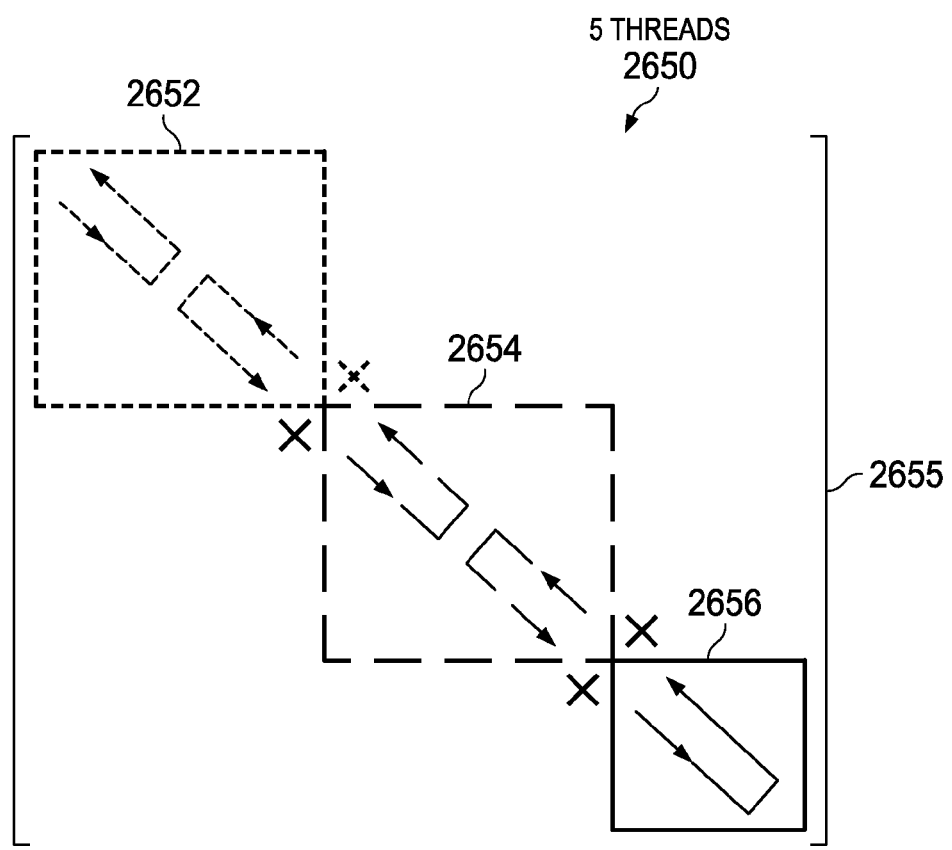

FIGS. 26A and 26B are diagrams illustrating other example multi-thread approaches 2600 and 2650 for solving governing flow equations. The example multi-thread approaches 2600 and 2650 integrate the two-thread algorithm described with respect to FIGS. 19 and 20, and the hierarchical algorithm described with respect to FIG. 22. For instance, the hierarchical algorithm can be implemented as a main process, while the two-thread algorithm can be applied at each hierarchical level of the main process for performing local Gaussian eliminations of each sub-matrix. For example, in some instances, there are s total numbers of threads available to perform the computation. If s is an even number, the coefficient matrix can be divided into s/2 sub-matrices each of size ≈2N/s. The example two-thread techniques described with respect to FIGS. 19 and 20 can be performed on each sub-matrix using two threads. As a specific example, FIG. 26A shows a total of 8 threads evenly allocated to four sub-matrices 2602, 2604, 2606, and 2608 of the global matrix 2610. In some other instances, when s is an odd number, the global matrix can be divided into (s−1)/2 sub-matrices of size n, and another sub-matrix of size k, such that k≈n/2 and k+(s−1)n/2=N. In one example implementation, the sub-matrices with size n can use two threads for performing the example two-thread techniques, whereas the sub-matrix with size k can use a single thread. FIG. 26B shows an example with five available threads to solve a band matrix 2555. Two threads are allocated to each of the two sub-matrices 2652, 2654 with larger sizes, while one thread is allocated to the third sub-matrix 2656 with a smaller size. The available threads of a computing system can be allocated in a different manner. In some implementations, the two-thread algorithm and the hierarchical algorithm can be combined in another manner.

FIG. 27 is a plot 2700 showing data from example numerical simulations using serial and parallel approaches for simulating Darcy flow of a fracture segment. Specifically, FIG. 27 shows the pressure distributions for a serial run, and two parallel runs that use the example multi-thread process 2200 described with respect to FIG. 22. The first parallel run uses twelve threads with two hierarchical levels, whereas the second parallel run uses the twelve threads in three levels (e.g., six in the first level, two in the second, and one in the third level). The simulation results from the three runs agree well, as indicated by the curves 2710.

The wall time comparison using one or more threads is shown in Table 6. When going from a single thread to two threads, the algorithm changes, for example, from the serial approach to the parallel approach, and a 1.5 speed-up is expected and observed. From two to four threads, and four to eight threads, an expected speed-up of 2 is nearly achieved. From eight to twelve threads, the expected speed-up is 1.5, however slightly lower performance is observed here as the machine was working above its full capacity.

TABLE 6

| | Elapsed time | |
| --- | --- | --- |
| Threads | Time (Sec) | Speed-up |
| 1 | 6.3 | |
| 2 | 4.1 | 1.54 |
| 4 | 2.22 | 1.85 |
| 8 | 1.17 | 1.90 |
| 12 | 0.88 | 1.33 |

Table 7 shows the results of another simulation of fracture flow with a leak-off model using one or more threads. Similarly, the parallel approach outperforms the serial approach (using only one thread), and shows its ability to perform complex phenomena in an efficient manner.

TABLE 7

| | Elapsed time | |
| --- | --- | --- |
| Threads | Wall time (sec) | Speed-up |
| 1 | 23 | |
| 2 | 14.437 | 1.59 |
| 4 | 7.91 | 1.83 |
| 8 | 4.6 | 1.72 |

Some embodiments of subject matter and operations described in this specification can be implemented in digital electronic circuitry, or in computer software, firmware, or hardware, including the structures disclosed in this specification and their structural equivalents, or in combinations of one or more of them. Some embodiments of subject matter described in this specification can be implemented as one or more computer programs, i.e., as one or more modules of computer program instructions encoded on a computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations of the foregoing. The apparatus can include special purpose logic circuitry, e.g., an FPGA (Field Programmable Gate Array) or an ASIC (Application Specific Integrated Circuit). The apparatus can also include, in addition to hardware, code that creates an execution environment for the computer program in question; for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code), can be written in any form of programming language, including compiled or interpreted languages, or declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site, or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (Field Programmable Gate Array) or an ASIC (Application Specific Integrated Circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions, and one or more memory devices for storing instructions and data. A computer may also include, or be operatively coupled to receive data from or transfer data to, or both, one or more mass storage devices for storing data, (e.g., magnetic, magneto optical disks, or optical disks). However, a computer need not have such devices. Devices suitable for storing computer program instructions and data include all forms of nonvolatile memory, media and memory devices, including, by way of example, semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user, a keyboard and a pointing device (e.g., a mouse, trackball, tablet, touch sensitive screen, or other type of pointing device) by which the user can provide input to the computer. Other kinds of devices can be used to provide for interaction with a user as well; for example, feedback provided to the user can be any form of sensory feedback, (e.g., visual feedback, auditory feedback, or tactile feedback); and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computing system can include one or more computers that operate in proximity to one another or remote from each other, and interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise, for example, by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

The invention claimed is:

1. A fluid flow simulation method for simulating well system fluid flow in a subterranean region, the method comprising:
    identifying subsystem models associated with distinct subsystems within a subterranean region, each subsystem model including fluid flow variables and representing well system fluid flow dynamics associated with a sub-region in the subterranean region, the subsystem models being connected by junction models that represent interactions among the subsystem models;
    for each of the subsystem models, performing, by operation of one or more computers, an elimination of internal variables of the subsystem model to express the internal variables in terms of junction variables of the junction models;
    solving, using the one or more computers, the junction variables based on the junction models; and
    solving, using the one or more computers, the internal variables of the subsystem model based on the solved junction variables.

2. The method of claim 1, comprising performing the elimination of the internal variables of all the subsystem models in parallel.

3. The method of claim 1, wherein performing the elimination of the internal variables of each subsystem model comprises selecting a respective solver for each subsystem model.

4. The method of claim 1, wherein the subsystem models comprise one or more of a fracture model, a wellbore model, or a reservoir model that represent the well system fluid flow within a fracture, a wellbore, or a reservoir in the subterranean region, respectively.

5. The method of claim 1, wherein performing the elimination of the internal variables of the subsystem model in terms of the junction variables of the junction model comprises:
performing a first elimination to express internal variables of a reservoir model based on internal variables of a fracture model; and
performing a second elimination to express the internal variables of the fracture model based on the junction variables of the junction model.

6. The method of claim 1, wherein the subsystem models comprise one or more rock block models that represent solid-fluid interactions in the subterranean region.

7. The method of claim 1, wherein solving the junction variables based on the junction models comprises:
generating a sparse matrix based on the junction models; and
solving the junction variables based on the sparse matrix.

8. A non-transitory computer-readable medium storing instructions that, when executed by data processing apparatus, perform operations comprising:
identifying subsystem models associated with distinct subsystems within a subterranean region, each subsystem model including fluid flow variables and representing well system fluid flow dynamics associated with a sub-region in the subterranean region, the subsystem models being connected by junction models that represent interactions among the subsystem models;
for each of the subsystem models, performing an elimination of internal variables of the subsystem model to express the internal variables in terms of junction variables of the junction models;
solving the junction variables based on the junction models; and
solving the internal variables of the subsystem model based on the solved junction variables.

9. The computer-readable medium of claim 8, comprising performing the elimination of the internal variables of all the subsystem models in parallel.

10. The computer-readable medium of claim 8, wherein performing the elimination of internal variables of the each subsystem model comprises selecting a respective solver for each subsystem model.

11. The computer-readable medium of claim 8, wherein the subsystem models comprise one or more of a fracture model, a wellbore model, or a reservoir model that represent well system fluid flow within a fracture, a wellbore, or a reservoir in the subterranean region, respectively.

12. The computer-readable medium of claim 8, wherein performing the elimination of the internal variables of the subsystem model in terms of the junction variables of the junction model comprises:
performing a first elimination to express internal variables of a reservoir model based on internal variables of a fracture model; and
performing a second elimination to express the internal variables of the fracture model based on the junction variables of the junction model.

13. The computer-readable medium of claim 8, wherein the subsystem models comprise one or more rock block models that represent solid-fluid interactions in the subterranean region.

14. The computer-readable medium of claim 8, wherein solving the junction variables based on the junction models comprises:
generating a sparse matrix based on the junction models; and
solving the junction variables based on the sparse matrix.

15. A flow modeling system comprising one or more computers that include:
memory operable to store flow model data comprising subsystem models associated with distinct subsystems in a subterranean region, each subsystem model including fluid flow variables and representing well system fluid flow dynamics associated with a sub-region in the subterranean region, the subsystem models being connected by junction models that represent interactions among the subsystem models; and
data processing apparatus operable to:
perform, for each of the subsystem models, an elimination of internal variables of the subsystem model to express the internal variables in terms of junction variables of the junction models;
solve the junction variables based on the junction models; and
solve the internal variables of the subsystem model based on the solved junction variables.

16. The flow modeling system of claim 15, the data processing apparatus being operable to perform, in parallel, the elimination of the internal variables of the each subsystem model.

17. The flow modeling system of claim 15, the data processing apparatus being operable to select a respective solver for the each subsystem model to perform the elimination of the internal variables of the each subsystem model.

18. The flow modeling system of claim 15, wherein the subsystem models comprise one or more of a fracture model, a wellbore model, or a reservoir model that represent the well system fluid flow within a fracture, a wellbore, or a reservoir in the subterranean region, respectively.

19. The flow modeling system of claim 15, wherein the subsystem models comprise one or more rock block models that represent solid-fluid interactions in the subterranean region.

20. The flow modeling system of claim 15, wherein solving the junction variables based on the junction models comprises:
generating a sparse matrix based on the junction models; and
solving the junction variables based on the sparse matrix.

* * * * *